(12) United States Patent
Ariyama

(10) Patent No.: US 7,640,483 B2
(45) Date of Patent: Dec. 29, 2009

(54) ERROR DETECTING CODE CALCULATION CIRCUIT, ERROR DETECTING CODE CALCULATION METHOD, AND RECORDING APPARATUS

(75) Inventor: Takeo Ariyama, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 709 days.

(21) Appl. No.: 11/495,715

(22) Filed: Jul. 31, 2006

(65) Prior Publication Data

US 2007/0043999 A1 Feb. 22, 2007

(30) Foreign Application Priority Data

Aug. 4, 2005 (JP) ............... 2005-226705

(51) Int. Cl.
*G11C 29/00* (2006.01)

(52) U.S. Cl. .................................. 714/769

(58) Field of Classification Search ............... 714/755, 714/769, 770, 799
See application file for complete search history.

(56) References Cited

U.S. PATENT DOCUMENTS

| 6,530,060 | B1 * | 3/2003 | Vis et al. ............. 714/792 |
| 6,763,495 | B2 | 7/2004 | Suzuki et al. |
| 7,065,702 | B2 | 6/2006 | Oren |
| 7,418,645 | B2 | 8/2008 | Srivastava |
| 7,426,682 | B2 | 9/2008 | Peng et al. |

2007/0079214 A1 * 4/2007 Kim ..................... 714/762

FOREIGN PATENT DOCUMENTS

| EP | 0 767 539 A2 | 4/1997 |
| EP | 1 087 534 A1 | 3/2001 |
| JP | 2004-192749 A | 7/2004 |
| WO | WO 2005/022755 A1 | 3/2005 |

OTHER PUBLICATIONS

Braun F. et al.: "Fast incremental CRC updates for IP over ATM networks" 2001 IEEE Workshop on High Performance Switching and Routing, May 29-31, 2001, Piscataway, NJ, US, IEEE, May 29, 2001, pp. 48-52, XP010542769.

"Next Generation Optical disc" Nikkei Electronics Books, published Oct. 7, 2003.

* cited by examiner

*Primary Examiner*—Shelly A Chase
(74) *Attorney, Agent, or Firm*—Sughrue Mion, PLLC

(57) ABSTRACT

The recording apparatus adds EDC to user data and transfers the EDC-added data to the scrambler in a sequence different from the coding direction Q. Though the processing data is added at an end in the direction Q, it is inserted at middle in the different sequence. Therefore, in order to transfer the EDC-added data in the different sequence, the EDC generator calculates an EDC intermediate value from an expected value of a latter part of an even number sector. Then, the EDC generator receives the user data in the different sequence and calculates EDC from expected values of the first half of the even number sector and an odd number sector and the EDC intermediate value. The expected value is an error detecting value of code string that has the same number of bits as the EDC-added data and a corresponding bit in the sequence of the direction Q is 1 and other bits are 0.

27 Claims, 32 Drawing Sheets

Fig. 2

ERROR DETECTING CODE CALCULATION CIRCUIT, ERROR DETECTING CODE CALCULATION METHOD, AND RECORDING APPARATUS

INCORPORATION BY REFERENCE

The disclosure of U.S. patent application Ser. No. 11/366,629 filed on Mar. 3, 2006 including the specification, drawings and abstract is incorporated herein by reference in its entirety.

BACKGROUND OF THE INVENTION

1. Field of the Invention

The present invention relates to an error detecting code calculation circuit, an error detecting code calculation method, and a recording apparatus which increase the speed of recording data on an optical disc.

2. Description of Related Art

Following so-called 1st generation optical discs such as CD, CD-R/RW and CD-ROM and 2nd generation optical discs such as Digital Versatile Disc (DVD), so-called 3rd generation optical disc that is Blu-ray discs with a shorter light source wavelength of 405 nm (blue-violet light) has been developed. The Blu-ray discs allows reading and writing record marks at a recording density of about five times that of DVD by increasing the numerical aperture (NA) of an objective lens to 0.85 to reduce a beam spot area to about one-fifth that of DVD in addition to shortening a light source wavelength. Further, Blu-ray discs have a phase change recording layer that is covered with a transparent covering layer of 0.1 mm thick and placed on a disc substrate, thereby reducing aberration due to the relative inclination of a disc and laser light (cf. "Next generation optical disc" Nikkei Electronics Books, Oct. 7, 2003).

The data structure of a Blu-ray disc is specified as follows by the standard. FIG. 29 is a view to describe the data structure of a Blu-ray disc. In the Blu-ray standard, recording data is recorded onto a disc 301 in units of recording unit block (RUB) 302, which is referred to herein also as the cluster. The RUB 302 is made up of run-in 303 and run-out 305 that are a buffer field or a gap field for data overwrite, and a physical cluster 304 that is placed between these fields. The run-in 303 is composed of 2760 channel bits (cbs) and the run-out 305 is composed of 1104 cbs. The physical cluster is composed of 1932 cbs*496 frames=958272 cbs. The run-in 303 and the run-out 305 add up to a channel bit length of two frames or recording frames, which are described later. The physical cluster 304 is composed of burst indicator subcode (BIS) that contains user data, disc address information and so on.

The physical cluster 304 is composed of 496 recording frames 306. A frame sync is placed in the beginning of each recording frame 306. Thus, 498 frames which are a sum of the 496 frames (recording frames 306) that constitute the physical cluster 304 and the 2 frames of the run-in 303 and the run-out 305 form 1 RUB 302.

The recording frame 306 is composed of 1932 cbs and modulated by 1-7 PP (parity preserve/prohibit RMTR) code. It is then demodulated and Digital sum value (DSV) control (decontrol) bit is deleted from the demodulated data, thereby creating an ECC cluster.

FIG. 30 is a diagram showing an ECC cluster. An ECC cluster 401 is made up of 496 frames, which includes user data 402, ECC parity 404 and BIS 403. The extraction of the user data 402 and the EC parity 404 forms a long distance code (LDC) cluster, and 64 frames of the 496 frames form the ECC parity 404. The extraction of the BIS 403 forms a BIS cluster.

The BIS cluster contains address information of a disc. The address information (9 bytes) of the BIS cluster is allocated to each address unit having 31 frames, which is formed by dividing the ECC cluster of 496 frames into 16 segments. The BIS is composed of 9 bytes with 3 frames, which is 3 bytes per frame, address is contained in the first 4 bytes. Thus, obtaining the first 2 frames in each address unit allows obtaining address information (address unit number) of each address unit. The BIS cluster changes into the format called the BIS block when it is deinterleaved. The LDC cluster also changes into the format called the LDC block when it is deinterleaved.

FIG. 31 is a diagram showing an LDC block 501. The LDC block is created by deinterleaving the data which is obtained by extracting the user data 402 and the ECC parity 404 from the ECC cluster shown in FIG. 30 and which has 152 bytes in the horizontal direction (one frame) and 496 frames in the vertical direction. The deinterleaving process is performed in two stages. Firstly, the process increases a shift amount by 3 bytes every 2 frames and makes rotation in the right direction on the drawing. The process then inserts each byte of an even number frame between each byte of an odd number frame, thereby creating the data having 304 bytes, which is double the data before the deinterleaving, in the horizontal direction (one frame) and 248 frames, which is half, in the vertical direction.

In FIG. 31, the part of the LDC block 501 other than the ECC parity 503 is data block 502. One data block is composed of 32 sectors from Sec 0 to Sec 31. One sector has 2052 bytes, which includes 2048 bytes of the user data 504 and 4 bytes of error detecting code (EDC) 505. If the direction of data recording sequence is a recording frame direction P and the direction as user data is a user data direction Q, the recording frame direction P is in the horizontal direction (row direction) on the drawing and the user data direction Q is in the vertical direction (column direction) on the drawing. Thus, the data recording sequence and the user data sequence are different.

One sector has user data sequences, each sequence having 216 bytes, that are arranged in the user data direction Q in folded configuration. Thus, in the user data 504, each sequence (216 bytes) is arranged in the recording frame direction P. One sector Sec of 2052 bytes therefore has nine and half sequences in the user data direction Q. Since the EDC 505 of 4 bytes is placed at the end of the user data 504 of 2048 bytes in each sector Sec, if a sector number of the first sector is 0 (Sec 0), the EDC 505 in an even number sector is placed at the middle of one sequence in the user data direction Q.

FIG. 32 is a view showing an encoding order of each data for generating RUB from user data and address information. An LDC cluster and a BIS cluster are generated separately. An LDC cluster D6 is generated as follows. Firstly, Step SP1 adds EDC to user data D1 to create data frame D2. The addition of EDC is performed for each sector Sec and a sector of 2052 bytes added with EDC is obtained by performing a predetermined operation on a sector having the user data of 2048 bytes and 0 data of 4 bytes sequentially in the user data direction Q.

Then, Step SP 2 performs scrambling on EDC added data (data frame) D2 to which EDC has been added to create scrambled data (scrambled data frame) D3. The scrambling performs a predetermined arithmetical operation on data of one sector having 2052 bytes which is added with EDC in the user data direction Q. After that, Step SP3 rearranges the rows and columns of the scrambled data D3 to create a data block D4. Then, Step SP4 adds ECC parity to the data block D4 to create an LDC block D5. Finally, Step SP5 performs the interleaving as described above on the LDC block D5, thereby creating an LDC cluster D6.

On the other hand, a BIS cluster D11 is generated as follows. Firstly, Step SP6 interleaves user control data D8 and Step SP7 adds ECC to an address unit number D7 and interleaves the data to create an access block D9 from these data. Then, Step SP8 adds BIS ECC to the access block D9 to create a BIS block D10. Finally, Step SP9 interleaves the BIS block D10, thereby creating a BIS cluster D11.

After that, Step SP10 combines the LDC cluster D6 and the BIS cluster D11 to create an ECC cluster D12. Step SP11 adds a synchronization signal (frame sync) and a DSV control bit to the ECC cluster D12 to create a physical cluster D13. Then, Step SP12 adds run-in and run-out to the physical cluster D13 and performs 17PP modulation, thereby creating RUB D14 that contains 495 recording frames $D14_3$ together with run-in $D14_1$ and run-out $D14_2$ that are placed at the beginning and end of the recording frames.

A reproducing apparatus for Blu-ray disc that is formatted as described above is disclosed in Japanese Unexamined Patent Application Publication No. 2004-192749. FIG. 33 is a block diagram showing a conventional reproducing apparatus described therein. A disc 701 is driven to rotate at constant linear velocity (CLV) by a spindle motor 752 during recording and reproducing operation. Then, an optical pickup (optical head) 751 carries out the recording or reproduction of data on the disc 701.

The pickup 751 has a laser diode that serves as a laser light source, a photo-detector for detecting reflected light, and an objective lens that serves as an output end of laser light to create an optical system that applies laser light to a disc recording surface through the objective lens and guides reflected light to the photo-detector, through not shown. The pickup 751 is movable in the disc radius direction by a thread mechanism 753. The laser diode outputs blue laser with the wavelength of 405 nm. The NA of the optical system is 0.85 and the laser emission is controlled by a drive signal (drive current) from a laser driver 763. The reflected light information from the disc 701 is detected by the photo-detector and changed into an electrical signal according to detected light intensity, and then supplied to a matrix circuit 754.

The matrix circuit 754 has a current-voltage converter and a matrix operating/amplifying circuit corresponding to the output current from a plurality of photo-receiving devices as the photo-detector and generates a necessary signal by matrix operation. For example, it generates a high-frequency signal corresponding to reproduction data (reproduction data signal), a focus error signal for servo control, a tracking error signal, a push-pull signal related to wobbling groove and so on.

The reproduction data signal that is output from the matrix circuit 754 is supplied to a reader/writer circuit (RW circuit) 755, the focus error signal and the tracking error signal are supplied to a servo circuit 761, and the push-pull signal indicating detection information of wobbling groove is supplied to a wobble circuit 758.

The push-pull signal related to wobbling groove that is output from the matrix circuit 754 when the disc 701 is a rewritable disc is processed by the wobble circuit 758. The wobble circuit 758 performs MSK demodulation and HMW demodulation on the push-pull signal indicating ADIP information so as to demodulate the signal into data stream constituting ADIP address and supplies the data stream to an address decoder 759. The address decoder 759 generates a clock by PLL processing using the wobble signal supplied from the wobble circuit 758, and supplies it to each component as an encode clock for recording, for example.

In the recording, recording data is transferred from an AV system 720 and sent to memory in an ECC/scrambling circuit 757 for buffering. In this case, the ECC/scrambling circuit 757 performs processing such as addition of an error correction code, scrambling and addition of sub-code to encode the buffered recorded data. ECC encoding and ECC decoding are the process correspond to ECC format which uses reed Solomon (RS) code with RS (248, 216, 33), code length 248, data 216, and distance 33. The data after ECC encoding and scrambling is then modulated in RLL(1-7)PP system by a modulation/demodulation circuit 756 and supplied to the reader/writer circuit 755. An encode clock that serves as a reference clock for the encoding process during recording is a clock generated from the wobble signal described above.

The reader/writer circuit 755 performs recording compensation processing such as fine adjustment of an optimum recording power for the characteristics of a recording layer, the spot shape of laser light, a recording linear velocity and so on and adjustment of a laser drive pulse waveform on the recording data that is generated by the encoding process. The recording data is then sent to the laser driver 763 as a laser drive pulse. The laser driver 763 applies the laser drive pulse to the laser diode in the pickup 751 to drive the laser emission. The pit (phase change mark) corresponding to the recording data is thereby formed on the disc 701.

A spindle servo circuit 762 controls a spindle motor 752 to make CLV rotation. The spindle servo 762 acquires the clock generated by PLL processing for a wobble signal as present rotational speed information of the spindle motor 752 and compares it with predetermined CLV reference speed information, thereby creating a spindle error signal.

The operations of the servo system and the recording and reproducing system as described above are controlled by a system controller 760 that is configured by a micro computer. The system controller 760 performs various operations according to a command from the AV system 720. For example, if the AV system 720 outputs a write command, the system controller 760 first moves the pickup 751 to an address to which data is to be written. Then, the system controller 760 controls the ECC/scrambling circuit 757 and the modulation/demodulation circuit 756 so as to perform the encoding processing as described above on the data transferred from the AV system 720, which is video data of various formats such as MPEG2 and audio data, for example. Then, a laser drive pulse from the reader/writer circuit 755 is supplied to the laser driver 763, thereby conducting recording. In the recording or reproducing of the data, the system controller 260 controls access or recording and reproducing operation by using the ADIP address detected by the address decoder 759 or the address contained in BIS.

The above technique, which is disclosed in Japanese Unexamined Patent Application Publication 2004-192749, aims at providing ROM medium or the like that has superior RAM compatibility and takes advantages in tracking servo by scrambling the linking data (run-in and run-out) of Blu-ray disc with the same process as the main data (user data).

In a Blu-ray disc with the above-described format, the direction of recording data on the disc is the recording frame direction P and therefore it is necessary to modulate data in the order of the direction P. It is thus required to rearrange the data sequence from the user data direction Q to the recording frame direction P at least before the modulation.

The EDC 505 described above is added at the end of each sector as shown in FIG. 31. Thus, in an even number sector, the EDC 505 is placed at the middle of one data line having 216 bytes in the user data direction Q. Therefore, when transferring the data added with EDC in the recording frame direction P, for example, the EDC is transferred before all used data are transferred in an even number sector. Specifically, the EDC 505 needs to be added before the user data of the row located after the row including the EDC 505, such as D431 and D107, are transferred. However, since the EDC 505 is obtained as a result of performing a predetermined operation on all user data of one sector, it is normally impossible to calculate the EDC 505 when there is a lack of user data in one sector.

Consequently, it is necessary to read out all the data in the user data direction Q once and determine EDC in advance. However, this process requires reading out the user data again when outputting the data in the recording sequence, which hinders high speed recording.

The above process requires accessing the data buffer at least twice: one for EDC calculation and one for data rearrangement to recording sequence. The access to the data buffer which occurs to generate an error detecting code reduces the throughput of memory access to the data buffer.

SUMMARY OF THE INVENTION

According to one aspect of the present invention, there is provided an error detecting code calculation circuit that calculates an error detecting code for detecting an error in a user data code string having a first sequence. The circuit processes data in units of data groups including two or more sectors containing the user data code string. Each data group includes an operation target sector having a structure that the error detecting code is appeared in an end of the user data code string when read in the first sequence and the error detecting code is appeared in a middle of the user data code string when read in a different sequence from the first sequence. The error detecting code calculation circuit includes a first operation section for calculating an error detecting code intermediate value from a part of user data in the operation target sector, and a second operation section for calculating an error detecting code from a remaining part of user data in the operation target sector and the error detecting code intermediate value, wherein the second operation section calculates the error detecting code to be added to the user data code string contained in the operation target sector that is read in the different sequence from the first sequence.

Generally, if the data to be encoded has an operation target section in which an error detecting code (EDC) is inserted on halfway of reading data in the different sequence from the first sequence, when adding EDC to the data in the different sequence for transfer, it is necessary in the operation target sector to complete calculation of error detecting codes before transferring all the user data code string. Thus, the process in this case calculates error detecting code from all of the user data code string and then adds the calculated error detecting code to the user data when transferring the data in the different sequence.

On the other hand, in the exemplary embodiment of the present invention, the first operation section and the second operation section execute the operation on a part of the operation target sector and the remaining part thereof, respectively. Since the second operation section performs operation on a part of the error detecting code when reading the data in the different order, the first operation does not need to perform operation on the entire code string. Thus, the first operation section access only a part of the code string, thereby reducing access to the data buffer.

Consequently, the present invention can provide an error detecting code calculation circuit, an error detecting code calculation method, and a recording apparatus that allow reduction in access to a data buffer when calculating an error detecting code for detecting an error in user data.

The present invention provides an error detecting code calculation circuit, an error detecting code calculation method, and a recording apparatus which enable reduction of access to a data buffer upon calculation of an error detecting code for detecting an error in user data.

BRIEF DESCRIPTION OF THE DRAWINGS

The above and other objects, advantages and features of the present invention will be more apparent from the following description taken in conjunction with the accompanying drawings, in which:

FIG. 2 is an enlarged view of the area having sectors Sec 0 and Sec 1;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

An exemplary embodiment of the present invention is described hereinafter in detail with reference to the drawings. The exemplary embodiment applies the present invention to an encoding device and a recording apparatus that enable high speed recording on an optical disc. The following description is given on the case of using a Blu-ray disc as an example of an optical disc and executing encoding according to physical specifications of Blu-ray standards if necessary. However, the present invention is not limited thereto and it may be applied to a recording apparatus and so on for other types of discs with different encoding order and recording order.

Figure 1:
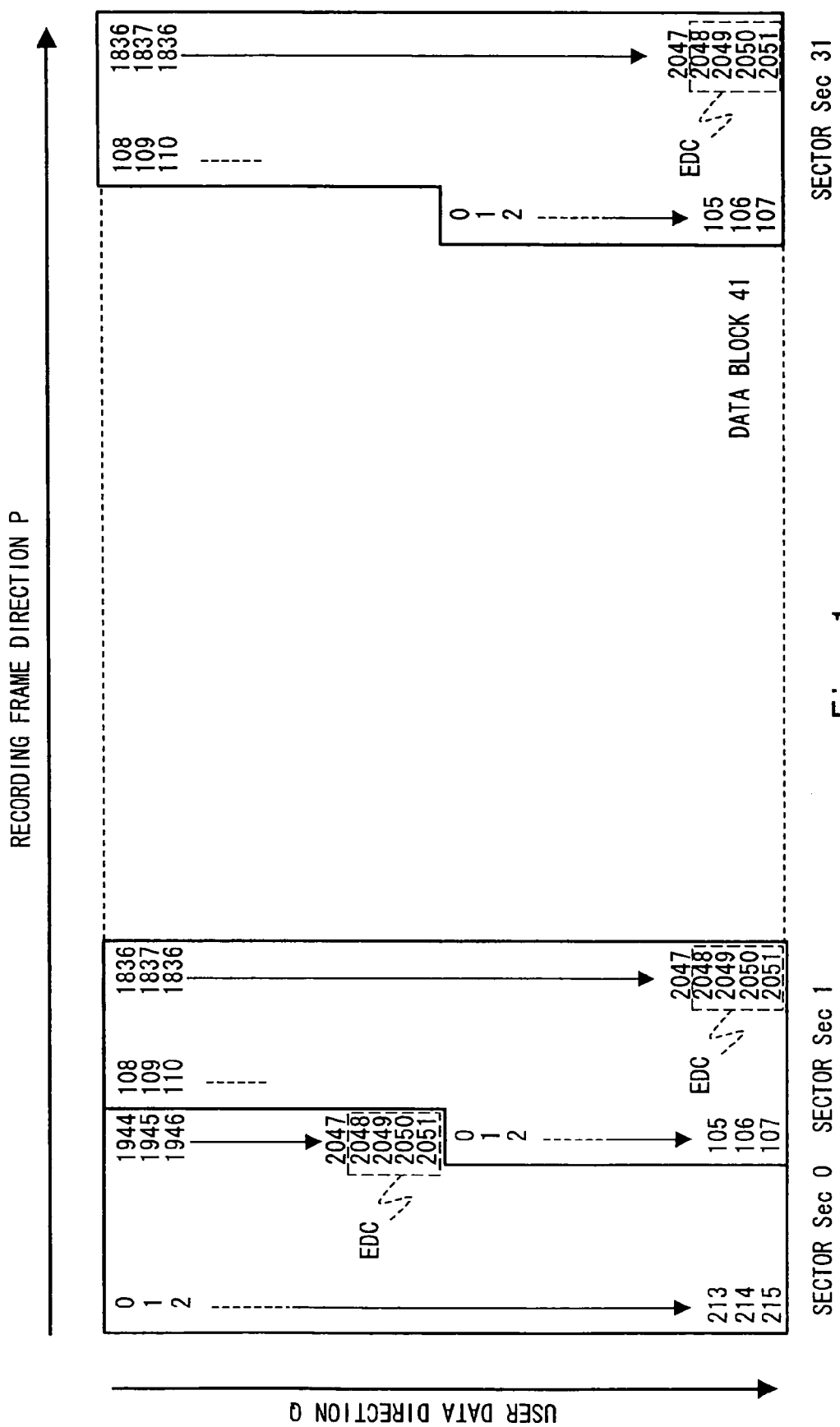
FIG. 1 is a view to describe a sequence of data in a data block in a Blu-ray disc.
Figure 2:
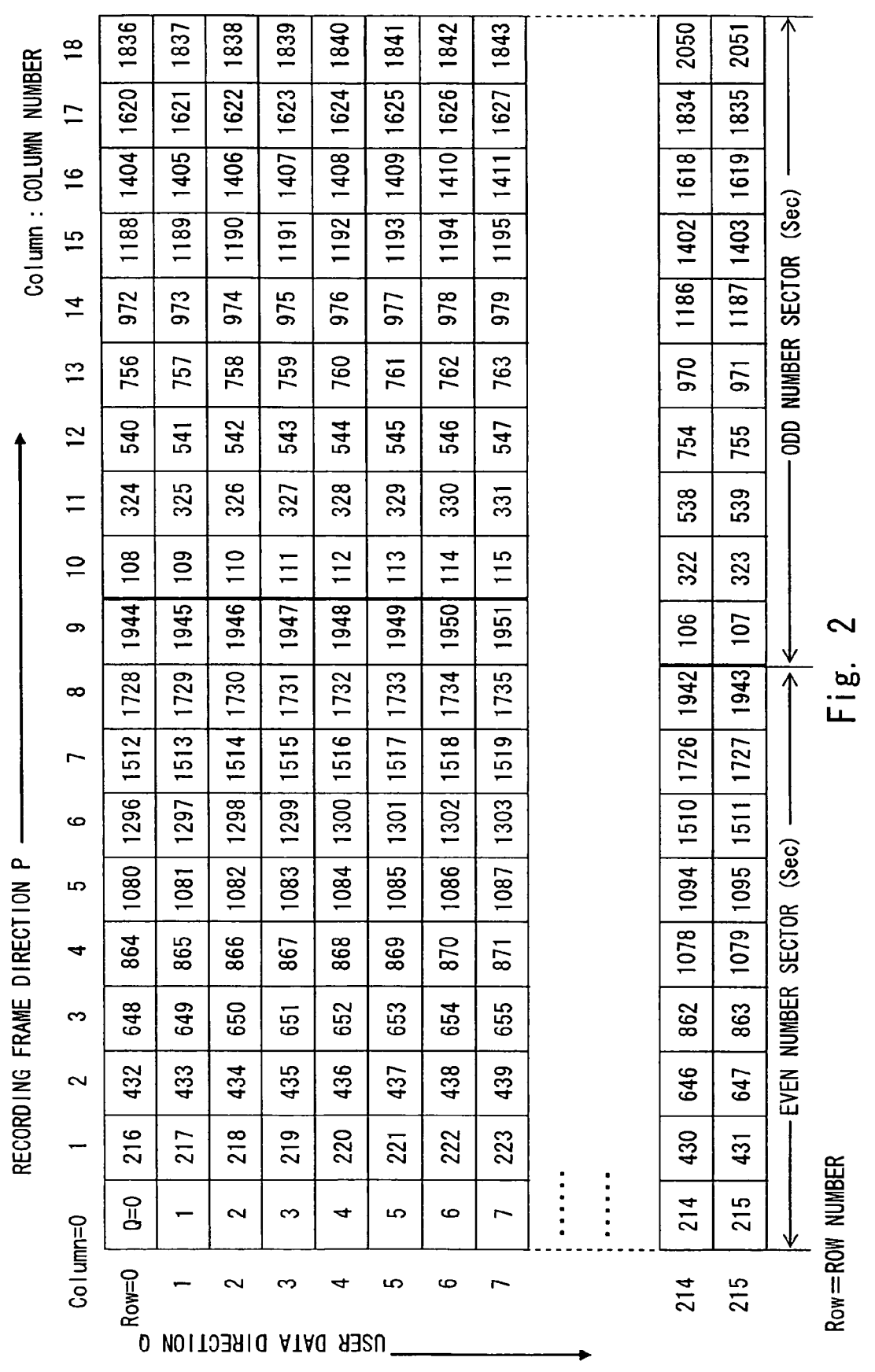

FIG. 1 is a view to describe the arrangement sequence of data in units of bytes that are contained in each data block of a Blu-ray disc. FIG. 2 is an enlarged view of two sectors Sec 0 and Sec 1. The values shown in FIGS. 1 and 2 indicate the sequence in user data direction Q in units of bytes. The data block 41 contains 304 columns and 216 rows. The data block 41 includes 32 sectors. One sector is composed of 2052-byte data: 2048-byte user data plus 4-byte EDC.

Each sector has block data of 304 columns in which 216-byte data are arranged in columns. If Row indicates a row number ($0 \leq Row \leq 215$) and Column indicates a column number ($0 \leq Column \leq 303$), in the sector 0, for example, the column Column=9 has Q=1944 to 2051 byte data, which occupies the rows Row=0 to 107. The rows Row=108 to 215 in the column Column=9 are occupied with 0th to 107th byte data of the next sector Sec 1. In this way, the configuration of the data block 41 is such that an even number sector and an odd number sector form one unit, which is referred to herein as the "area". Thus, the data is arranged repeatedly in the same sequence in each area having a pair of sectors with 19 columns.

In the sectors Sec 0 to Sec 31, a prescribed operation is performed on user data in the user data direction Q shown in FIGS. 1 and 2 to add EDC. The data is scrambled, then modulated, and recorded on a disc. When recorded, the data block is recorded in the sequence of the recording frame direction P that is indicated by the arrow in FIG. 1, which is perpendicular to the column direction or the user data direction Q. The user data direction Q coincides with the processing sequence for addition of an error detection code and the processing sequence for scrambling and encoding in a Blu-ray disc. As described later, it is possible to separately scramble user data and EDC and then integrate them together.

As described earlier, data is recorded on a Blu-ray disc in the recording frame direction P. It is thus required to rearrange the data sequence from the user data direction Q, which is the processing sequence for encoding, to the recording frame direction P at least before the modulation. If the encoding is executed in the recording frame direction P, it is unable to calculate EDC. Since EDC is added prior to reading all user data in an entire sector in an even number sector while EDC is determined based on all user data in a sector as shown in FIG. 1, it is unable to generate data with EDC added in this case.

Consequently, if the user data direction Q as a sequence of user data (normal encoding sequence) and the recording frame direction P as a sequence of recording data on a disc are different, it is generally necessary to perform some arithmetical operation to calculate EDC or the like and add the obtained EDC in advance and then rearrange the EDC-added data to prepare for recording. In such a case, the data rearrangement is normally enabled by temporarily storing the data added with EDC into a data buffer. However, in order to achieve high-speed operation, the data buffer should be composed of SRAM which is expensive, thus not practical.

To address this concern, according to U.S. patent application Ser. No. 11/366,629 (Japanese Patent Application No. 2005-060364) (hereinafter referred to as the "reference") that was filed in the name of the applicant of the present invention, a recording apparatus includes a substitution buffer having a memory capacity of a transfer size m of each burst transfer or the like times 304 bytes times 2 planes (for writing and reading), an ECC buffer (9728 bytes times 2 planes) for temporarily storing ECC parity, an EDC buffer (4 bytes times 32 times 2 planes) for temporarily storing EDC codes, and a scramble buffer (38 bytes times 2 planes). The invention disclosed in the above reference enables high-speed data transfer to the substitution buffer by the processing (pass S1') that temporarily stores EDC which is obtained by encoding in the user data direction Q, scramble intermediate values, and ECC, and the processing (pass S2') that adds the EDC to user data while repeatedly burst-transfers the user data from the data buffer and performs scrambling.

In the invention disclosed in the above reference, the substitution buffer is configured by a memory that does not require refreshing and is capable of random access, thereby allowing the successive data obtained from the data buffer by the burst transfer to be rearranged into the sequence of the recording frame direction P at high speed. In this case, even if the substitution buffer has a capacity of less than a memory capacity of the data buffer, it is possible to perform scrambling on the data rearranged into the recording frame direction P from the operation results using the EDC, scramble intermediate values and ECC that are calculated in the pass S1' and stored.

Therefore, though it has been unable to achieve high speed encoding unless using a temporary memory capable of high speed random access such as expensive SRAM as a data buffer, the invention disclosed in the reference enables high speed encoding at low cost merely by adding a relatively small size circuit with the use of SDRAM or the like that is unsuited for high speed random access as a data buffer.

It is necessary to read data of two clusters into a data buffer for encoding and rearrangement of one cluster. To record data in the recording frame direction P, it is necessary to read data of one cluster (2048 bytes times 32 sectors) in the user data direction Q in advance just for EDC encoding, which increases absolute access to the data buffer and results in an increase in power consumption.

Achievement of high speed encoding requires a high cost data buffer that operates with high frequency clock, which results in a further increase in power consumption. To address this concern, an exemplary embodiment of the present invention performs the following operation on the data in an even number sector in which EDC is added at the end of a sector when reading data in the user data direction Q while it is inserted on the halfway of reading data of the sector in a different order from the user data direction Q, which is the recording frame direction P, for example. Specifically, a recording apparatus according to an exemplary embodiment of the present invention includes a first operation section for calculating an EDC intermediate value, which is described later, from a part of the even number sector and a second operation section for calculating EDC from the remaining part and the EDC intermediate value, and determines EDC by the two operation sections. This reduces data access to the data buffer to enable further improvement in encoding specification and reduction in power consumption and costs. The sequence of the user data direction Q corresponds to the first sequence, the sequence of the recording frame direction P corresponds to the second sequence, and the even number sector corresponds to an operation target sector.

The following exemplary description describes a recording apparatus that is characterized by the process of at least generating EDC from the above-described user data and adding it to user data particularly in encoding of user data on an Blu-ray disc, it is feasible to combine the recording apparatus with a reproducing apparatus to form a recording and reproducing apparatus.

For easier understanding of the present invention, a method of calculating an error detecting code that is disclosed in the above-mentioned reference is described herein.

Figure 3:
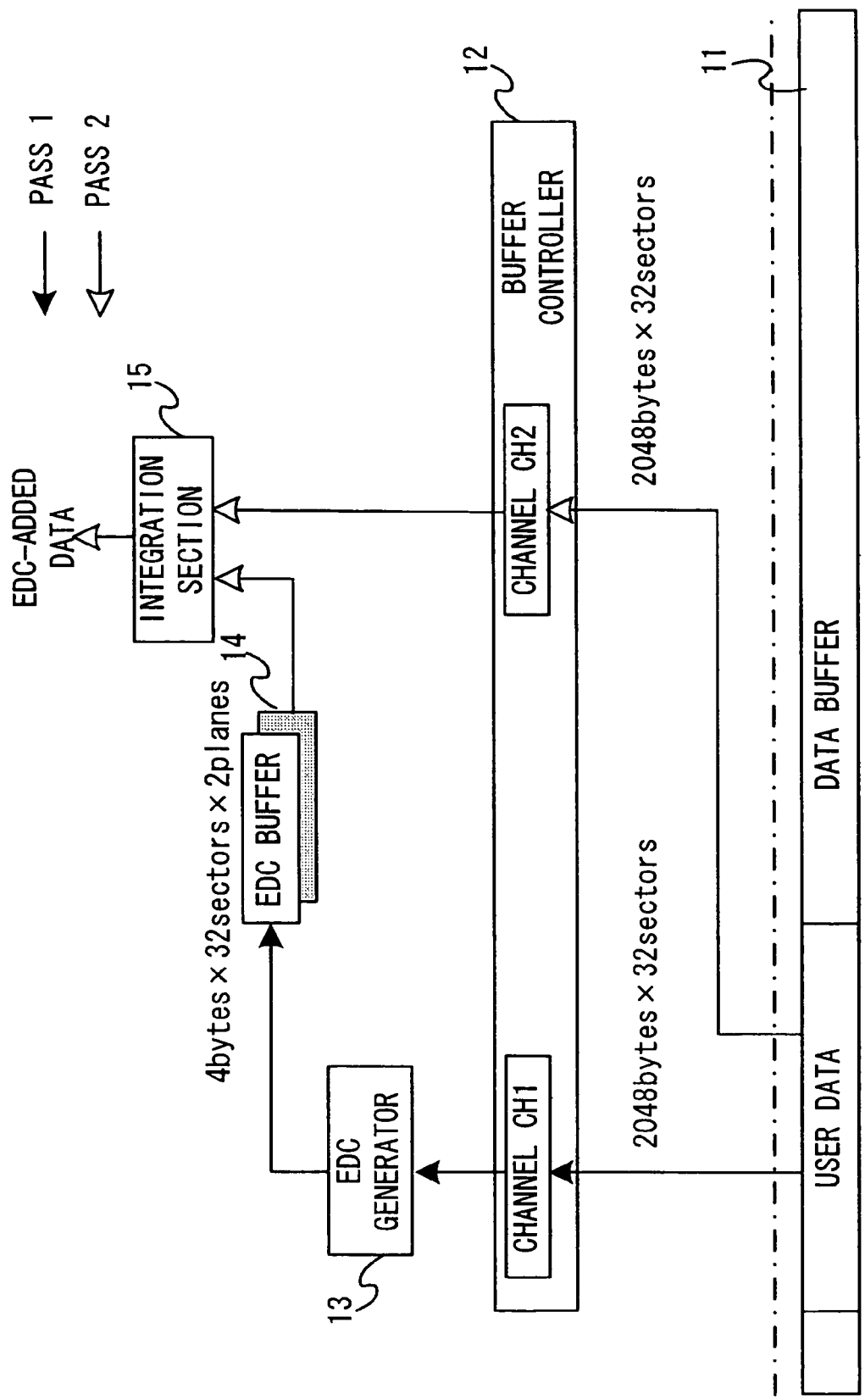
FIG. 3 is a view showing a part for calculating an error detecting code in a recording apparatus disclosed in U.S. patent application Ser. No. 11/366,629.

FIG. 3 is a view showing a part for calculating an error detecting code in the recording apparatus disclosed in the reference.

In this reference, a step (pass 1') of determining an error detecting code in a process according to Blu-ray specifications and a step (pass 2') of inserting the error detecting code and outputting the data. The process in the pass 2' burst-transfers the data that have a burst transfer size m and are arranged in the user data direction Q sequentially in the recording frame direction P, adds the EDC that is calculated in the pass 1' and outputs the EDC-added data.

Specifically, according to the invention disclosed in the reference, a recording apparatus includes a data buffer 11 for storing user data, a buffer controller 12, an EDC generator 13, an EDC buffer 14, and an integration section 15. In the following example, user data is arranged in ascending order of address in the user data direction Q and stored temporarily into the data buffer 11 from the head data of the user data. The data buffer 11 is a memory for storing the user data that are sent from a host and it is formed of SDRAM or the like that is capable of burst transfer. The buffer controller 12 includes a channel CH1 for reading the user data to be used in the pass 1' and a channel CH 2 for reading the user data to be used in the pass 2'.

The user data that are read from the data buffer 11 in the sequence of the user data direction Q by the channel CH1 is sent to the EDC generator 13. The EDC generator 13 is configured by a shift register that generates 4-byte EDC upon input of 2048-byte user data and 4-byte 0 data, which is the data corresponds to one sector, in the user data direction Q. The generated EDC is stored in the EDC buffer 14.

In the pass 2', the user data that are read from the data buffer 11 in the user data direction Q are sequentially transferred to the integration section 15 in the recording frame direction P with a burst transfer size of the sequence of the user data direction Q by the channel CH2. Specifically, the user data (data block 41) composed of 32 sectors are repeatedly transferred 304 times in the recording frame direction P with a burst transfer size of the sequence of the user data direction Q. In this embodiment, a part having a burst transfer size of m times 304 bytes in the user data direction Q is referred to as a transfer block. If the burst transfer size m is 6, the transfer of the data block 41 ends after repeating transfer of the transfer block 36 times.

When transferring the transfer block, the integration section 15 reads out EDC from the EDC buffer 14 at a prescribed timing, adds the EDC to the user data to be burst-transferred, and outputs the data with EDC added.

The EDC-added data is then scrambled and output as recording data. The detail of this process is described in the above-mentioned reference. Briefly, the process stores the EDC-added data into a buffer (substitution buffer) having a memory capacity of the size of a transfer block or larger and then reads out the data in the recording frame direction P for output. Then, it scrambles the EDC-added data arranged in the recording frame direction P and outputs the scrambled data as recording data. The scrambling uses a scramble intermediate value which is calculated together with EDC in the pass 1'.

In the pass 1', the data to which EDC is added by the integration section 15 are then input to the scrambler one byte by one byte sequentially in the user data direction Q. In the scrambler, scrambling value Sk is output from a scramble shift register at the input timing of input data Dk, and exclusive OR of the scrambling value Sk and the input data Dk is calculated to obtain scrambled data Dk'. In the pass 1', the recording apparatus stores a storage value (16 bits) of the scramble shift register to a scramble buffer as a scramble intermediate value. The 16-bit scramble intermediate value is used in the pass S2 to calculate the scramble value in the recording frame direction P, not the user data direction Q, thereby enabling scrambling.

Further, the invention disclosed in the reference calculates a scramble intermediate value and then calculates ECC based on this data. Specifically, in the pass 1', ECC is calculated in addition to EDC and scramble intermediate value for use in the pass 2'. As described later, it is possible to scramble the EDC-added data that are output from the integration section 15 and store the scrambled data in the substitution buffer, and then outputs the data in the recording frame direction P as recording data.

According to the invention disclosed in the reference, the buffer controller 12 needs to read the user data of one cluster (data block), which is the user data of 2048 bytes times 32 sectors, from the data buffer 11 both when calculating EDC in the pass 1' and when outputting the EDC-added data in the pass 2'. Accordingly, it is necessary to read the user data of total two data blocks in the passes 1' and 2'. On the other hand, the exemplary embodiment of the invention described in the followings can reduce a total amount of user data read and thus reduce access to the data buffer even when conducting two steps just like the reference. Specifically, the process of the embodiment reduces the user data that are used in the first step to about one-fourth. It calculates an EDC intermediate value based on the user data of about one-fourth and then calculates EDC based on the remaining user data (about three-fourth) and the EDC intermediate value. This allows the access to the data buffer in the first step to be reduced to about one-fourth. This embodiment thereby reduces data access to the data buffer to enable further improvement in encoding specification and reduction in power consumption and costs.

First Embodiment

Figure 4:
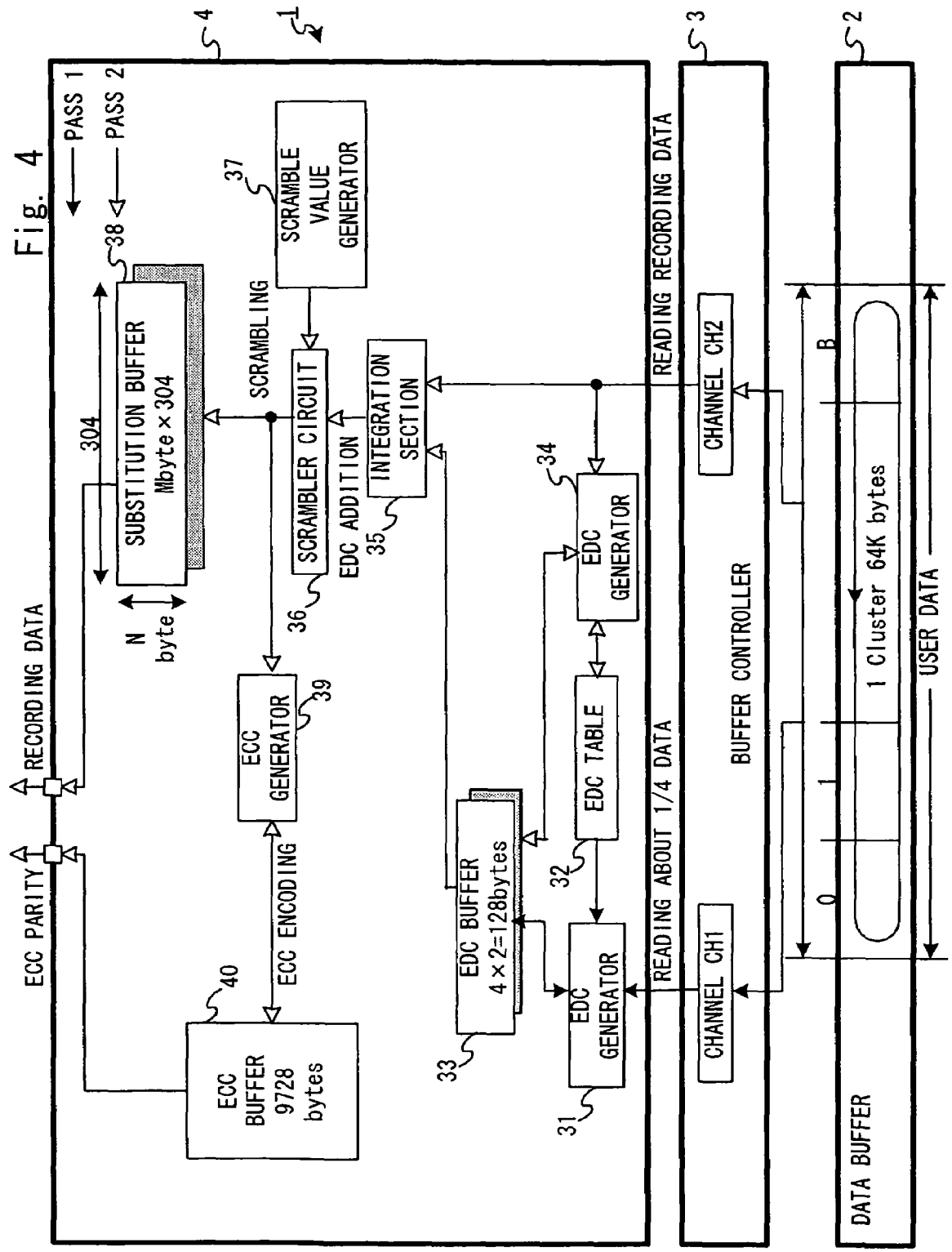
FIG. 4 is a schematic diagram of a disc encoding device according to a first exemplary embodiment of the invention.

FIG. 4 is a schematic diagram of a recording apparatus according to a first exemplary embodiment of the present invention. As shown in FIG. 4, the recording apparatus 1 includes a data buffer 2, a buffer controller 3, and an encoder 4. The data buffer 2 buffers the user data that are transferred from a host (not shown). The host may be an audio-visual (AV) system, a personal computer (PC) or the like, which designates the recording apparatus 1 to record user data or read data from a disc.

The buffer controller 3 controls the reading of user data from the data buffer 2. The buffer controller 3 reads user data according to need and transfers the read data to the encoder 4. To calculate EDC, the recording apparatus of this embodiment executes, in parallel, the process (herein referred to as the pass 1) that calculates an EDC intermediate value from the data in the latter half of an even sector, which is about one-fourth of user data in a whole data block, and the process (herein as the pass 2) that calculates EDC from the remaining three-fourth of user data and the EDC intermediate value. The buffer controller 3 has a channel CH1 for reading the user data for use in the processing of the pass 1 and a channel CH2 for reading the user data for use in the processing of the pass 2, both from the data buffer 2.

The encoder 4 adds EDC to user data and scrambles the EDC-added user data. The encoder 4 then outputs the scrambled data (hereinafter referred to as the recording data) and the ECC obtained from the recording data. The ECC and the recording data are then combined with a BIS code, modulated by 1-7 PP, and recorded on a disc.

The encoder 4 includes an EDC generator 31, an EDC table 32 and an EDC buffer 33 for carrying out the processing of the pass 1. It further includes an EDC generator 34 for calculating EDC in the pass 2. The EDC generator 31 serves as a first operation section and the EDC generator 34 serves as a second operation section. In the processing of the pass 1, the EDC generator 31 performs operation by reference to the EDC table 32 and the EDC buffer 33. The result of the operation performed in the EDC generator 1 in the pass 1 is an EDC intermediate value, which is described later. The obtained EDC intermediate value is written back to the EDC buffer 33. In the processing of the pass 2, the EDC generator 34 calculates EDC by reference to the EDC table 32 and the EDC buffer 33 and writes the obtained EDC back to the EDC buffer 33.

The encoder 4 further includes an integration section 35 that adds the EDC which is stored in the EDC buffer 33 to the user data which is read from the channel CH2 and outputs the EDC-added data. It further includes a scrambler 36 that scrambles the EDC-added data which is output from the integration section 35 and a scramble value generator 37 that calculates a scramble value which is required for the scrambler 36 to scramble the data. The encoder 4 further includes a substitution buffer 38 that rearranges the scrambled data which is scrambled by the scrambler 36 into the sequence in the recording frame direction P. The integration section 35, the scrambler 36, the scramble value generator 37, and the substitution buffer 38 constitute a scramble processor that calculates recording data from the user data and EDC and outputs the obtained recording data.

In addition, the encoder 4 includes an ECC generator 39 that generates ECC from the scrambled data and an ECC buffer 40 that buffers the ECC generated by the ECC generator 39. The data that are read from the substitution buffer 38 in the sequence of the recording frame direction P is output as recording data. The data of the ECC buffer 40 is output as ECC parity. The recording data and the ECC parity are output to an integration section, which is not shown, where the recording data are rearranged rows and columns, added with ECC and then interleaved, thereby creating an ECC cluster (cf. D12 in FIG. 32).

Figure 32:
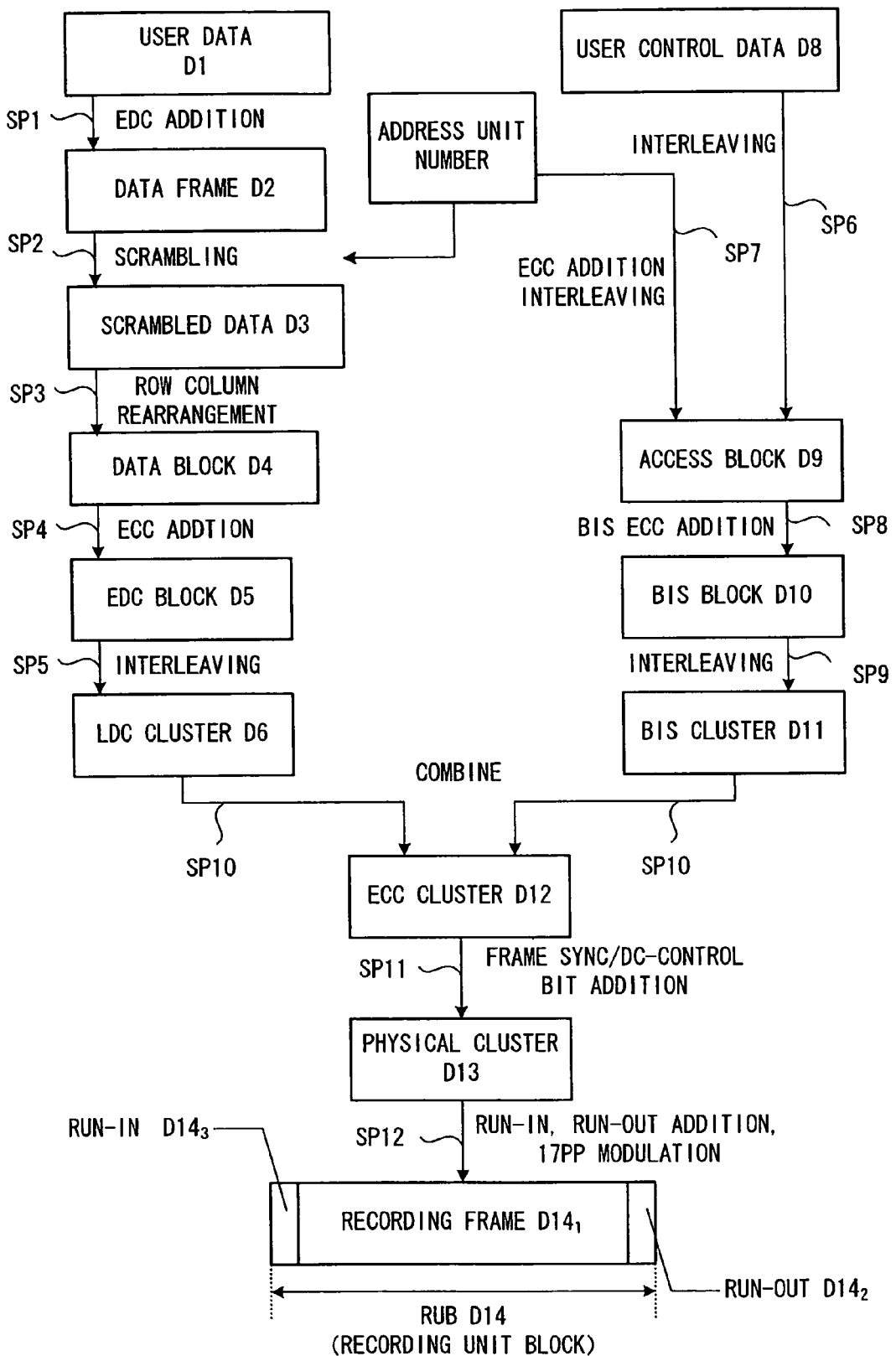
FIG. 32 is a view showing an encoding process of each data for creating RUB from user data and address information.
Figure 33:
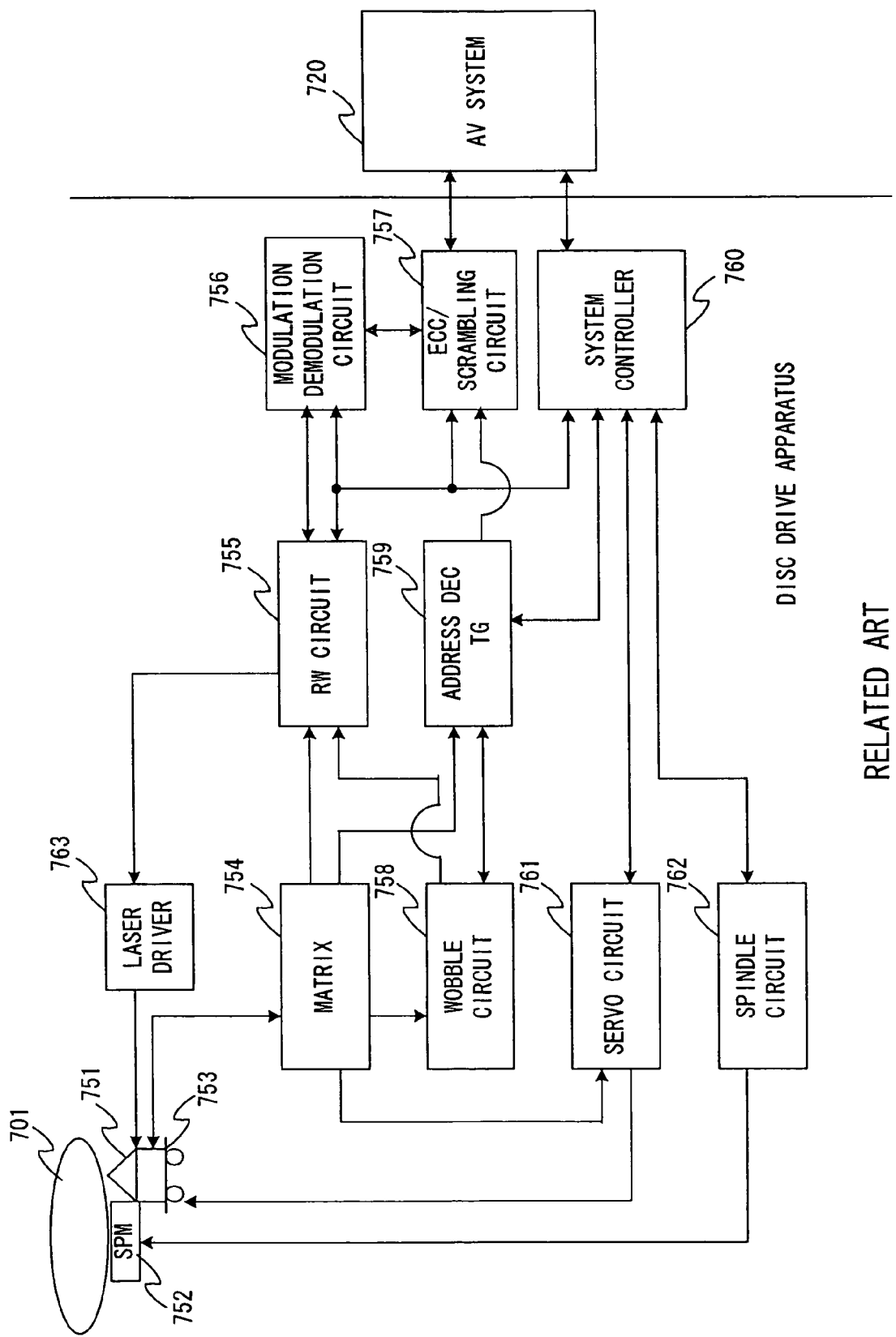
FIG. 33 is a block diagram showing a reproducing apparatus described in Japanese Unexamined Patent Application Publication No. 2004-192749.

Further, another encoding device for generating BIS (BIS encoding device) generates an access block (cf. D9 in FIG. 32) from user control data and an address unit number (cf. D7 and D8 in FIG. 32) and further generates BISECC (cf. D10 in FIG. 32). Then, the BIS encoding device supplies the access block and BISECC to the integration section to thereby create a BIS block (cf. D10 in FIG. 32). The BIS block is interleaved into a BIS cluster (cf. D11 in FIG. 32). Then, the BIS cluster is combined with the LDC cluster to create an ECC cluster (cf. D12 in FIG. 32). The ECC cluster is added with a frame sync and DSV control bit, creating a physical cluster (cf. D13 in FIG. 32). Then, 17PP modulation is performed on a recording frame and run-in and run-out are added thereto to create a recording unit block RUB (cf. D14 in FIG. 32). After that, the data is recorded onto a disc by a disc controller in recording units of RUB.

This exemplary embodiment is described in further detail below. The embodiment does not calculate EDC after reading user data of one sector but calculates an EDC intermediate value from about one-fourth of user data in the pass 1 and then calculates EDC by correcting the EDC intermediate value based on the remaining user data in the pass 2, thereby reducing access to the data buffer 2 that occurs in the pass 1 to about one fourth.

Figure 5:
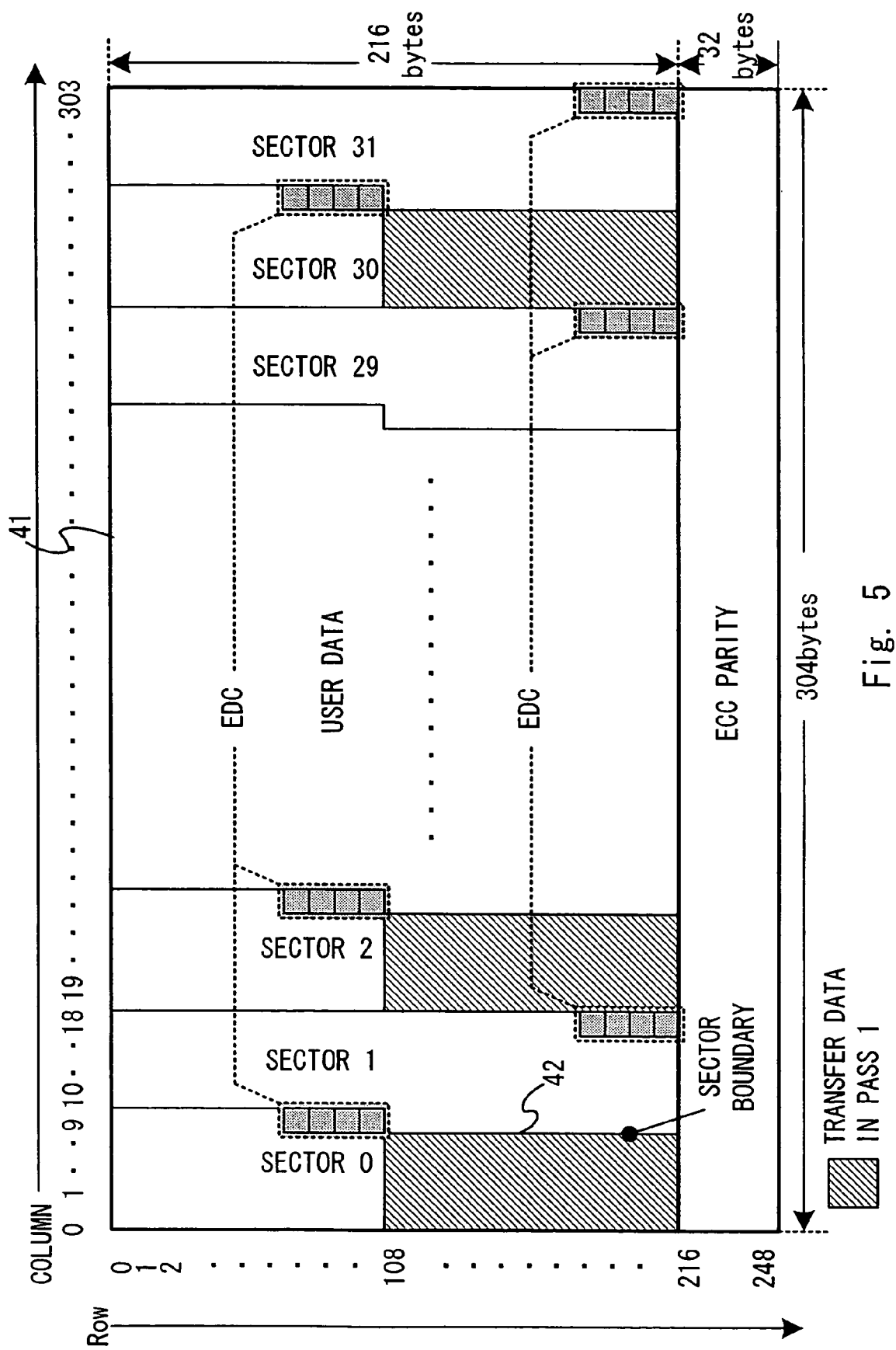
FIG. 5 is a view to describe the user data that are used for a pass S1 and a pass S2 according to an exemplary embodiment of the invention.

FIG. 5 is a view to describe the user data that are used in the passes 1 and 2 according to this embodiment. The data block 41, which is a unit of processing in the encoder 4, has an even number sector in which EDC is added at the end of a sector when reading data in the user data direction Q while it is inserted on the halfway of reading data of one sector in a different sequence from the user data direction Q. In the pass 1 of this embodiment, a data block is read out in the user data direction Q as a first sequence. In the pass 2, on the other hand, the user data arranged in the user data direction Q is read out, each having a burst transfer size m, in the recording frame direction P as a sequence different from the first sequence. In this case, the even number sector is a code string (operation target sector) to which EDC is inserted before transferring all the data in one sector as shown in FIG. 5. Thus, the process in the pass 1 calculates an EDC intermediate value by performing operation on a part of the even number sector that serves as the operation target sector in the pass 2, which is the latter part of the even number sector which is read out after EDC is added. After that, the process in the pass 2 calculates EDC by performing operation on the remaining part of the even number sector and the entire part of an odd number sector. The odd number sector is a code string (non-operation target sector) to which EDC is added at the end of the sector both when reading the data in the user data direction Q and when reading user data having a burst transfer size m arranged in the sequence of the user data direction Q in the recording frame direction P as a sequence different from the above sequence, and therefore there is no need to calculate an EDC intermediate value in the pass 1.

Though this embodiment burst-transfers the user data 6 bytes each, it is feasible to transfer the user data 1 byte each in a different sequence, e.g. in the recording frame direction P. Since EDC is 4 bytes in this embodiment, EDC in the even number sector is placed in such a position where the row numbers Row=104 to 107 and the column number Column=9. It is therefore necessary that the following operation (exclusive OR operation with an expected value) is completed on all user data in the even number sector before calculating a head byte of EDC placed in the row Row=104 and the column Column=9 in the pass 2. For this reason, the processing of the pass 1 needs to perform the processing on the user data placed in the rows Row=105 to 215 and the columns Column=0 to 8. This is the same in the cases where the burst transfer size is less than 4 bytes, or where the burst transfer size is four bytes or larger and the data are transferred over two transfer blocks in succession. Specifically, this embodiment performs the processing of the pass 1 so that exclusive OR of expected values of all user data in the sector is calculated prior to the operation on the head byte of the EDC placed in the position with Row=104 and Column=8 or Row=212 and Column=18. A method for calculating and designating a head address in the data buffer 2 to execute burst transfer is described later.

In the pass 1, the channel CH1 of the buffer controller 3 reads, in the sequence of the user data direction Q, the data placed in the rows Row=108 to 215 of the even number sector that is included in the data block 41 as a part of the operation target sector as shown in FIG. 5 and outputs the read data to the EDC generator 31. Specifically, it transfers the user data in Column=0 and the rows Row=108 to 215 sequentially and then transfers the user data in Column=1 and the rows Row=108 to 215. The transfer is repeated in this manner until reaching Column=8. Since the channel CH1 transfers the user data of the even number sectors only, after completing the transfer of the data in Column=8, it skips the sector 1 and starts transferring the user data in the sector 2, which are in Column=19 to 27 and Row-108 to 215. This transferring process is repeated until the sector 30, the last even number sector, is reached. The EDC generator 31 performs operation on the latter part of the even number sector.

On the other hand, in the pass 2, the channel CH2 of the buffer controller 3 reads all the data in the data block 41 in a different reading order from the channel CH1. Specifically, the channel CH2 burst-transfers the data with a burst transfer size m in the pass 2. Though the burst transfer size m is 6 in this embodiment, it may be larger or smaller than 6 bytes. The burst transfer size m is preferably equal to or more than the size of EDC.

Figure 6:
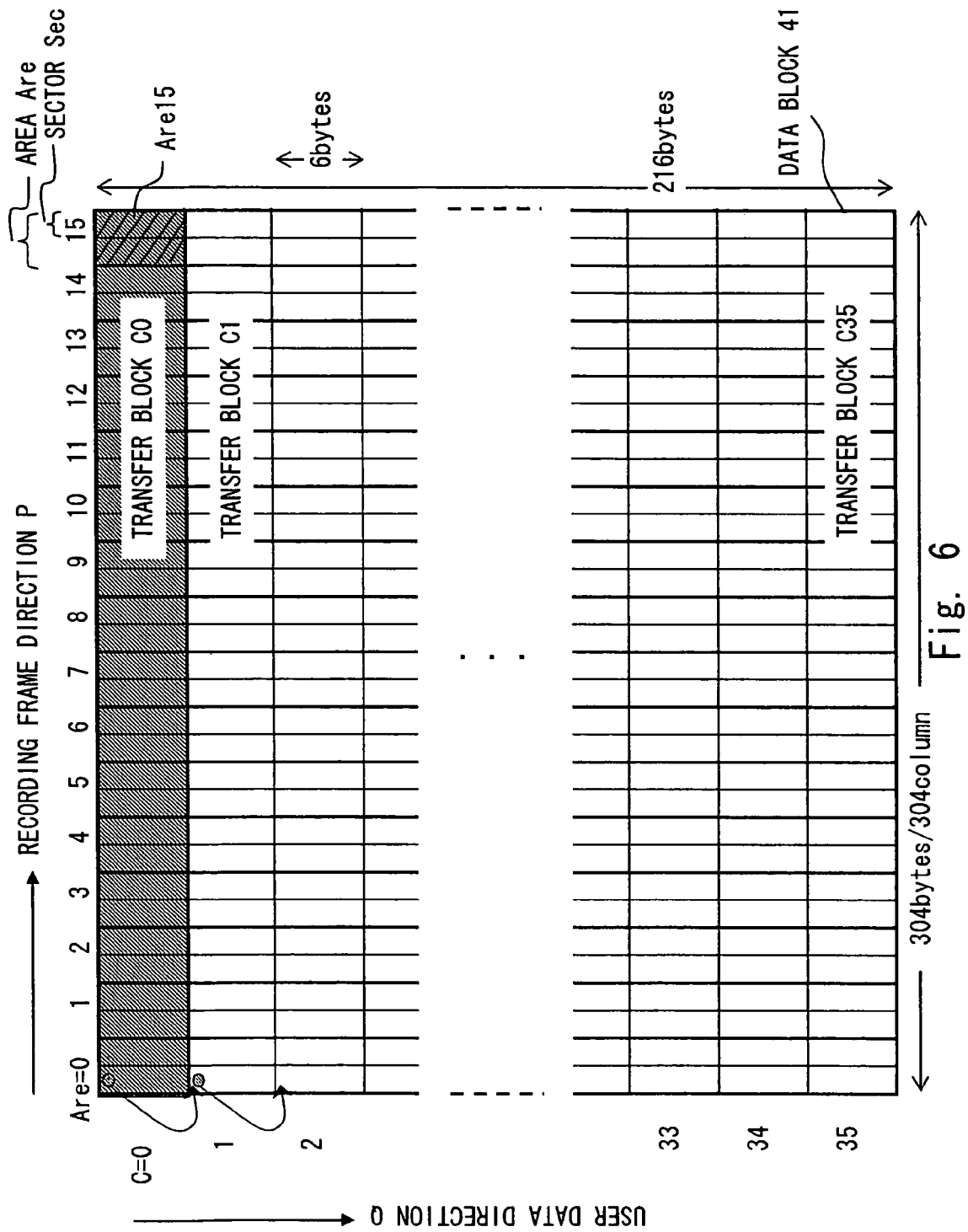
FIG. 6 is a view showing transfer blocks in a data block.

First, 6-byte data arranged in the user data direction Q (column direction) are transferred for one data block in the recording frame direction P (row direction) repeatedly 304 times. In this embodiment, the data that is obtained as a result of transferring 6 bytes in the user data direction Q, 304 times in the recording frame direction P is referred to as the transfer block C. FIG. 6 is a view showing the transfer blocks in the data block 41. In the case of performing burst-transfer of 6 bytes each, 36 transfer blocks are transferred to transfer one data block 41. The channel CH 2 supplies the user data of 6 bytes each to the integration section 35 by burst transfer and also to the EDC generator 34. The EDC generator 34 performs operation on the data of the remaining part of the user data other than the latter part of the even number sector on which the operation has been performed by the EDC generator 31 in the pass 1, which is the data of the first half of the even number sector and the entire part of the odd number sector.

Figure 7:
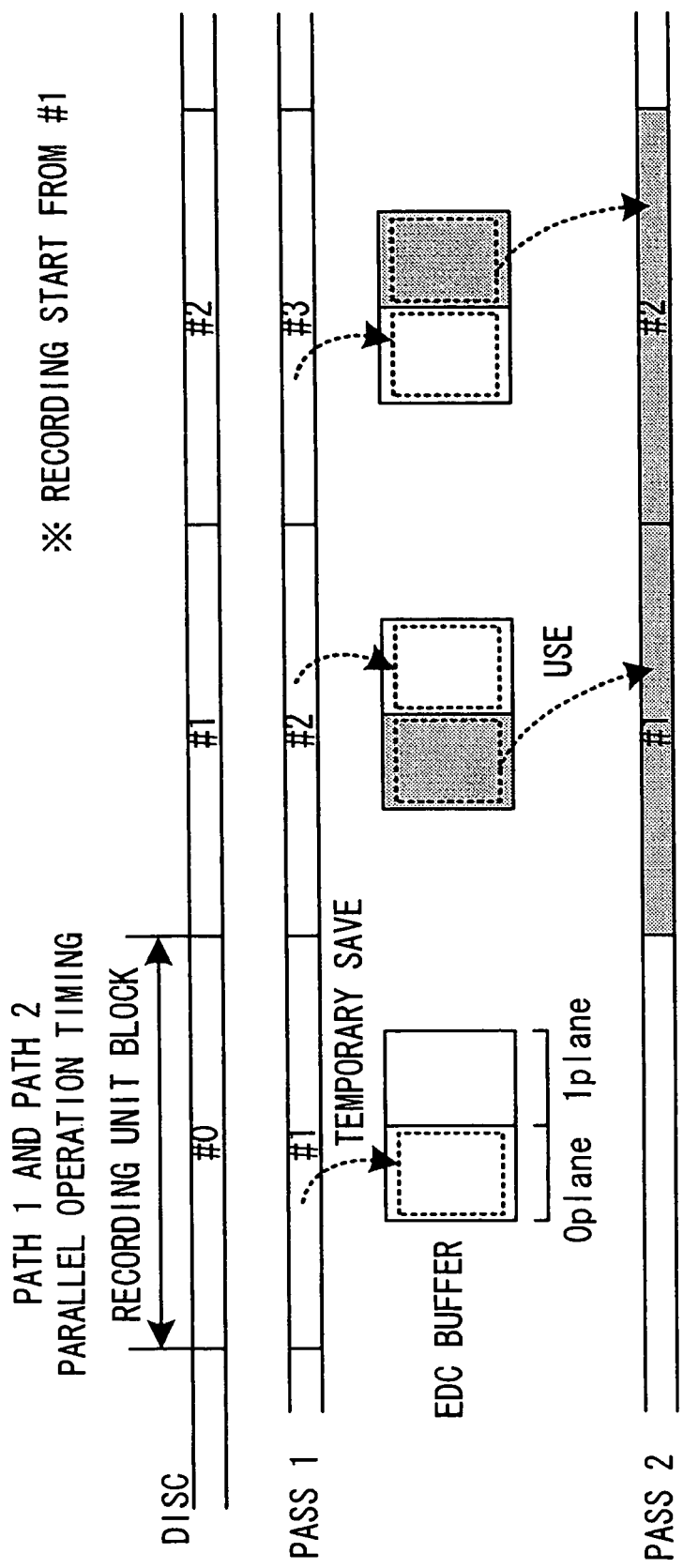
FIG. 7 is a view showing data processing timing in the passes S1 and S2.

The overview of the operation of the recording apparatus 1 according to the exemplary embodiment is described below. FIG. 7 is a view showing data processing timings in the pass S1 and the pass S2. As shown in FIG. 7, data is recorded on a disc in recording unit of 1 RUB. While the user data contained in the t-th RUB is processed in the pass S, the user data (data block) contained in the (t−1)th RUB is processed in the pass S2. Since the processing of the pass S2 is performed based on the processing result of the pass S, the recording apparatus 1 can encode the user data contained in RUB in pipeline by processing the user data contained in the t-th RUB and the (t−1)th RUB in parallel. The processing of the pass S1 transfers the user data in the user data direction Q and the processing of the pass S2 outputs the scrambled user data as recording data in the recording frame direction P.

While processing the user data contained in the (t−1)th RUB in the pass S2, the user data contained in the t-th RUB is performed in the pass S1. Thus, before the start of the processing in the pass S2 on the user data contained in the (t−1)th RUB, the processing in the pass S1 on the user data contained in the (t−1)th RUB is completed. Accordingly, the pass S1 executes the processing on the data that is at least 1 RUB prior to the data processed by the pass S2.

The EDC calculation that is performed in the pass 1 and the pass 2 is described hereinafter. The operation in both the passes 1 and 2 calculates an EDC intermediate value or EDC by using a prescribed value corresponding to the sequence of the user data direction Q. The principle of the operation method is described first.

In a Blu-ray disc, user data of 2048 bytes (16384 bits) are added with an error detecting code of 4 bytes (32 bits). The 32-bit error detecting code can be obtained by dividing a code string D(x) having 2048-byte user data added with 4-byte 0 data by the following generating polynomial:

$$G(x)=X^{32}+X^{31}+X^4+1$$

If the 2048-byte user data is I(x), the error detecting code EDC(x) is expressed as follows:

$$EDC(x)=\Sigma b_t * X^t = I(x) \bmod G(x) (\Sigma: t=31 \text{ to } 0)$$

where $I(x)=\Sigma b_t * X^t (\Sigma: t=16415 \text{ to } 32)$

Consequently, the code string D(x) added with the error detecting code EDC(x) can be expressed as follows:

$$D(x)=I(x)+EDC(x)$$

where the symbol "+" represents the exclusive OR operation.

Figure 8:
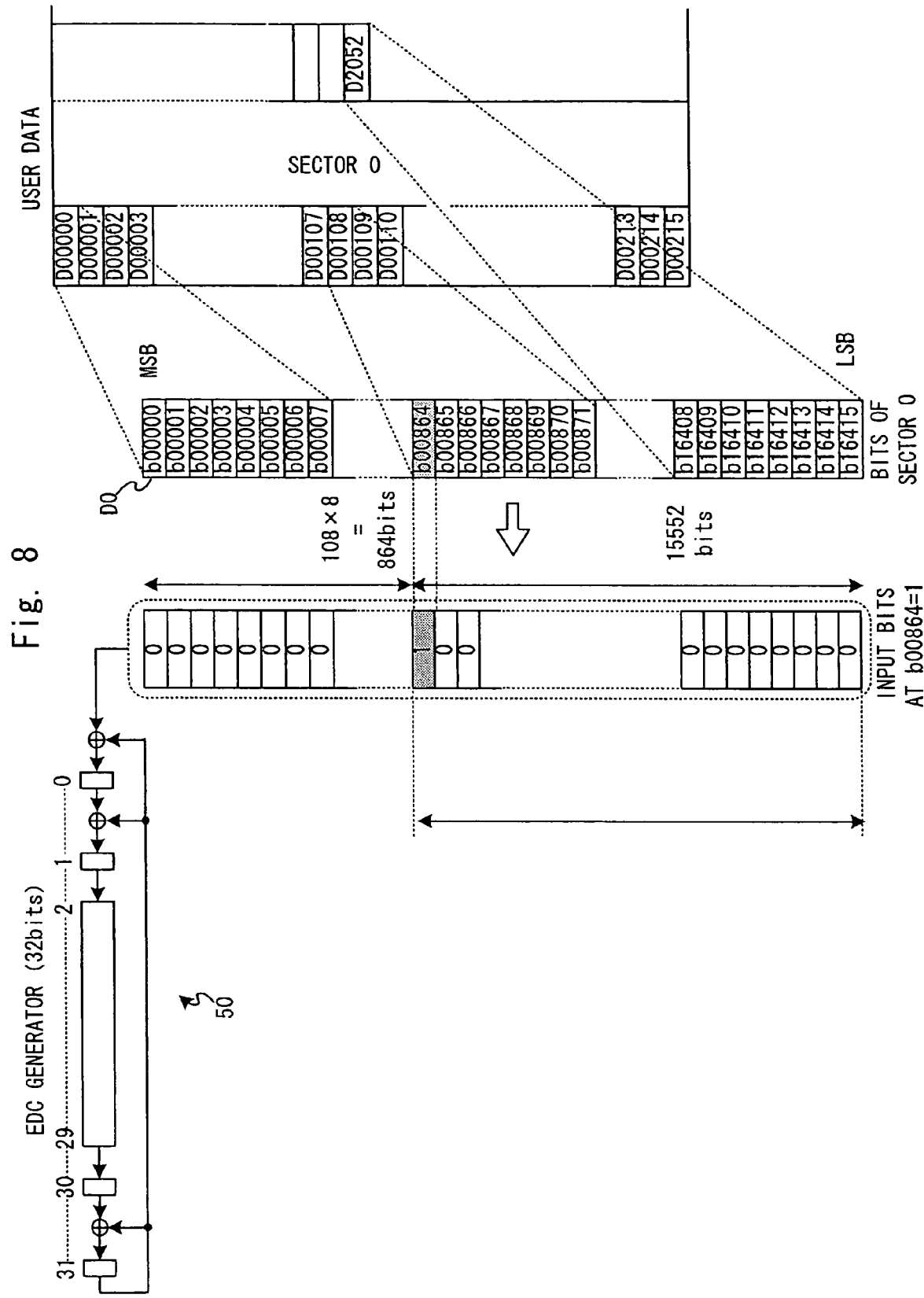
FIG. 8 is a view to describe an expected value that is used when calculating EDC in a recording apparatus according to an exemplary embodiment of the invention.

The error detecting code EDC(x) can be obtained by inputting the code string D(x) to the 32-bit shift register shown in FIG. 8. The value of the 32-bit shift register after inputting all codes of the code string D(x) is an error detecting code EDC(x)(=0) In this embodiment, the bit sequence in the user data direction Q is q, which is expressed as: q=b00000, b00001, . . . , b16415, t=16415-q and so on.

The error detecting code EDC(x) can be obtained by calculating exclusive OR of $X^t \bmod G(x)$ that corresponds to the bit with "1" in the input code string D(x). $X^t \bmod G(x)$ indicates the remainder after dividing the code string d(x) where the bits except for the (16415-q)(=t)th order bit are set to 0 in the code string D(x) with k=16416 bits by G(x).

Figure 9:
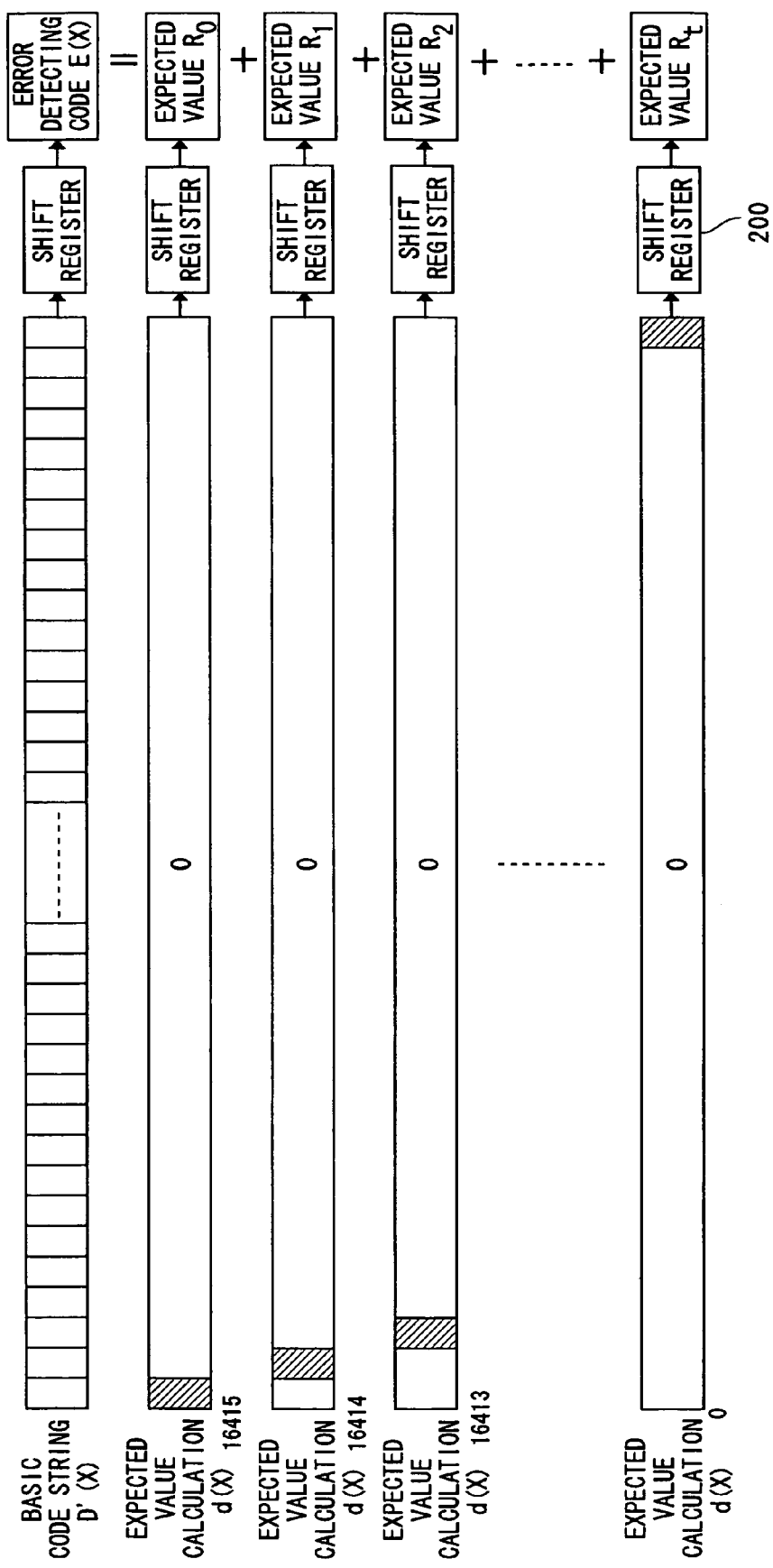
FIG. 9 is a view to describe a concept of EDC calculation.

FIG. 9 is a view to describe the above idea. The k-bit code string D(x) where the k-bits are all "1" ({111 ... 1}) is a basic code string D'(x). The 32-bit shift register value that is obtained by inputting the code string D'(x) to the shift register 50 shown in FIG. 8 is an error detecting code E'(x) of the code string D'(x). In this embodiment, the code string D'(x) contains k=2052*8=16416 bits.

The basic code string D'(x) is set as k numbers of code strings d(x)$_t$, which is referred to herein as an expected value calculation code string, as shown in FIG. 9. Each expected value calculation code string d(x)$_{1641\ to\ 0}$ is such that the bit corresponding to q is "1" and all other bits are "0". Specifically, q=b00000 corresponds to a code string d(x)$_{1641}$={100 ... 0} where only the most significant bit is "1", and q=b00001 corresponds to a code string d(x)$_{16414}$={010 ... 0} where only the second bit is "1". Similarly, q=b16415 corresponds to a code string d(x)$_0$={000 ... 1} where only the least significant bit is "1". By inputting the expected value calculation code strings d(x)$_t$ to the shift register 50, 32-bit shift register value $X^t$ mod G(x) is obtained.

Thus, the remainder after dividing the expected value calculation code string d(x) by G(x), which is an error detecting value, is $X^t$ mod G(x). $X^t$ mod G(x) is referred to herein as the expected value. The expected value $X^t$ mod G(x) indicates a syndrome value when only the bit data corresponding to the bit sequence q in the original code string D(x) is false.

The 32-bit shift register value (error detecting string E'(x)) which is obtained by inputting the code string D'(x) to the shift register equals the value obtained by performing exclusive OR on all the 32-bit shift register values (expected value $X^t$ mod G(x)=$R_t$) which is obtained by inputting the expected value calculation code strings d(x)$_t$ to the shift register.

Thus, the error detecting code E(x) can be obtained as an exclusive-OR of all the expected values $X^t$ mod G(x) that corresponds to the bit sequence q with the code "1" in the code string D(x). Thus, the process of this embodiment prepares the expected value calculation code string d(x) which contains the same number of bits as the code string and has the same bit sequence as the code string, where the bit corresponding to each bit sequence is "1" and the other bits are "0". Then, the process holds or calculates the expected values (syndrome value) that are obtained by inputting the expected value calculation code string d(x) to the shift register 50 for the same number as the number of bits in the code string D(x), which is k=16416 in this embodiment. Use of these expected values enables the obtainment of the exclusive ORs (=EDC) of all expected values with the bit "1" in the input code string D(x). There is thus no need to input the code string D(x) to the shift register 50. In this way, the error detecting code E(x) of the code string D(x) can be obtained even if the operation is performed in a different sequence from the user data direction Q, as long as the expected value corresponding to each bit of the code string is known.

The data is processed in units of data block. The data block 41 has 32 sectors (code strings D(x)), and the error detecting value E(x) is calculated for each code string D(x). Thus, 32 error detecting values E(x) are obtained from one data block 41.

The expected value is described in detail hereinbelow. As shown in FIG. 8, a code string D(x) that is input to the shift register 50 is X where the data input to the most significant bit (q=b00864) of the 109th byte (Q=D00108) in the user data direction Q is "1" and the data in the other bits are all "0", for example. Thus, the code string X has 16416 bits in which the 15552th order data is "1" ($B_{00864}$=1) and the other values are all "0".

In this case, the result of inputting the code string X into the 32-bit shift register 50 is obtained by initializing the value of the shift register 50 to "00000001h" and shifting this value 15552 times.

In order to calculate EDC, it is only necessary to calculate the exclusive OR of $X^t$ mod G(x) of the values where the bit data of the code string is "1". If the exclusive OR of $X^t$ mod G(x) is obtained, it is able to calculate the error detecting value E(x), which is the 32-bit shift register value of the code string D(x).

Figure 10:
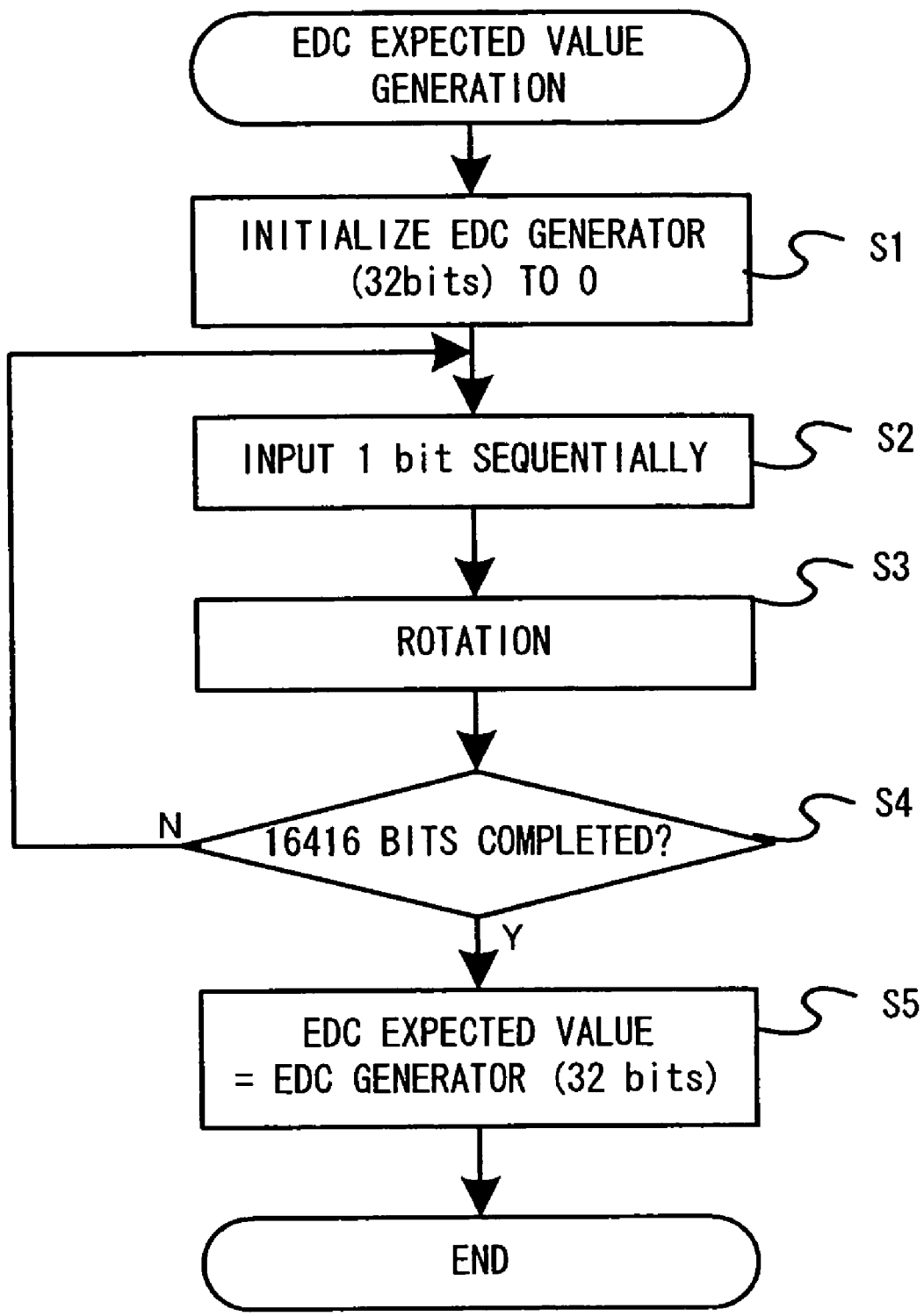
FIG. 10 is a flowchart showing a method of generating an expected value.

FIG. 10 is a flowchart showing a process of generating an expected value. As shown in FIG. 10, the process first initializes the shift register 50 to 0 (Step S1). Then, it prepares the expected value calculation code string d(x) of 16415 bits and inputs the code string d(x) to the shift register 50. The process then rotates the shift register 50 repeatedly for 16416 bits (S3 and S4) until the 32-bit register value reaches a desired expected value (32 bits) (S5).

This exemplary embodiment does not hold all the expected values corresponding to the bit data but holds only a total 19 expected values corresponding to Row=0 in the area Area0 composed of the sectors 0 and 1. In a Blu-ray disc, the data block has a regular structure where 16 data sets, each set having a pair of sectors 0 and 1 and including 19 columns when viewed in the sequence of the user data direction Q. Thus, all areas have the same bit sequence in the user data direction Q. In the pass 1, the operation begins with Row=108. Since the expected value of Row=108 equals the value of Column+10 on the expected values in Row=0, it is possible to calculate all expected values from 19 expected values in Row=0 without storing all expected values. Therefore, expected values are calculated by the above operation from 19 expected value calculation code strings where MSB of Row=0 is "1" and the others are "0". In this embodiment, the 19 expected values are referred to as the initial expected values. The column number in the area having a pair of even number sector and odd number sector is M (0≦M≦18).

Figure 11:
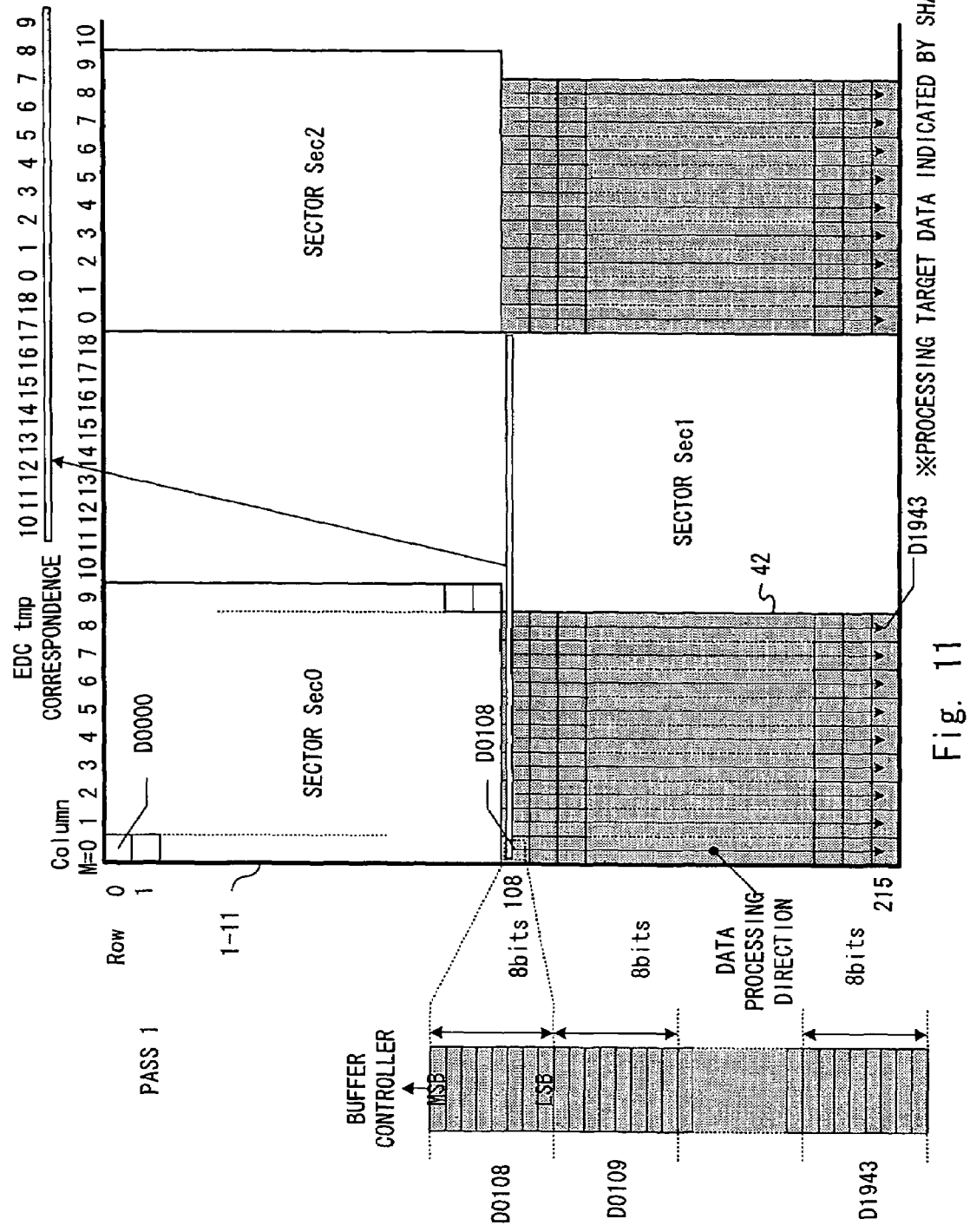
FIG. 11 is a view to describe processing in the pass 1 in the recording apparatus according to an exemplary embodiment of the invention.

FIG. 11 is a view to describe the processing in the pass 1. In the pass 1, the EDC generator 31 refers only to 19 expected values (initial expected values) that correspond to the most significant bits (MSB) in the row Row=0. Thus, the EDC table 32 reads the expected values (initial expected values) that correspond to the most significant bits b00000, ..., b14688 in the row Row=0 and the columns M=0 to 18. The initial expected values are prestored in a memory or the like, which is not shown, for example. The expected values of each column direction (user data direction Q) can be obtained simply by inputting the initial expected values into the shift register (rotation circuit), which is described later, and shifting the data once.

The EDC generator 31 generates the expected values of the rows Row=108 to 215. The expected values of each column number M in Row=108 corresponds to the expected value of each column number M+10 in Row=0. Thus, the EDC generator 31 reads the initial expected values corresponding to M+10 of the input user data by reference to the EDC table 32. The initial expected value is then shift-operated by the expected value generator, which is described later, so that it becomes the expected value that corresponds to the sequence q of each bit of the input user data. The obtained expected value and the user data are then exclusive-ORed, thereby obtaining all exclusive ORs of the data in the rows Row=108 to 215 and the columns M=0 to 8 (the data 42 indicated by shadow in FIG. 11) as an EDC intermediate value.

Figure 12:
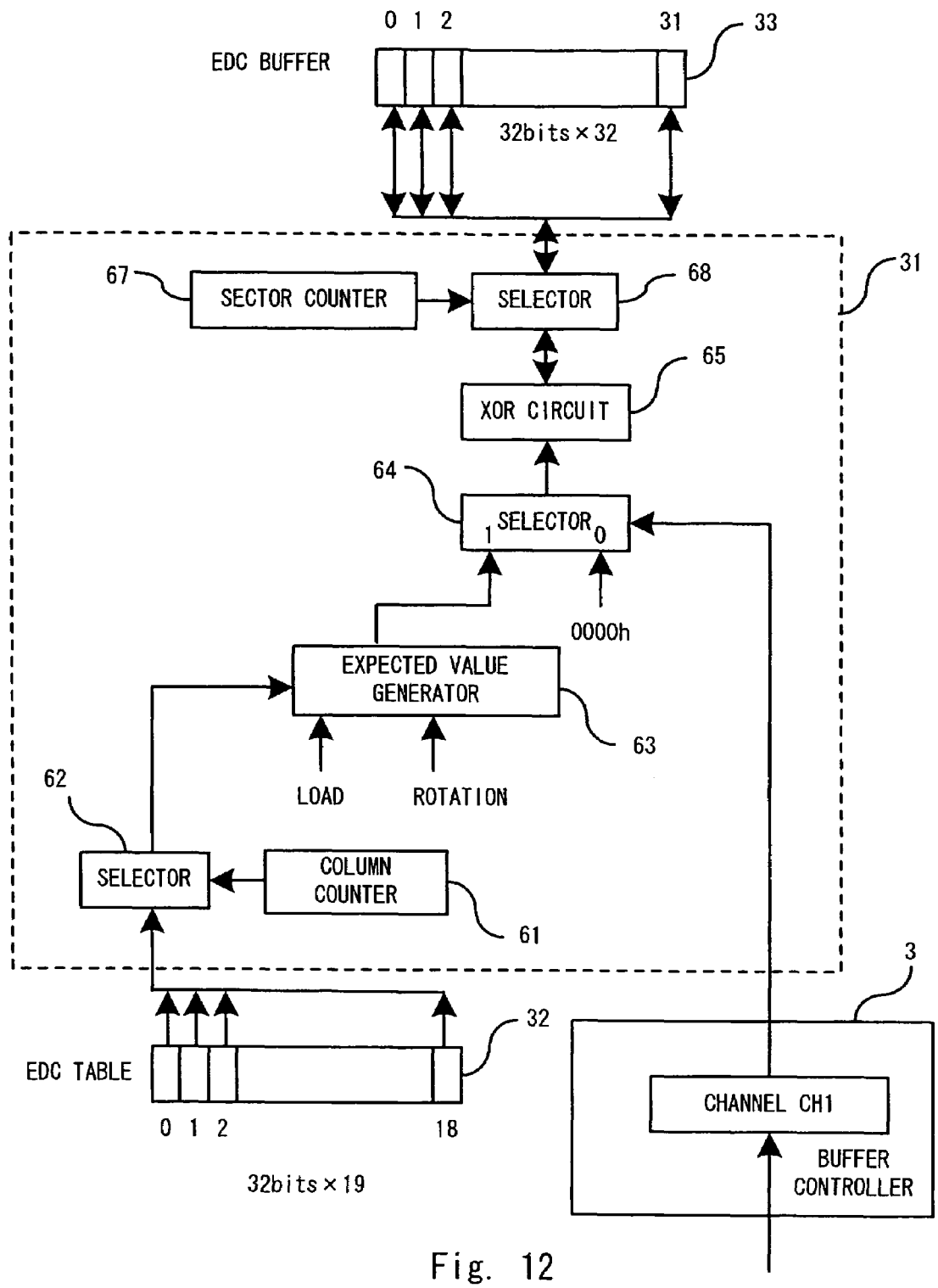
FIG. 12 is a view showing an example of a detail of an EDC generator that executes the processing in the pass 1 in the recording apparatus according to an exemplary embodiment of the invention.

FIG. 12 is a view showing an example of the detail of the EDC generator 31. The EDC generator 31 includes a column counter 61 that counts the column number M in one area of input user data, and a selector 62 that selects and reads an initial expected value from the EDC table 32 according to a count value of the column counter 61. The EDC generator 31 further includes an EDC expected value generator 63 that generates an expected value corresponding to the bit sequence q of the input user data from the initial expected value, a selector 64 that outputs the user data when the user data is "1" and the expected value corresponding to the bit sequence q of the user data, and an XOR circuit 65 that calculates exclusive-OR. Further, the EDC generator 31 includes a sector counter 67 that counts the sectors in user data and a selector 68 that transfers the operation result of the XOR circuit 65 for each sector to the EDC buffer 33 according to the count value of the sector counter 67.

Figure 13:
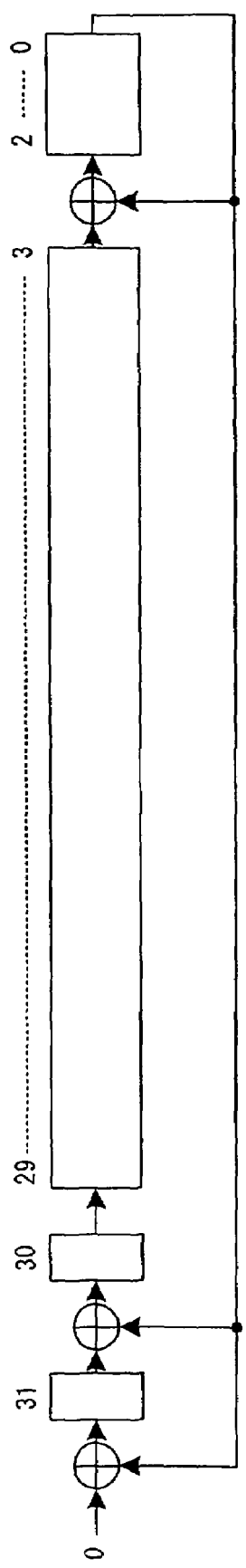
FIG. 13 is a view showing an example of an EDC expected value generator in the EDC generator.
Figure 14:
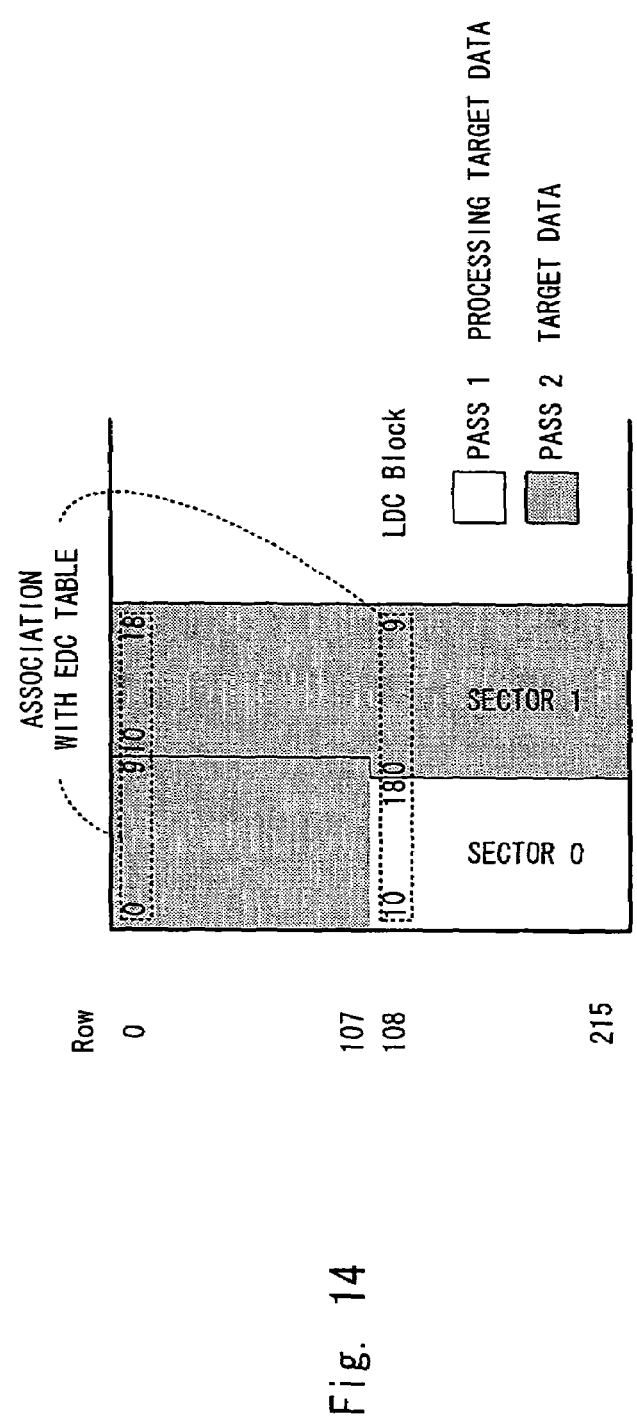
FIG. 14 is a schematic diagram showing a relationship between an EDC table to which the EDC generator refers and an initial expected value.

FIG. 13 is a view showing an example of the EDC expected value generator 63. FIG. 14 is a schematic view showing a relationship between the EDC table and the initial expected value. The EDC expected value generator 63 has a structure that 32-bit shift register is rotated as shown in FIG. 13. When 32-bit initial expected value with the column number M that corresponds to the user data supplied from the channel CH1 of the buffer controller 3 is input from the selector 62, the EDC expected value generator 63 sequentially shifts and rotates the value to thereby generate an expected value that corresponds to the bit sequence q in the user data direction Q.

The initial expected value is the value that corresponds to the most significant bit of the row Row=0, and the initial expected value that corresponds to the most significant bit of the row Row=108 is the value that adds 10 to the column number M of the row number Row=0. Thus, the initial expected value corresponding to the column number M that adds 10 to the count value of the column counter 61 is read by the selector 62 and supplied to the EDC expected value generator 63.

The EDC intermediate value is obtained as an exclusive OR of the expected value that corresponds to the bit where the user data is "1". The selector 64 outputs the expected value corresponding to the bit sequence q of the user data that is generated by the EDC expected value generator 63 only when the user data supplied from the channel CH1 is "1", and it selects and outputs "000h" when the user data is "0".

In the pass 1, the EDC buffer 33 stores the operation results that are updated by the EDC generator 31. Thus, upon completion of the processing of the pass 1, the EDC buffer 33 holds the EDC intermediate value. In the pass 2, the EDC buffer 33 stores the operation results that are updated by the EDC generator 34 and thus holds EDC eventually. The EDC buffer 33 has a storage region for storing the operation results for each sector. The data block 41 is composed of 32 sectors and each operation result has 32 bits; thus, the EDC buffer 33 has 32 sectors of 32-bit storage regions. The value stored in each storage region corresponding to the odd number sector in the EDC buffer 33 in the pass 1 is 0.

The selector 68 reads the value corresponding to the sector that is selected by the sector counter 67 from the EDC buffer 33 and supplies the value to the XOR circuit 65. The XOR circuit 65 calculates the exclusive-OR of the output of the selector 64 and the selected value of the selector 68 and supplies the result to the selector 68. The selector 68 writes this result to the storage region of the corresponding sector in the EDC buffer 33.

Consequently, upon completion of inputting the user data of the sector 0, the EDC buffer 33 stores the EDC intermediate value that is obtained by the exclusive OR operation on the user data in the latter part of the sector 0 (Row=108 to 215 and M=0 to 8) that is indicated by the shadow in FIG. 11, and the corresponding expected values.

Figure 15:
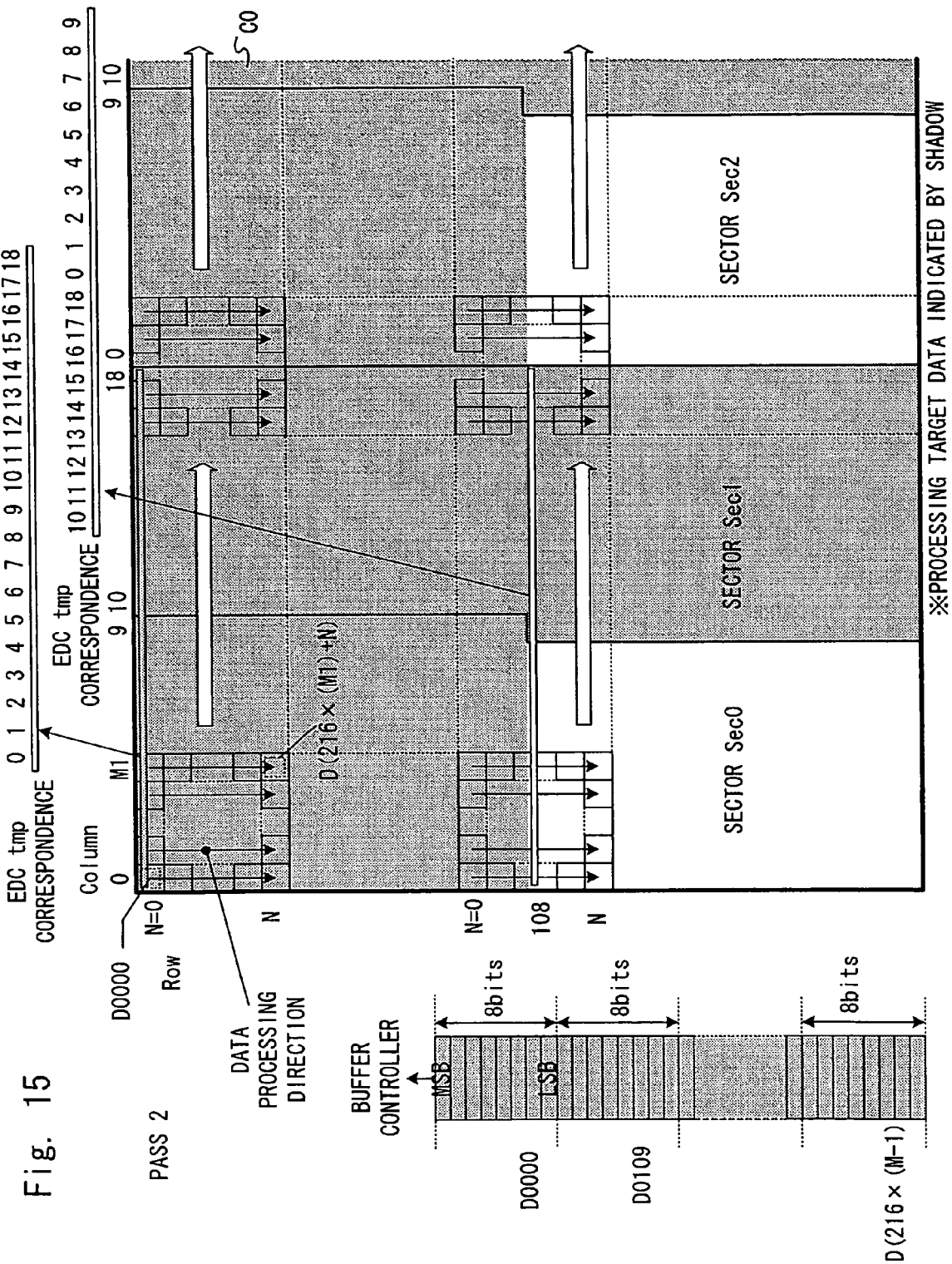
FIG. 15 is a view to describe processing in the pass 2 in the recording apparatus according to an exemplary embodiment of the invention.

The processing of the pass 2 is described herein. FIG. 15 is a view to describe the processing in the pass 2. As shown in FIG. 15, in the pass 2, the channel CH2 of the buffer controller 3 sequentially supplies the user data in the rows Row=0 to 107 and the columns M=0 to 18 and the user data in the rows Row=108 to 215 and the columns M=9 to 18, which are the user data that are not processed in the pass 1, to the EDC generator 34.

The channel CH2 sequentially supplies a transfer block that is the burst transfer size m bytes in the user data direction Q times 304 bytes in the recording frame direction P as described above. The user data of 32 sectors are transferred to the integration section 35. The EDC generator 34 may supply only the data that are necessary for operation. For example, the data in the rows Row=0 to 107 may be supplied when the transfer block is an even number sector (M=0 to 9), and all user data may be supplied when the transfer block is an odd number sector (Row=9 to 18). Alternatively, all user data in the data block may be supplied and only necessary user data may be selected for operation.

Figure 16:
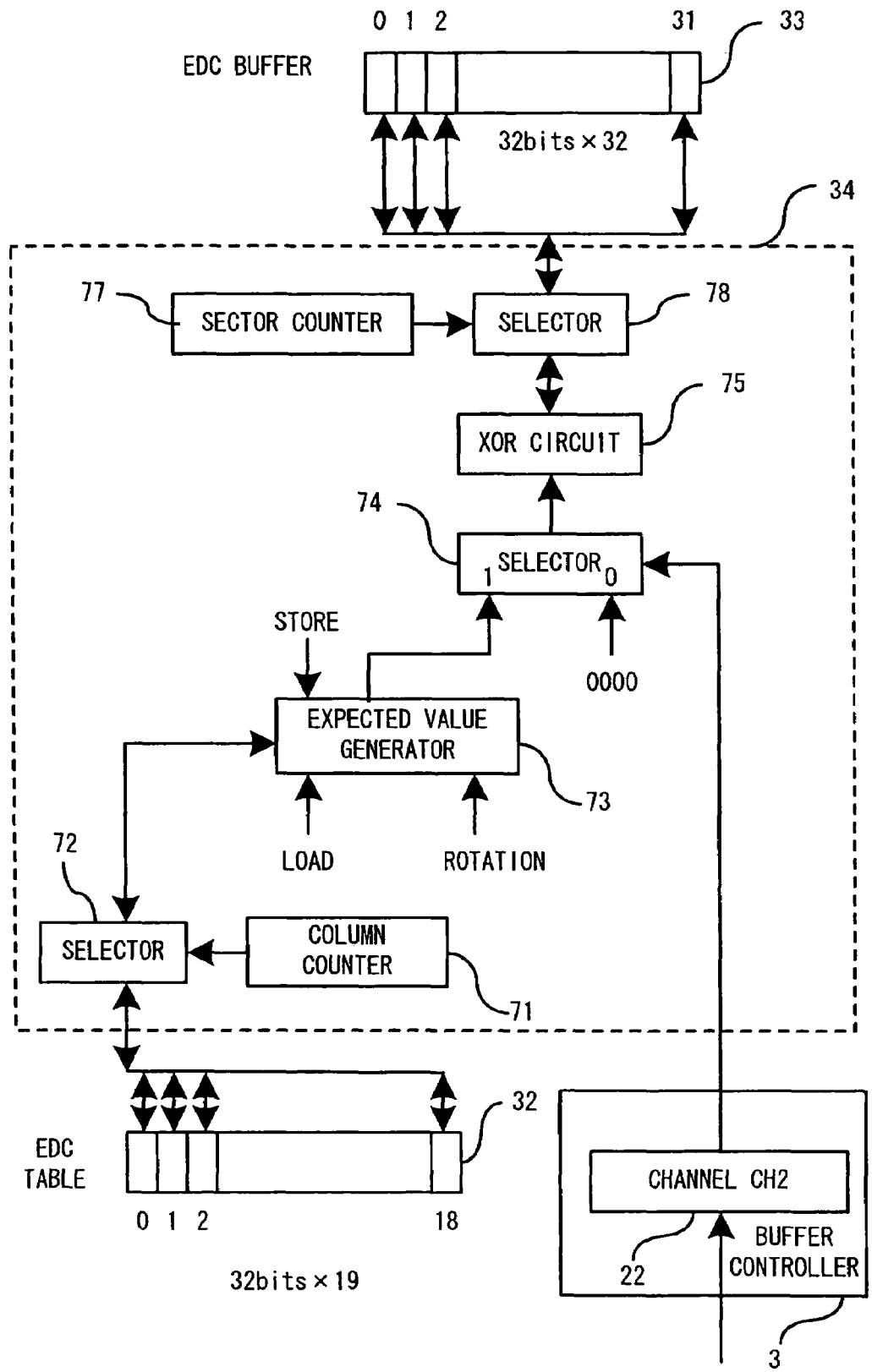
FIG. 16 is a view showing an example of a detail of an EDC generator that executes the processing in the pass 2 in the recording apparatus according to an exemplary embodiment of the invention.

The EDC generator 34 basically has the same structure as the EDC generator 31. FIG. 16 is a view showing an example of the detail of the EDC generator 34. As shown in FIG. 16, the EDC generator 34 includes a column counter 71 that counts the column number M in one area of input user data, and a selector 72 that selects and reads an initial expected value from the EDC table 32 according to the count value of the column counter 71. The EDC generator 34 further includes an EDC expected value generator 73 that generates an expected value corresponding to the bit sequence q of the input user data from the initial expected value, a selector 74 that outputs the user data when the user data is "1" and the expected value corresponding to the bit sequence q of the user data, and an XOR circuit 75 that calculates exclusive-OR. Further, the EDC generator 34 includes a sector counter 77 that counts the sectors in user data and a selector 78 that transfers the operation result of the XOR circuit 75 for each sector to the EDC buffer 33 according to the count value of the sector counter 77.

The EDC generator 34 or the recording apparatus 1 has a counter (hereinafter referred to as the base row counter) that counts the row number Row of user data and a counter (hereinafter referred as the burst transfer row counter) that counts the row number in the burst transfer size m. In the following description, the row number (count value) that is counted by the base row counter is Row ($0 \leq Row \leq 215$) and the row number (count value) that is counted by the burst transfer row counter is N ($0 \leq N \leq m-1$). The EDC generator 34 further has an EDC flag that detects input timing of 2049th byte data in the user data direction Q according to the count value of each counter, and an EDC area flag that detects input timing of 4 bytes from 2049th to 2052th bytes, both of which are not shown.

In the pass 2, after completing the transfer of one transfer block, the transfer blocks are sequentially transferred until the final block is reached. For example, the user data in the transfer block that is transferred immediately after the first transfer block begins with Row=N+1st row. Thus, when the next transfer block is transferred, the EDC table 32 holds the expected value that corresponds to the most significant bit of the Row=N+1st row. Upon generating the expected value that corresponds to the final bit in each column in the final area of the transfer block, the value is sequentially overwritten on the EDC table 32. Thus, when operation on one transfer block is completed, the EDC table 32 holds the expected value that corresponds to the most significant bit of the first row of the next transfer block. The selector 72 supplies the value corresponding to the column number of input user data to the expected value generator 73, thereby enabling generation of an expected value in the next transfer block.

Then, the XOR circuit 75 performs exclusive-OR operation on the EDC intermediate value that is stored in the EDC buffer 33 by the processing in the pass 1 and the expected value that is generated in the above way and selected and output by the selector 74, and writes the result back to the EDC buffer. The EDC corresponding to each sector is thereby calculated upon completion of the exclusive-OR operation on all user data in each sector. The EDC in the even number sectors are thus calculated first and then the EDC in the odd number sectors are calculated after that. The EDC is calculated at the timing when the EDC flag becomes "1". Since the burst transfer size m is 6 in this embodiment, regarding the user data that are input in the 2047th to 2052nd bytes, up to the 2048th byte, if the data is "1", the value stored in the EDC buffer 33 is updated by the XOR circuit 75 as described above. While the EDC area flag is "1", which is in timings when the 2049th to 2052nd data are input sequentially in the user data direction Q, the process does not use the user data of 2049th to 2052nd bytes but performs operation using 4-byte 0 data as input data. Since data is all 0 data in this period, the selector 74 simply supplies 0000h to the XOR circuit 75 without updating the value of the EDC buffer 33. Thus, if the data of 2049th byte is input, the expected value generator 73 simply rotates this value sequentially and the data of the corresponding sector that is stored in the EDC buffer 33 is output to the integration section 35 as EDC.

The 2049th byte data corresponds to the position of the head data of EDC in the data block. Thus, after the 2048 byte user data are transferred, the integration section 35 shown in FIG. 4 adds EDC in accordance with the transfer sequence of the channel CH2. Accordingly, it is necessary to calculate EDC before adding EDC head data or calculate exclusive-OR (=EDC) of the expected values where each bit is "1" for all user data of 2048 bytes upon data input of 2049th byte that corresponds to the EDC head data so as to enable output of EDC.

Figure 17:
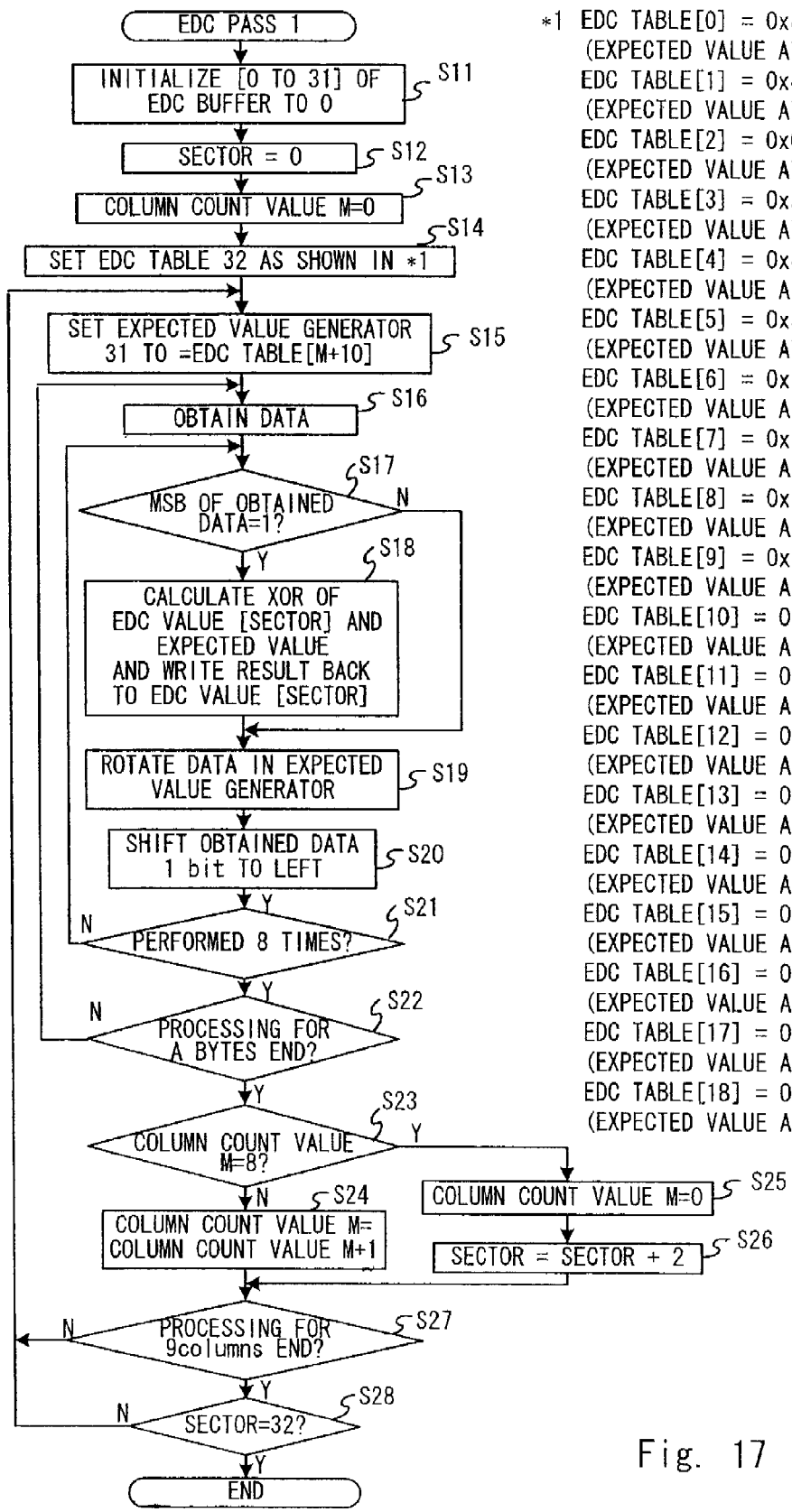
FIG. 17 is a flowchart showing an EDC generation process in the pass 1.

The EDC generation process in the passes 1 and 2 is described hereinafter in detail. The processing of the pass 1 is described first with reference to FIGS. 11, 12 and 17. FIG. 17 is a flowchart showing the EDC generation processing in the pass 1. As described above, the EDC buffer 33 holds operation results of each sector. In the following description, the operation results of each sector are refereed to as EDCValue [0 to 31].

The process first initializes EDCValue [0 to 31] of the EDC buffer 33, each counter, and the EDC table 32. Specifically, all of EDCValue [0 to 31] in the EDC buffer 33 are set to 0 (Step S11). Further, the count values of the sector counter 67 and the column counter 61 are set to 0 (Steps S12 and S13). Further, the table value of the EDC table 32 is set to an initial expected value (cf. *1 in FIG. 17). The values shown in *1 indicate the initial expected values that are set to 19 storage regions of the EDC table 32. In the followings, the 19 expected values that are stored in the EDC table 32 are each represented as EDC Table [M]. "M" represents the column number in one area, which is from 0 to 18. For example, as shown in *1, the EDC Table [0] is set with the 32-bit value (expected value)=0×8af08bed that is obtained by inputting the code string of 16416 bits (one sector) where MSB of D0000 byte is "1" and the others are "0" into the shift register 50 that is the EDC generator shown in FIG. 8.

Then, the selector 62 reads the value of EDC Table [M+10] (S15). As described above, this embodiment uses 19 expected values in the most significant bit at Row=0 as initial expected values and generates all expected values from the 19 expected values.

Since the count value M of the column counter 61 is M=0 at first, the process reads the value of EDC Table [10]. Then, it obtains the user data from the next channel CH1 (Step S16). If one sector of 2052 bytes (including 4-byte 0 data) contains D0000 to D2051 in the user data direction, the process of Step S16 sequentially obtains 108-byte data, with D0108+216*N (N=0 to 8) at the head, in the user data direction.

In this exemplary embodiment, the obtained data is stored in units of 1 byte (8 bits) and processed in the following way. First, if the MSB of the obtained data is "1", the selector 64 outputs the expected value generated by the expected value generator 63 to the XOR circuit 65. The selector 68 selects to read the value of the sector under corresponding processing from EDCValue [0 to 31] and outputs the selected value to the XOR circuit 65. The XOR circuit 65 calculates the exclusive-OR of these and outputs the result to the selector 68. The selector 68 writes the result back to the storage region of the corresponding sector in the EDC buffer 33 (Step S18). Then, the process rotates the data stored in the EDC expected value generator 63 (S19), shifts the 8-bit data (S20), and repeats the processing of Step S17 and subsequent steps 8 times for 8 bits (S21). Specifically, the process shifts 1 bit in Step S20, and determines whether the bit stored in the position of MSB is "1" or not. If it is "1", it calculates an exclusive-OR with the expected value and writes the result back to the EDCValue [0 to 31].

After that, the process repeats the above processing for A bytes, which is the burst transfer size m=6 in this embodiment (S22). When completing the processing on 108 bytes in the first column, the process determines whether the count value M of the column counter 61 is 8 or not (S23). If the count value M is not 8, it increments the count value (S24). If the count value is 8, which means being a sector boundary, the process resets the count value (S25) and sets the count value Sector of the sector counter 67 to be +2. If the determination in S23 results in No, it means that the process of 9 columns is not completed, and it is determined in Step S27 that the processing of one sector is not completed (No in S27). The process thus repeats the processing from Step S15. Specifically, the process reads the initial expected value that is the count value M of the column counter 61 plus 10 to the expected value generator 63, rotates the shift register each time obtaining 1-bit data and generates the expected value corresponding to the user data. If the user data is "1", the process reads the value of the corresponding sector in EDCValue [0 to 31], calculates an exclusive-OR and writes the result back.

On the other hand, if the determination in S23 results in Yes, it means that the process of 9 columns is completed (Yes in S27). If there is a subsequent even number sector, the processing is executed thereon (No in S28). If the processing on the final sector is completed, or when the count value of the sector counter 67 is 32, the process ends. The processing of the pass 1 in one data block is thereby completed.

Figure 18:
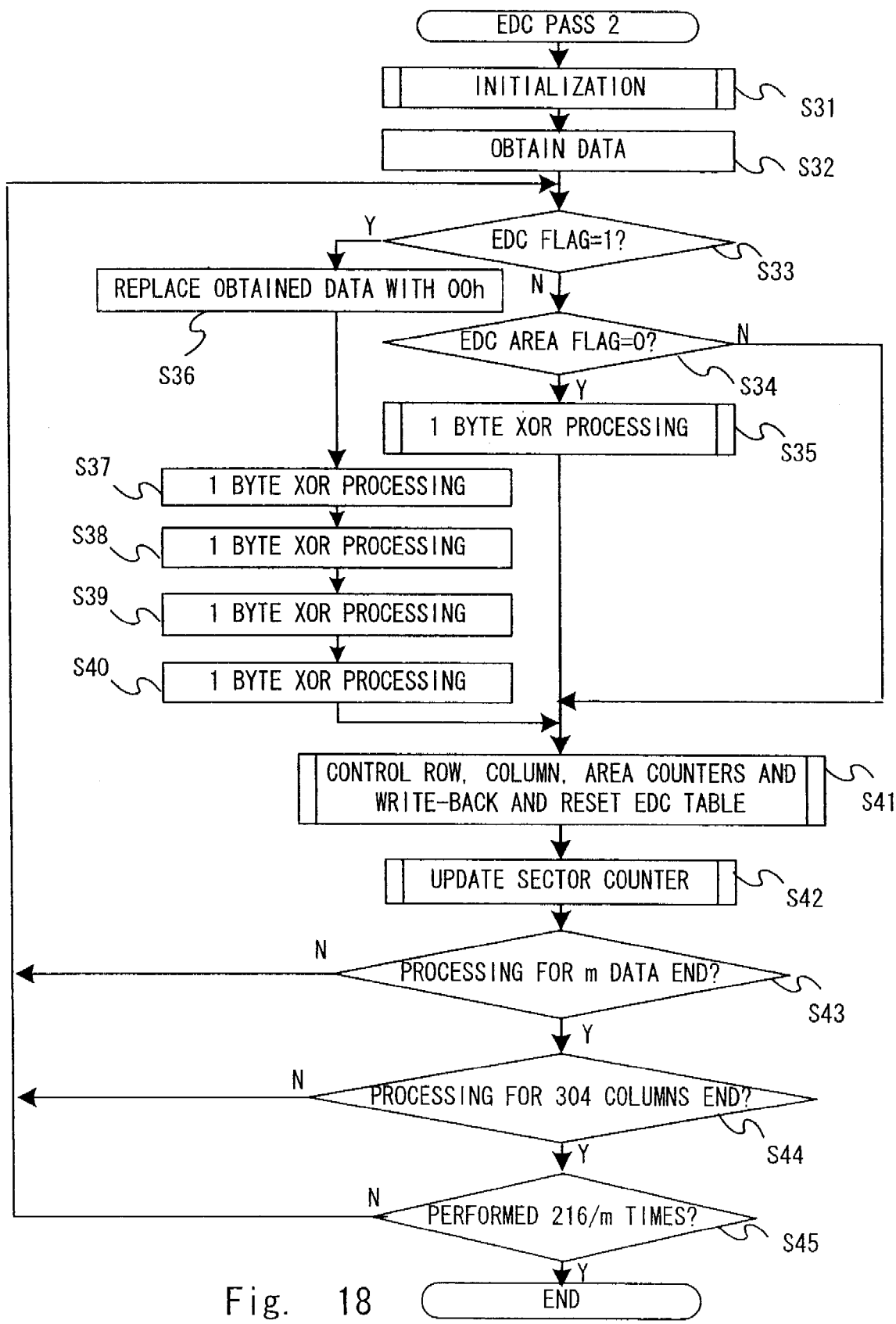
FIG. 18 is a flowchart showing an EDC generation process in the pass 2.
Figure 19:
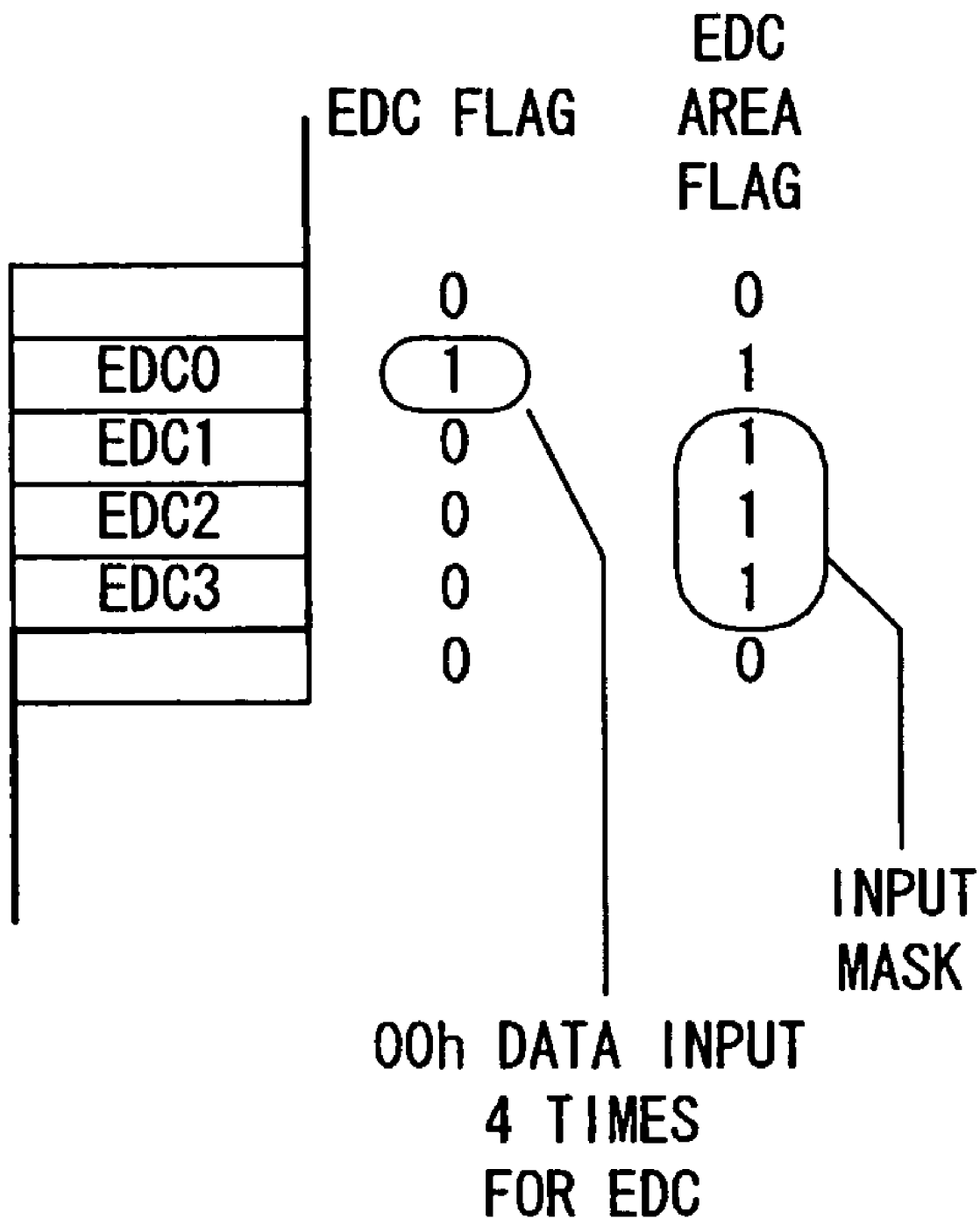
FIG. 19 is a view to describe an EDC flag and an EDC area flag.
Figure 24:
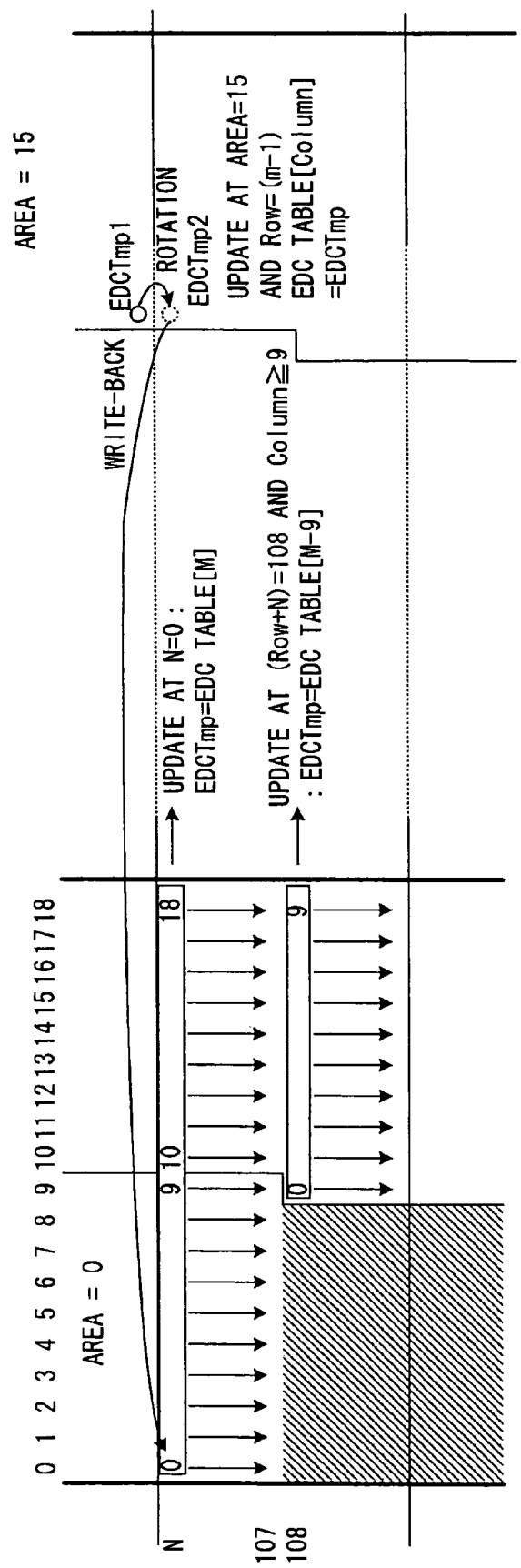
FIG. 24 is a view to describe a method of updating an EDC table.
Figure 25:
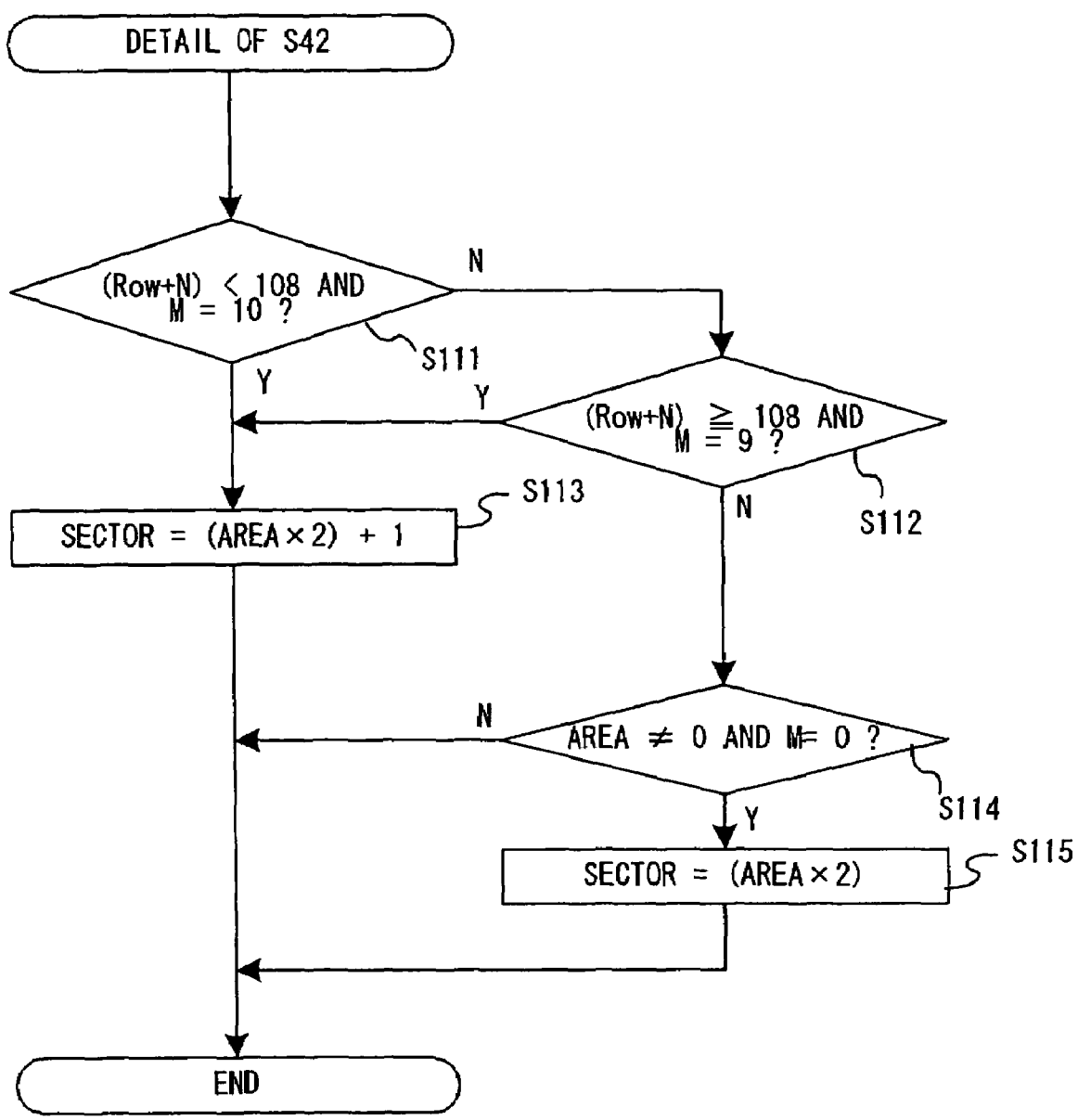
FIG. 25 is a flowchart showing a detail of Step S42 in FIG. 18.
Figure 26:
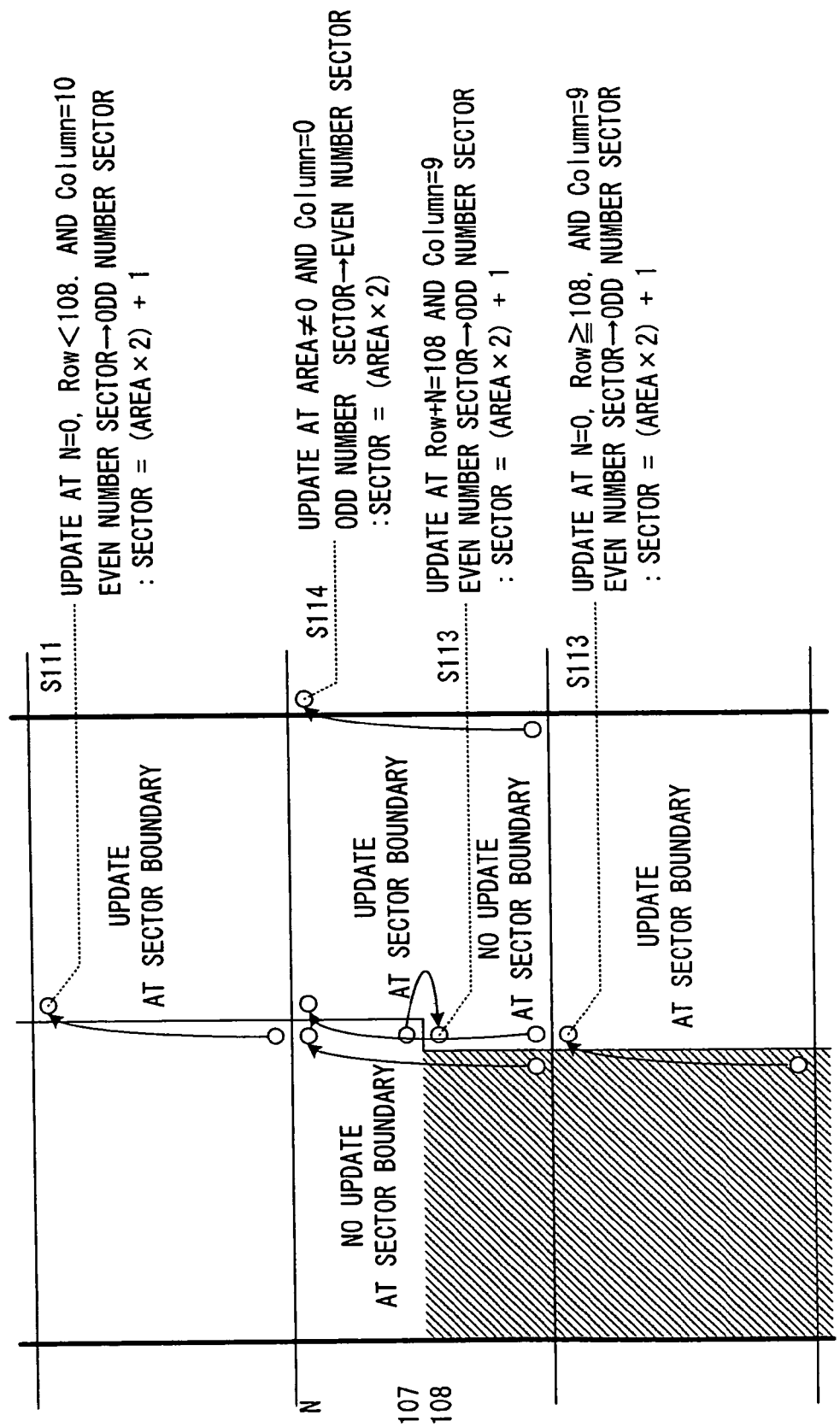
FIG. 26 is a view to describe a method of updating a sector counter.

The EDC generation processing in the pass 2 is described hereinafter in detail with reference to FIGS. 15, 16, and 18 to 26. FIG. 18 is a flowchart showing the EDC generation process in the pass 2. FIGS. 20, 21, 22, 23 and 25 are flowcharts showing the details of the processing in Steps S31, S35, S41, S42 of FIG. 18, respectively. FIG. 19 is a view to describe an EDC flag and an EDC area flag. FIG. 24 is a view to describe updating of the EDC table. FIG. 26 is a view to describe updating of the sector counter.

First, the process initializes the values of each counter, EDC table and so on (Step S31). Then, it obtains user data (S32). The data obtained in the pass 2 is the one that is burst-transferred from the channel CH2 of the data buffer 2.

After obtaining the data, the process determines whether it is the data at the head of EDC. Since 2048-byte user data is added with 4-byte 0 data, the data next to the 2048th byte data is detected as the head data of EDC. In the data block shown in FIG. 15, the data input corresponding to the position of the row Row=104 and the column M=9 is detected as the head of EDC in an even number sector, and the data input corresponding to the position of the row Row=212 and the column M=18 is detected as the head of EDC in an odd number sector. The detection may be made by checking whether the EDC flag indicating of the data is the head of EDC or not indicates 1 (S33).

If the EDC flag is "1", it is determined that the data is the head of EDC and the obtained data is replaced with 00h (S36). The input 8-bit data are thereby detected as "0" and the selector 74 selects 0000h for output. After performing 8-bit processing in the XOR circuit 75, the process repeats this for the number of bytes of EDC, which is a total 4 times (S37 to S40) and proceeds to Step S41. The process also proceeds to the next Step S41 when the EDC flag is not "1" and the EDC area flag is "1" (No in S34). If the input 8-bit data are all "0", the EDC generator 34 does not update the value of the EDC buffer 33. Therefore, in practice, the data stored in the EDC buffer 33 upon completion of EDC operation of user data of 2048th byte, is EDC. The EDC flag and the EDC area flag are detailed later.

On the other hand, if the EDC flag is "0" and the EDC area flag that indicates whether it is within the EDC area or not is "0", the process proceeds to Step S35. In Step S35, the process sequentially calculates exclusive-OR of the expected value where the user data is "1" and the operation result that is stored in the EDC buffer just like in the pass 1 on the user data (herein also as the target data) that are not processed in the pass 1. First, the process executes the operation of 8 bits (=1 byte) of the target data and then proceeds to Step S41 (S35).

In Step S41, the process updates each counter and the EDC table 32 (Step S41) and further updates the sector counter 77 according to need (S42). Then, it repeats the above processing for the number of m bytes of a burst transfer size, which is 6 bytes in this exemplary embodiment (S43). The processing of 6 bytes is performed in the user data direction Q. After performing the processing of the burst transfer size m, which is 6 bytes in this embodiment, the process then performs processing of 304 columns (S44). Specifically, it retrieves 6-byte data arranged in the user data direction Q 304 times in the sequence of the recording frame direction P and repeats this processing 216/m times, which is 36 times in this embodiment (S39), thereby completing the processing of one data block. If 216 is indivisible by the burst transfer size m, it is repeated for the number after rounding up decimals. For example, if m=16, 216/16=13.5 and the quotient is not an integer. In this case, Step S46 determines whether the number after rounding up decimals, which is 14 times, is performed. At this time, the EDC buffer 33 stores EDC of 32 sectors.

Figure 20:
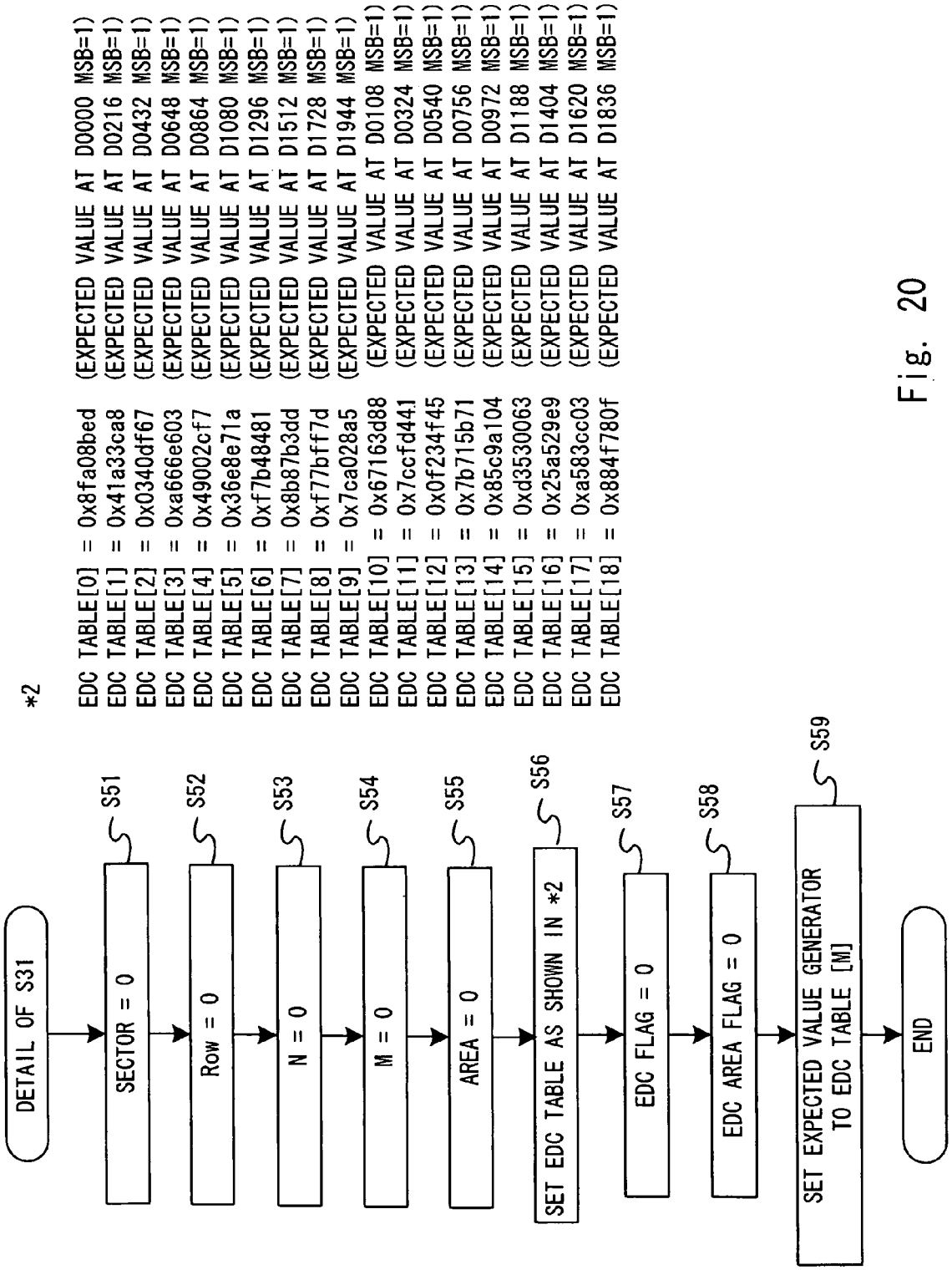
FIG. 20 is a flowchart showing a detail of Step S31 in FIG. 18.

The above processing is described in further detail below. The initialization processing in Step S31 resets the count values of the sector counter 77, base row counter (not shown), burst transfer row counter (not shown), column counter 71, and area counter (not shown) to "0" (S51 to S55) and reads the initial expected values that are expected values of the most significant bit at Row=0 into the EDC table 32 (S56) as shown in the flowchart of FIG. 20. Further, the process sets the EDC flag and the EDC area flag to "0".

As described above, the base row counter successively counts all rows in one data block, and the count values correspond to the row numbers Row=0 to 215. Further, the burst transfer row counter counts the row numbers N=0 to 5 of the data that are transferred in each burst transfer. The burst transfer row counter is used to count the burst transfer size, and the base row counter is used to count the rows of the entire data block. The area counter counts the areas, each area having a pair of an even number sector and an odd number sector. The sectors Sec 0 and Sec 1 form the area Area 0, and the final two sectors Sec 30 and Sec 31 form the area Area 15. Accordingly, the area counter counts from 0 to 15. These count values contribute to appropriate selection of initial expected values to be read and control of timings such as writing back expected values to the EDC table 32 and resetting.

The EDC flag and the EDC area flag are described hereinafter. When calculating EDC, a prescribed operation is performed on a code string of 2052 bytes, which contains 2048-byte data and 4-byte 0 data. Specifically, the EDC is obtained as 32-bit shift register value that is obtained by sequentially inputting the code string to the shift register 50 shown in FIG. 8. In the exemplary embodiment also, EDC is obtained by calculating exclusive-OR of expected values on 2052 bytes which contains 2048-byte user data and 4-byte 0 data.

The 4-byte 0 data is added to the data after 2048th byte in the user data direction Q. Thus, it is necessary to detect the 2049th byte that corresponds to EDC0 as the head data of EDC and perform processing on the four bytes of 2049 to 2052 bytes by replacing the obtained data with 00h. Therefore, the EDC generator 34 determines whether the data to be obtained next is the 2049th byte data in the user data direction Q each time retrieving data.

To this end, the exemplary embodiment sets an EDC flag that detects whether data is 2049th byte data. The EDC flag is thus a flag for detecting the data that serves as head data of EDC when EDC is added. In the following description, the data from the head data to 4th byte data, which serve as EDC, are referred to as EDC0 to EDC3. EDC0 to EDC3 are placed in the 2049th to 2052nd bytes in the data block.

The EDC flag indicates "1" only when input data is the data that is input in the 2049th place in the sequence of the user data direction Q in each sector. Since the calculation of EDC performs exclusive OR of expected values on each byte of 2052-byte code string containing 2048-byte data and 4-byte 0 data, the 4-byte part (EDC area) where EDC is to be placed is processed as 4-byte 0 data regardless of input. Therefore, in addition to detect the EDC head data by the EDC flag, the input of data within the EDC area from 2049th to 2052th bytes in the user data direction Q is detected by the EDC area flag. The EDC flag indicates "1" only when the column number is 9 and the row number is 104 in even number sectors and when the column number is 18 and the row number is 212 in odd number sectors. The EDC area flag indicates "1" only when the column number is 9 and the row numbers are 104 to 107 in even number sectors and when the column number is 18 and the row numbers are 212 to 215 in odd number sectors. Those flags are set based on the count values of the base row counter, burst transfer row counter, column counter and so on.

After that, the process reads the initial expected value of the corresponding column number (count value of column counter) M from the EDC table to the expected value generator 73 (S59). For example, when processing the first data in the pass 2, since user data of sector Sec 0 with the column number=0 and the row number=0 is input first, the value of EDCtable [0] is read.

The detail of Step S35 is described herein. In Step S35, if a sum of the count value Row of the base row counter and the row count value N is 108 or larger and the column number (column count value of the column counter 71) M is 0 to 8, which is when the user data that is processed in the pass 1 is input, the process proceeds to the next Step S41 (S61). The processing in the Step S62 and subsequent steps are carried out when user data is such that Row+N=0 to 107 or when Row+N=108 to 215 and 0≦column count valueM≦8.

Figure 21:
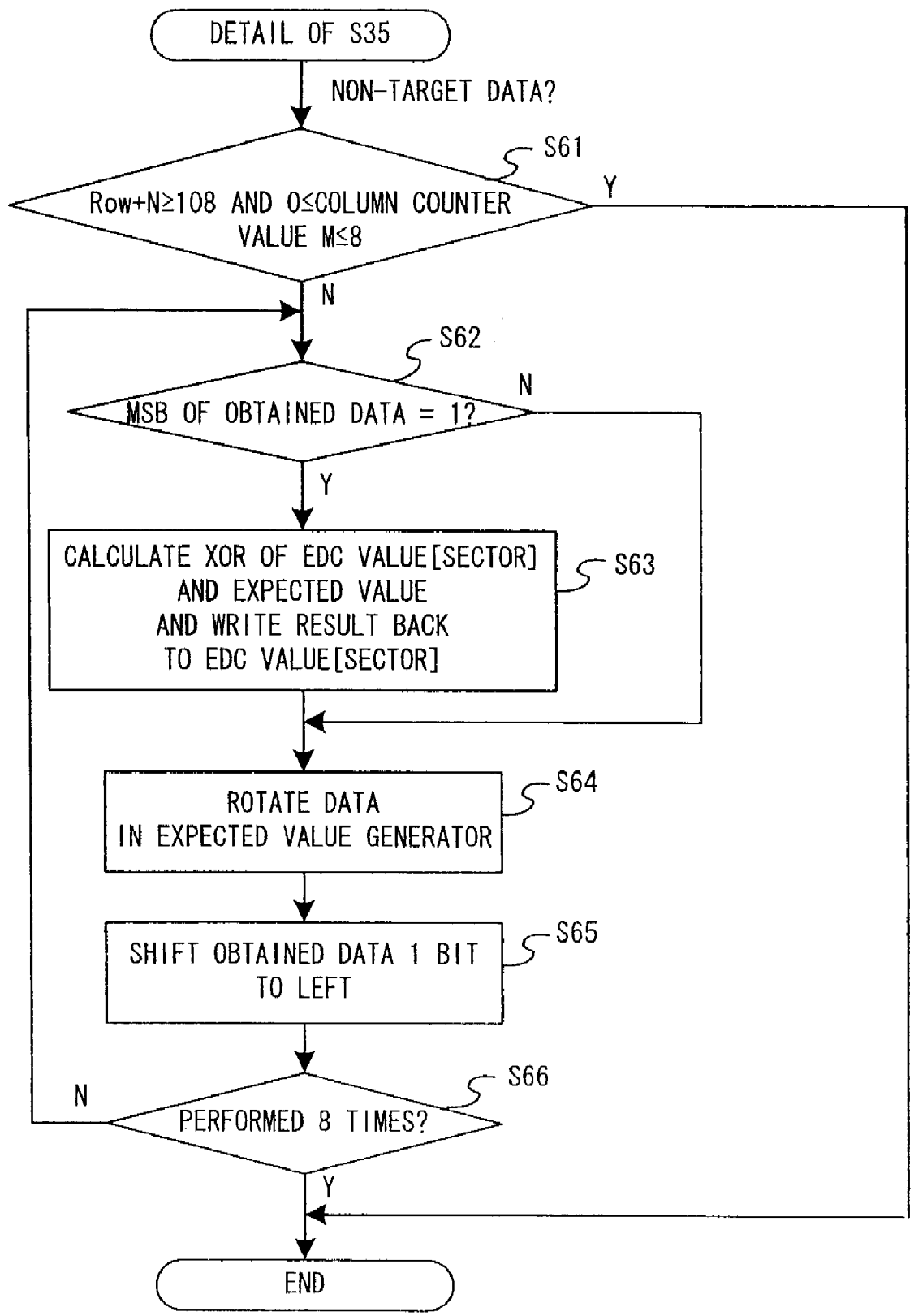
FIG. 21 is a flowchart showing a detail of Step S35 in FIG. 18.

Specifically, as shown in FIG. 21, the process determines whether the above execution conditions are satisfied or not (Step S61) and, if the conditions are satisfied, which means that the obtained data is target data, the process determines whether each bit of the obtained data is "1" or not (S62). If it is "1", the selector 78 reads EDCValue [Sector] and supplies it to the XOR circuit 75. Further, the selector 74 selectively outputs the expected value and supplies it to the XOR circuit 75. The XOR circuit 75 calculates the exclusive-OR of those values and outputs the result to the selector 78. The selector 78 writes the result back to the EDCValue [Sector] (S63). The process then rotates each data of the expected value generator 73 to generate expected values and obtains data one bit by one bit until the processing of 8 bits is completed (S63 to S66), thereby updating (correcting) the EDC intermediate value or the operation result that is stored in the EDC buffer 33. The process of Step S34 also stores 1 byte of the obtained data into a rotatable register or the like and executes the processing from Step S63 on the bit stored in the position of MSB to perform the processing of 8 bits one bit by one bit as described earlier.

Figure 22:
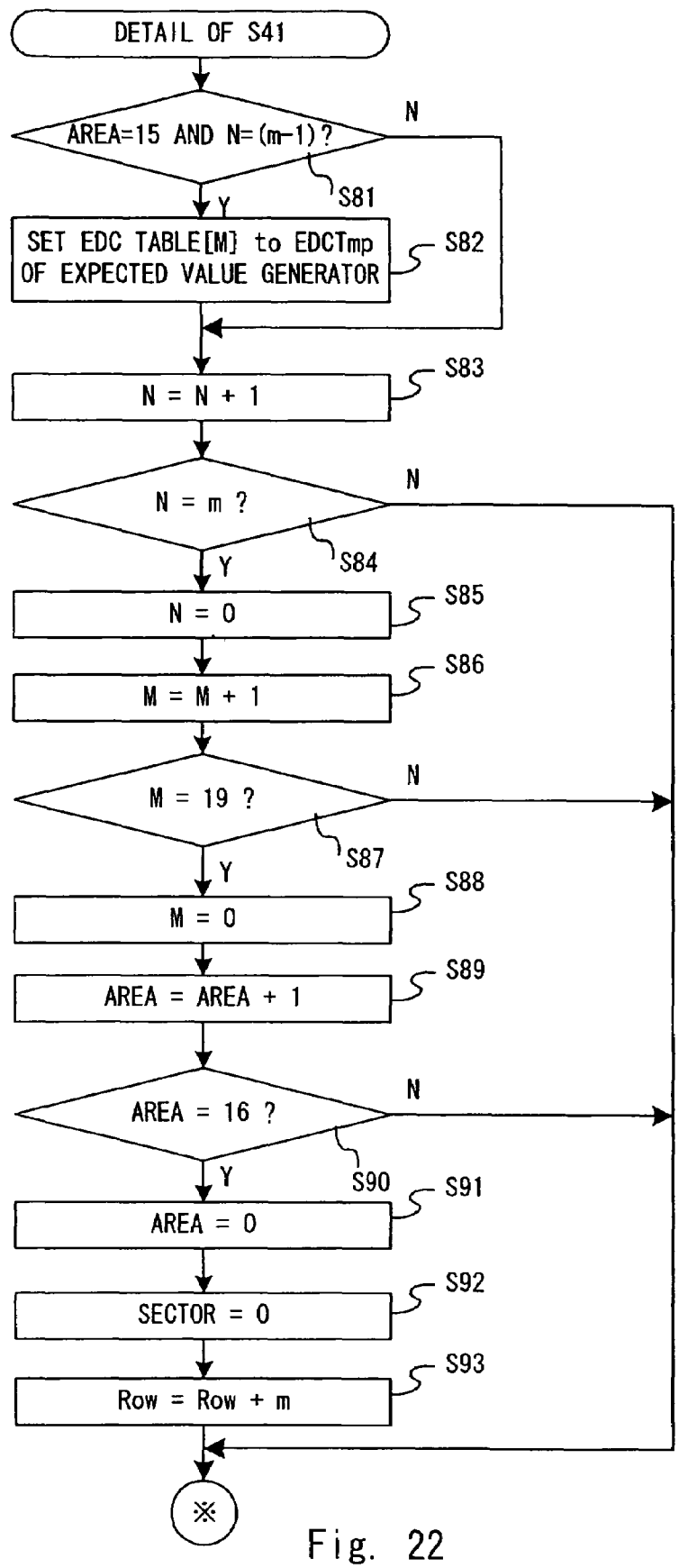
FIG. 22 is a flowchart showing a detail of Step S41 in FIG. 18.
Figure 23:
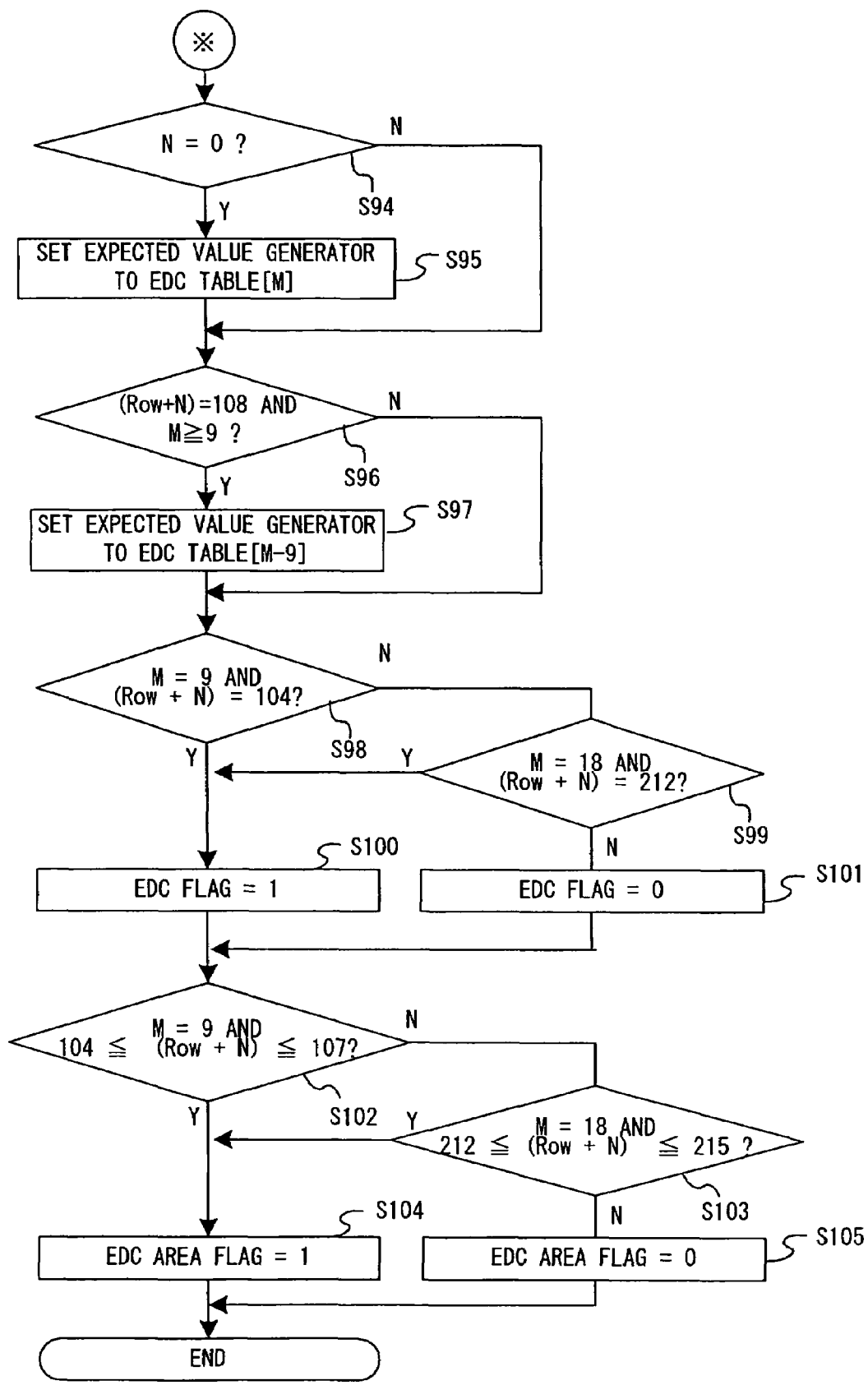
FIG. 23 is also a flowchart showing a detail of Step S41 in FIG. 18.

The detail of Step S41 is described in detail herein with reference to FIGS. 22 and 23. This step performs control of each counter and write-back and reset of the EDC table 32. As shown in FIG. 22, the process determines whether the current processing is performed on the final area Area 15 and the count value N of the burst transfer row counter for counting the row number in the burst transfer is m−1 or not (S81). Since m=6 in this exemplary embodiment, it is determined whether N=5 or not. In other words, the process determines whether the processing on the final byte in one column of the final area Area 15 is completed or not. In this example, if it is determined that the processing on the 6th byte in the final area Area 15 is completed, the process writes the current expected value (EDCTmp: cf. FIG. 24) to the region EDCtable [M] of the corresponding column in the EDC table 32.

In the processing from the head Area 0 to the final Area 15, the process reads an expected value from the EDC table 32 each time processing the column of each area. Specifically, in Area 0 to Area 15, the same EDC table value is used for the processing of the same transfer block. For example, in the first processing in the pass 2, the EDC table 32 holds initial expected values and the initial expected values are sequentially read in the final area Area 15 as well. On the other hand, after completing the operation on the final area Area 15, the processing on the next transfer block is started and the processing from the first area Area 0 is executed again. In the processing of the next transfer block, not the initial expected values but 19 expected values that correspond to the most significant bits of the first row in the transfer block are required. Thus, when processing the final area Area 15 in the previous transfer block, it is necessary to rotate the expected value of the least significant bit in the final row in the previous transfer block to create the expected value that correspond to MSB of the head byte in the head area and writes the expected value back to the EDC table 32 for use in the expected value generation in the next transfer block.

As described above, since the processing on the final area Area 15 uses the same value of the EDC table 32 as that used on the head area Area 0, it is unable to overwrite the EDC table in the corresponding column until the processing on the columns of the final area Area 15 is completed. Thus, the process first determines whether the current processing is performed on the final area Area 15 or not (S81). If it is not the final area Area 15, the process proceeds to Step S83. If it is the final byte of the final area Area 15, the value held in the expected value generator 73 is the value (EDCTmp2 in FIG. 24) that is obtained by rotating the expected value (EDCTmp1 in FIG. 24) that corresponds to LSB of 6th byte in the final row of the transfer block in Step S64 described above. Thus, it is the expected value that corresponds to MSB of the head byte of the burst transfer in the head area. This value is written back to the EDC table 32.

The process then increments the count value N of the burst transfer row counter (S83). Further, the process determines whether the row count value N equals m, which is m=6 in this exemplary embodiment, or not (S84). If m=6, it resets the row count value (S85). The process then increments the column count value M (S86) and determines whether the column count value M is 19 or not, which is whether the head row of the area is reached as a result of the increment (S87). If the column count value M is 19, the column count value M is reset and the area count value Area of the area counter is incremented (S89). Then, the process determines whether the current area is Area 16=Area0 (cf. FIG. 6) which is the head area of the transfer block (S90). If the area count value Area is 16, the process resets this value (S91) and further resets the sector counter (S82). The process then adds m to the count value of the base row counter (S93).

After writing back the expected value to the EDC table 32 and resetting the counters and so on, the expected value generator reads the value from the EDC table 32. First, the process determines whether the burst row count value N=0 (S95). If N=0, it reads out the value that corresponds to the current column count value M from the EDC table 32 and sets the value to the expected value generator (S95). Further, it determines whether Row+burst transfer row count value N=108 and M≧9 (S96). In the boundary of the row number Row=108, the head byte of the even number sector is included as shown in FIG. 5. Since the row Row=108 is a boundary between the odd number sector and the even number sector, it is necessary to reset the expected value that is written back and used in S82 once to the initial expected value. Therefore, if the boundary with the row count value=108 is detected, the process sets the EDC table 32 to the initial expected value as shown in *2 and read the value EDCtable [M-9] of the column count value (M-9) (S97).

The process then sets the EDC flag and the EDC area flag by the subsequent Steps S98 to S105. First, in Step S98, it determines whether the user data to be obtained next is arranged at the head position of EDC in the even number sector. Since the byte of 105th row in the 10th column is EDC head data EDC0 in the even number sector, it is determined whether the conditions that the column count value M=9 and Row+N=104 are satisfied (S98). If the data is determined to be EDC head data, the process sets EDC flag=1 (S100). If it is not EDC head data in the even number sector, the process then determines whether it is head data in the odd number sector. Since the byte of 213rd row in the 19th column is EDC head data in the odd number sector, it is determined whether the conditions that the column count value M=18 and Row+N=212 are satisfied (S99). If the user data is determined to be EDC head data, the process proceeds to Step S100 to set EDC flag=1. If, on the other hand, the data is not EDC head data of the even number sector nor the odd number sector, the process sets EDC flag=0 (S101).

Then, as described in the above Steps S37 to S40, for EDC head data of 2049th byte to 2052nd byte, operation is performed on the byte data replaced with 00h. Thus, the EDC generator 34 does not perform normal operation but executes the processing of Steps S37 to S40 on the data in the EDC area after detecting EDC head data in the 2049th byte until reaching 2052nd byte. It is thus necessary to mask those user data during input of the user data in the EDC area after detecting the EDC area.

In order to determine whether input data is the data of 2049th to 2052nd byte in the even number sector, i.e. the data in the EDC area, the process determines whether the conditions that the column number M=9 and Row+M=104 to 107 are satisfied (S102). If the conditions are not satisfied, the process further determines whether the input data is the data of 2049th to 2052nd byte in the odd number sector, i.e. the data in the EDC area by determining whether the conditions that the column number M=18 and Row+M=212 to 215 are satisfied (S103). If the input data is determined to be the data within the EDC area in Step S102 or S103, the process sets EDC area flag=1 (S104). If it is determined not to be the data within the EDC area, the process sets EDC area flag=0 (S105). After that, the process proceeds to Step S42.

If the burst transfer size m is 2, for example, the data transfer up to 106th byte is completed by the 52nd burst transfer, and the data transfer up to 108th byte is completed by the next (53rd) burst transfer. In this case, it is necessary to transfer EDC in two times of burst transfer. Thus, the operation on the 2049th byte or 2050th byte needs to be completed in the 52nd burst transfer. In other words, the operation on the 4-byte EDC needs to be completed when inputting EDC head byte or EDC1. In the above case, the expected value operation on the user data in the rows Row=106 and 107 should be completed when processing the 2049th byte data in the even number sector. Accordingly, in such a case, the EDC intermediate value is determined from the user data in the rows Row=106 and 215 of the even number sector in the pass 1.

When EDC is placed in two successive transfer blocks, the process calculates all 4-byte EDC before the final EDC operation in the first transfer block. In this case, it is necessary to complete the expected value operation on the user data of 2048 bytes before the operation timing of the first EDC0, and the process adjusts the user data for which the EDC intermediate value is calculated in the pass 1 according to the burst transfer size.

The processing of Step S42 is described herein. The process of this step determines the sector boundary and updates the sector counter. FIG. 25 is a flowchart showing a detail of the process of Step S42, and FIG. 26 is a view to describe the processing of Step S42. As shown in FIG. 25, the process first determines whether the condition of the row count value Row+N<108 is satisfied or not (S111). Specifically, the process determines whether the conditions of the row count value Row+N<108 and the column count value M=10 are satisfied or not to determine whether the next user data to be transferred is the user data in the odd number sector or not (cf. Step S111 and FIG. 26). Even if the conditions of Row+N<108 and M=10 are not satisfied, the user data to be transferred next is the data of the odd number sector if Row+N≧108 and M=9. Thus, if the conditions of Row+N<108 and M=10 or the conditions of Row+N≧108 and M=9 are satisfied, the process sets the sector count value to the area count value Area*2+1 of the area counter (cf. S113 and FIG. 26).

On the other hand, if the area count value Area is not 0 and the column count value M is 0, (cf. S114 and FIG. 26), it is determined that the user data to be transferred next is the data in the even number sector, and the process sets the sector count value to the area count value Area*2 (S115). In other cases, the sector counter is not updated and the process proceeds to the next Step S43.

As a result of the above processing, the EDC intermediate value that is calculated from the user data of the latter part of the even number sector in the pass 1 is corrected based on the remaining user data in the pass 2, and EDC is calculated based on those values and all user data in the odd number sector. By performing part or all of EDC operation in the pass 2, the access to the data buffer in the pass 1 can be reduced to about ¼. In the pass 1, the operation is performed only on the user data that cannot be input before adding EDC when transferring user data (the latter half of the even number sector) in the pass 2 sequentially in the different order from the user data direction Q, thereby reducing access to the data buffer 2 in the pass 1.

Figure 27:
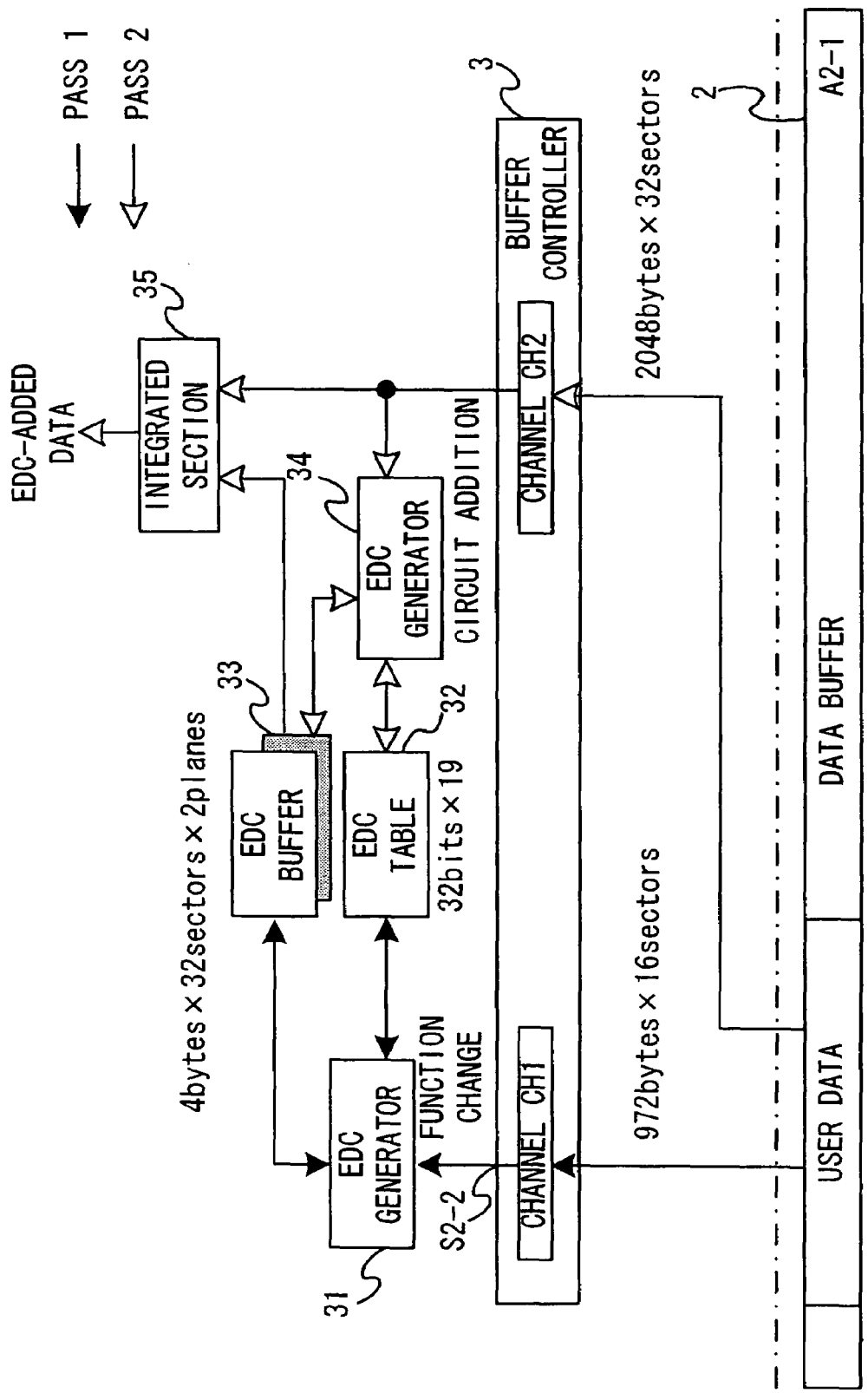
FIG. 27 is a view to describe advantages in an embodiment of the invention.

FIG. 27 is a view to describe the advantages of this embodiment. The method illustrated in FIG. 3 calculates EDC in the pass 1 and then outputs EDC-added data by using the calculated EDC in the pass 2. In this method, the user data that are read from the data buffer by the channel CH1 is one data block containing 2048 bytes times 32 sectors. On the other hand, this exemplary embodiment performs processing of the user data only in the rows after Row 108 in the even number sector in the pass 1. Thus, the user data that are read from the data buffer can be reduced to 972 bytes times 16 sectors.

As shown in FIG. 27, the recording apparatus 1 of this embodiment adds the EDC generator 34 and the EDC table 32 to the recording apparatus shown in FIG. 3. However, since the EDC generator 31 and the EDC generator 34, in combination, perform processing of one data block to calculate EDC, additional power consumption is only those used for the EDC table 32. The EDC table 32 performs data processing of one data block, and the power consumption increases by 2048*32 bytes (65536 bytes) in the EDC operation. However, a data transfer amount in the pass 1 is about one-fourth of the amount when processing one whole data block as shown in FIG. 3. Therefore, the power consumption is reduced by 99968 bytes ((2048*32−972*16)*2) with regard to the data buffer and the buffer controller 3. The power consumption is reduced as a result in this embodiment. The effect of reduction in power consumption becomes significant as the operation clock of the data buffer and the buffer controller is higher.

As described above, due to reduction in the data buffer access, which can be a bottleneck for encoding, the embodiment has advantages of achieving high-speed encoding and reducing power consumption. The amount of data that can access the data buffer for a given length of time is fixed, and the time reduces as a speed increases. Thus, the data buffer access is a bottleneck for high-speed encoding. Reducing an absolute amount of data access enables higher-speed encoding and reduction in power consumption by the amount of data access. Further, reduction in absolute amount of access allows the use of an inexpensive buffer that operates with a slower clock while still achieving high-speed encoding. In addition, it is possible to reduce the operation clock frequency for the data buffer and the buffer controller used for enabling high-speed encoding, thereby allowing reduction in power consumption in spite of additional power consumed in an additional circuit.

Exemplary operation for outputting recording data from the EDC-added data that is generated in the above-described way is described herein. The processing that calculates EDC from the EDC intermediate value and outputs recording data is executed by each circuit as the processing of the pass 2. Referring back to FIG. 4, the user data that are burst-transferred from the channel CH2 are supplied to the integration section 35 in addition to the EDC generator 34.

The data buffer 2 is configured by a memory that requires refreshing and is capable of random access and burst transfer, such as SDRAM. The following description describes the case of using SDRAM. SDRAM is DRAM that is capable of higher speed access than random access when accessing successive addresses, and the use of burst transfer function enables high-speed data transfer. It is thereby possible to reduce costs compared with a memory capable of high-speed random access such as SRAM.

The channel CH2 of the buffer controller 3 repeatedly reads the user data of one burst-transfer size (m bytes) from the data buffer 2 in the user data direction Q and sequentially transfers the data so that EDC-added data are arranged in the recording frame direction P. Therefore, 216-byte data in the user data direction Q are burst-transferred, one burst transfer size (m bytes) each, repeatedly 304 times, which is the number of bytes in the recording frame direction P (304 bytes, 304 interleaving). As a result, the user data (data block 41) contained in 1 RUB in the recording frame direction P are arranged m bytes in the user data direction Q. The m-byte data in the user data direction Q are then scrambled and stored in the substitution buffer 38, which may be SRAM capable of high-speed random access, thereby outputting recording data in the recording frame direction P.

The channel CH2 or the integration section 35 have functions of designating a head address in the burst transfer or controlling the timing for reading EDC from the EDC buffer 33.

The scrambler 36 calculates the exclusive-OR of the user data and the scramble value corresponding to the sequence of the user data direction Q as scrambled data. Thus, when scrambling data, scrambled data $DS_i$ can be obtained by mod 2 addition (exclusive-OR) of 8-bit input data $D_i$ and 8-bit scramble data (scramble value) $S_i$ that is generated by the scrambler as represented in the following expression:

$$DS_i = S_i + D_i$$

where the symbol "+" represents exclusive-OR.

The scrambler in a Blu-ray disc sets an initial value to the 16-bit shift register for performing prescribed operation and generates a scramble value in the user data direction Q each time shifting the value. Therefore, if data is input 6 bytes each in the recording frame direction P as in this embodiment, it is necessary to shift data 210 times after obtaining 6-byte scramble value in order to obtain a scramble value that corresponds to the next column, which takes time. To address this concern, the recording apparatus of this embodiment has the scramble value generator 37 that is capable of calculating a scramble value from the user data input in this order. The scramble value generator 37 supplies a scramble value corresponding to input data to the scrambler 36.

The substitution buffer 38 is configured by a memory that does not require refreshing and is capable of random access, such as SRAM. Though the following example uses SRAM, the substitution buffer 38 is not limited to SRAM as long as it is capable of high-speed random access. The substitution buffer 38 is placed to substitute the scrambled data with the data in the recording frame direction P, and it is capable of transferring the scrambled data in the recording frame direction P at high speed. The substitution buffer 38 has two or more regions that can store data having a size of the above transfer block or larger, and it outputs recording data from one transfer block while writing a transfer block to the other region. The size of the substitution buffer 38 may be significantly smaller than the size of the data buffer 2, thereby allowing cost reduction while achieving high-speed transfer compared with the case of using SRAM as the DATA buffer 2.

The operation in the pass 2 is described in detail herein. The user data that is transferred to the substitution buffer 38 is detailed first. In a Blu-ray disc, the data in the user data direction Q is 216 bytes in one column. This exemplary embodiment performs burst-transfers of 6 bytes each, which is 216 bytes divided into 36 parts (burst transfer size m=6 bytes).

SDRAM is DRAM that is capable of burst transfer at high speed in synchronization with clock. For example, the burst transfer of 32 bytes is made possible if a memory cell of SDRAM is composed of four blocks (banks) that can operate separately from each other and with use of 8 times of successive burst transfer. SDRAM is capable of high-speed data transfer by burst transfer of prescribed data if a first address to be transferred is specified.

The data in the recording frame direction P is the data of every 216 bytes when viewed in the user data direction Q. Since, in Blu-ray standards, one sector contains 2048 bytes of user data and 4 bytes of EDC, and the data transferred from the data buffer 2 are the data that are not yet added with EDC, one sector having 2048 bytes, for example. Thus, the first column byte in an odd number sector, which is referred to herein as the odd number sector head column, that is adjacent to an even number sector is the data of every 212 bytes, not every 216 bytes. The odd number sector head column is 9th or 10th column in the sequence of the recording frame P in the sector Sec 1, and it is 10th column in the rows Row=0 to 107 and 9th column in the rows Row 108 to 215 in the user data direction Q. Thus, when reading the data corresponding to the odd number sector head column in the recording frame direction P, the data are not every 216 bytes but every 212 bytes. Since a head address of the data buffer 2 in the burst transfer is every 216 bytes in the part other than a sector boundary and 212 bytes in the sector boundary, the buffer controller 3 detects the sector boundary by using the row counter, the column counter that counts the column number in the area and so on and calculates and designates the first address (head address) of the burst transfer in the data buffer 2 based on the burst transfer size m. Specifically, the process sets+212 when detecting the sector boundary while it adds 216 to the head address sequentially in other cases, thereby designating the head address appropriately.

In a Blu-ray disc, EDC that is added next to the final data in the even number sector is placed at the middle of one data string when the data is arranged in the user data direction Q in the rows Row=104 to 107. Thus, when transferring user data including this address, the integration section 35 reads the EDC from the EDC buffer 33, adds it to the user data, and outputs the EDC-added data to the scrambler 36.

Since the burst-transferred 6-byte data is in the data direction Q, the scramble value generator 37 can generate a scramble value by using normal scrambler. After processing the transfer data of one burst, the user data of a next column is burst-transferred. Therefore, with the use of a normal scrambler, it is necessary to wait for 210 clocks at maximum to obtain a scramble value. On the other hand, the data of a Blu-ray disc is every 216 or 108 bytes in the recording frame direction as shown in FIG. 2. Thus, in addition to a normal scrambler that shifts data by 1 byte in the user data direction Q in one-time shift operation, a shift register that can obtain a value that is shifted 216 or 108 times in one-time shift operation is placed, so that the shift registers are switched in each burst transfer. It is thereby possible to supply the scramble value that corresponds to the user data of the user data direction Q that is transferred from the channel CH2 to the scrambler 36.

The substitution buffer 38 has two or more recording regions, each having a size of the burst transfer size m times one recording frame (304 bytes). As described earlier, in order to execute processing on the user data (data block) corresponding to 1 RUB in the pass S2, it reads the transfer block that is written in one recording region while writing a transfer block to the other recording region. The recording region may have two planes or more.

Consequently, in the processing of outputting user data as recording data, the recording apparatus 1 does not need to add EDC to user data and scramble the EDC-added data in the user data direction Q, write the scrambled data back to the data buffer, and then read the data again in the recording frame direction P. This enables high-speed transfer of recording data without using an expensive memory capable of high-speed random access, such as SRAM, for the data buffer 2. Further, since access to the data buffer 2 that occurs in the path 1 is reduced as described above, it is possible to provide an optical recording disc encoding device or recording apparatus that achieves high-speed encoding and reduction in power consumption.

Second Embodiment

Figure 28:
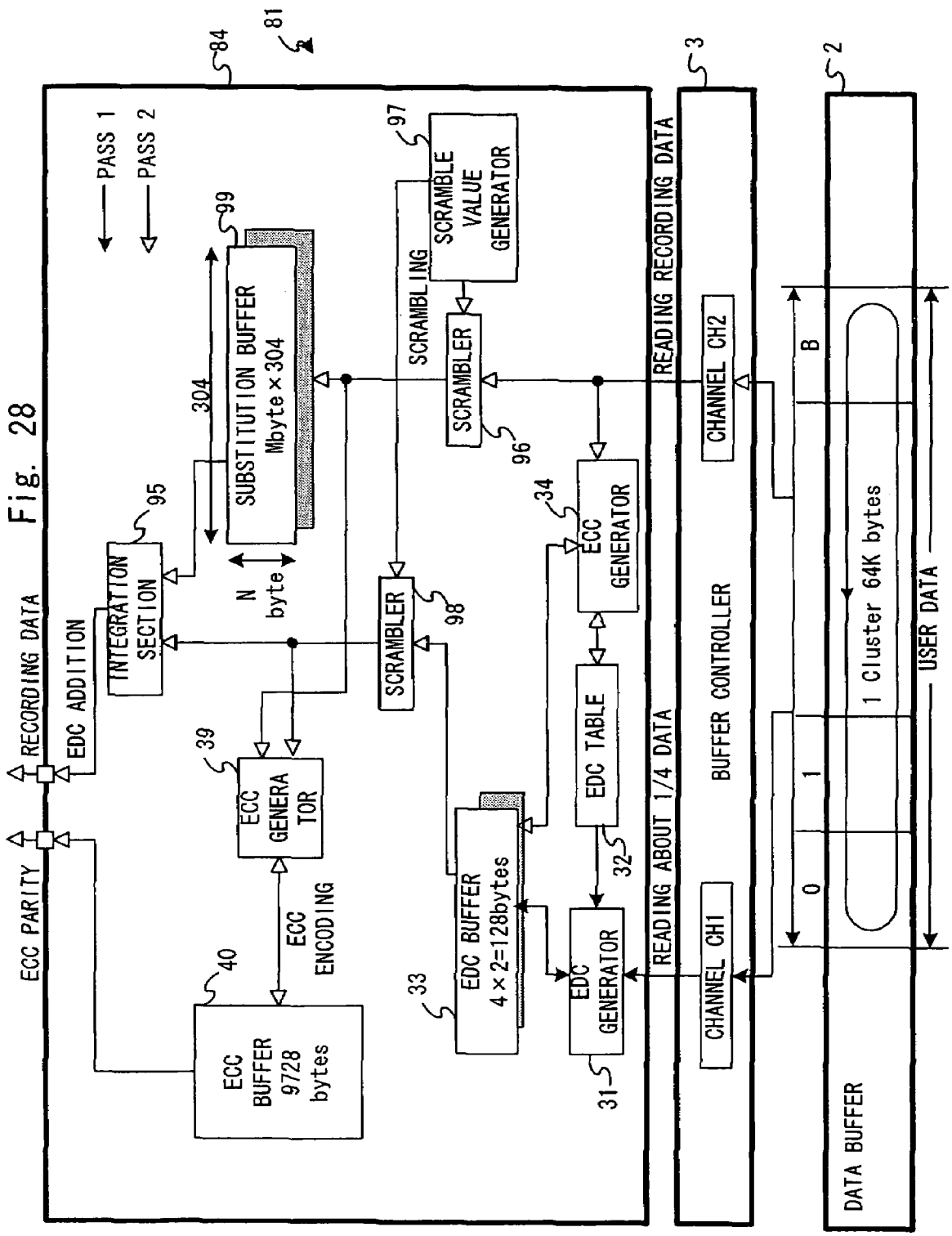
FIG. 28 is a schematic diagram showing a disc encoding device according to a second exemplary embodiment of the invention.
Figure 29:
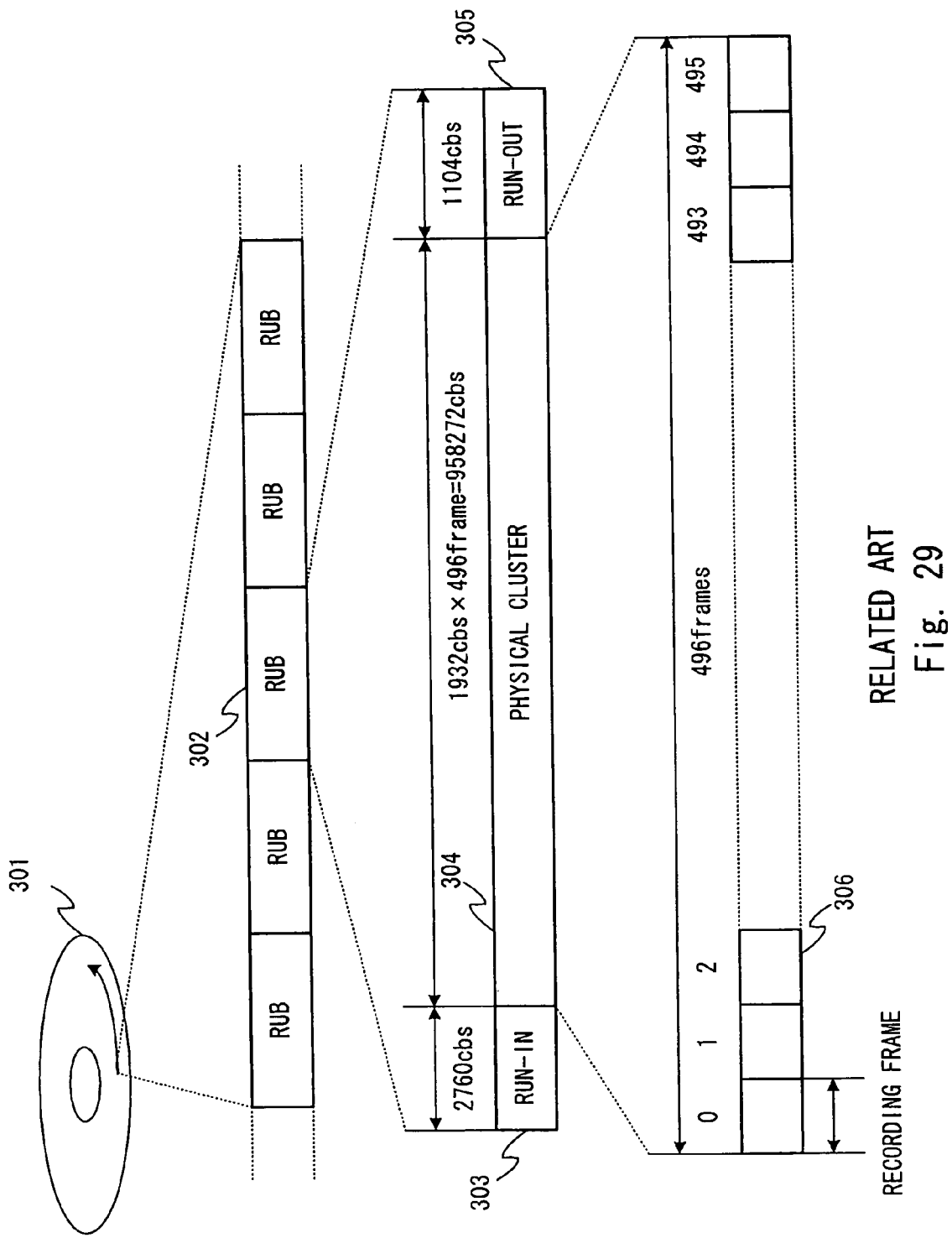
FIG. 29 is a view to describe a data structure of a Blu-ray disc.
Figure 30:
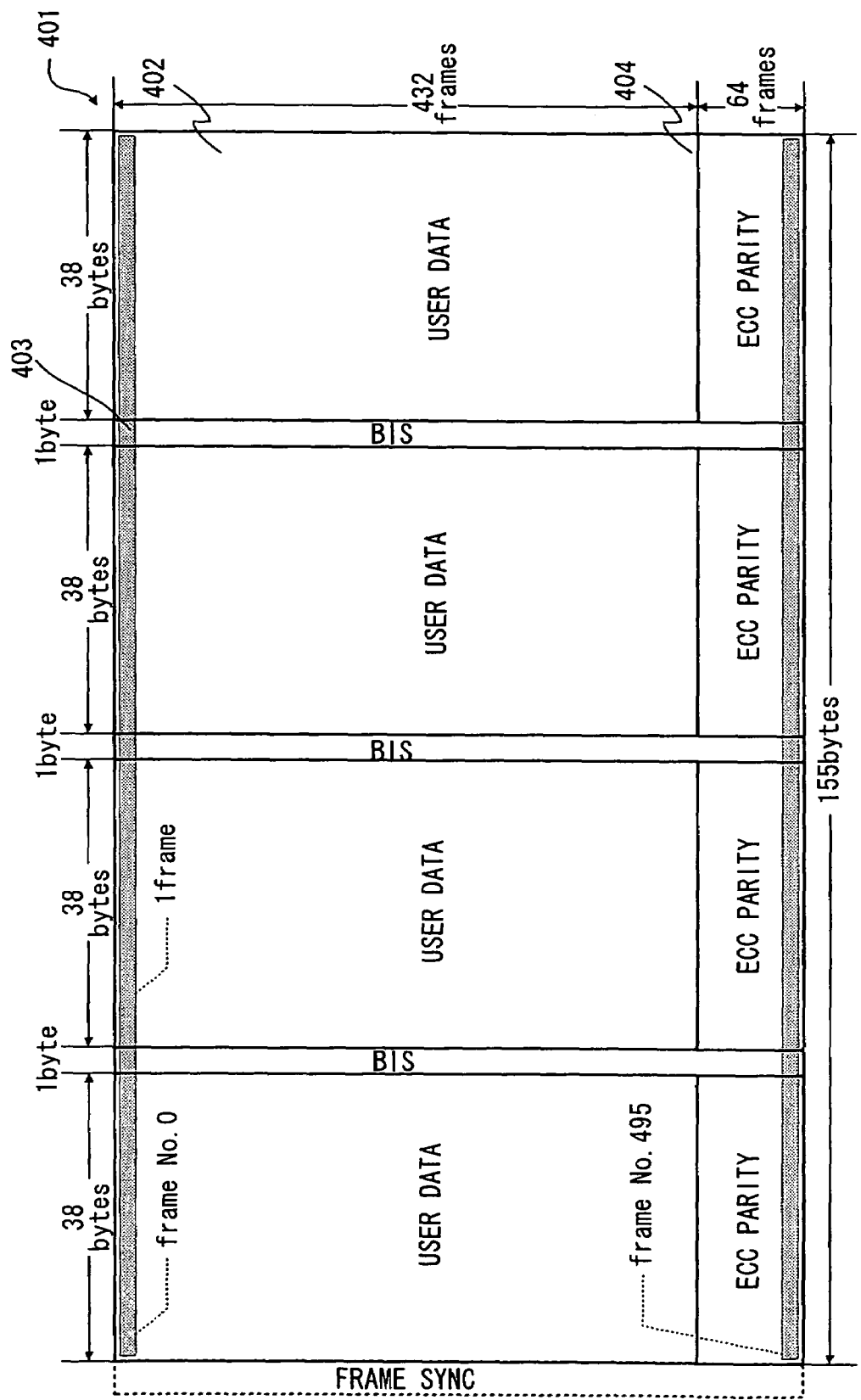
FIG. 30 is a schematic diagram showing a format of an ECC cluster.
Figure 31:
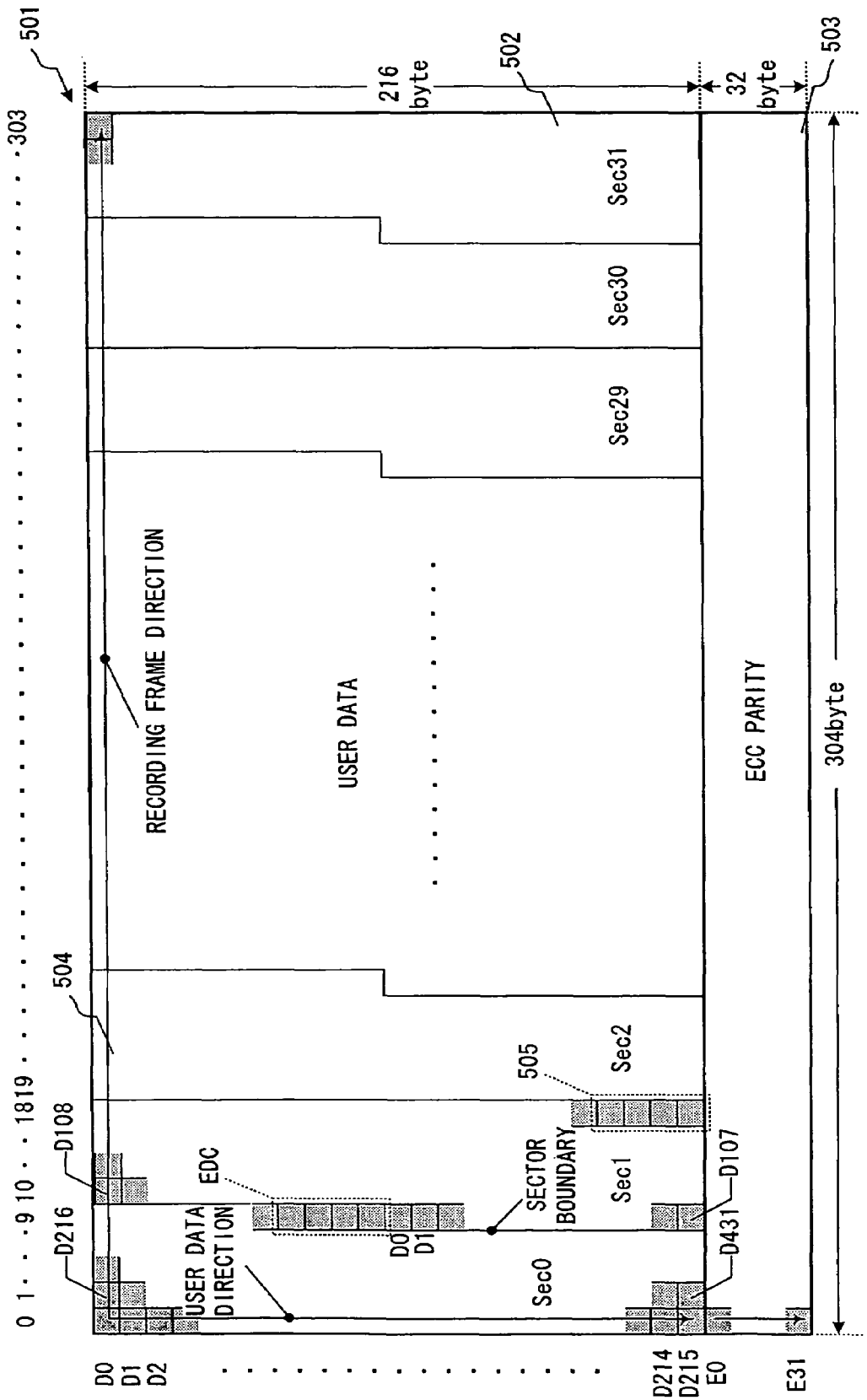
FIG. 31 is a schematic diagram showing an LDC block.

A second exemplary embodiment of the present invention is described herein. FIG. 28 is a view showing a recording apparatus according to the second embodiment. In the second embodiment shown in FIG. 28, the same elements as in the first embodiment shown in FIG. 4 are denoted by the same reference symbols and not described in detail herein. The recording apparatus 81 of this embodiment has an encoder 84 instead of the encoder 4 shown in FIG. 4. Just like the encoder 4 of FIG. 4, the encoder 84 performs EDC operation on a part of an even number sector in the pass 1 and then calculates EDC in the pass 2. Though the scramble processor in the encoder 4 according to the first embodiment performs scrambling after adding EDC to user data, the scramble processor in the encoder 84 according to this embodiment scrambles user data and EDC separately and then adds the scrambled EDC to the scrambled user data.

Thus, in the pass 2, the user data from the channel CH2 is supplied to the EDC generator 34 and also to the scrambler 96. The scrambler 96 receives a scramble value corresponding to the input user data from the scramble value generator 97, scrambles the data, and supplies the scrambled user data to the substitution buffer 99. The scrambled user data is also supplied to the ECC generator 39.

The EDC generated in the EDC generator 34 is supplied to a scrambler 98, which is added in this embodiment. The scrambler 98 performs scrambling on EDC. The scrambler 98 receives the scramble value corresponding to EDC from the scramble value generator 97, scrambles the EDC and then supplies the scrambled EDC to the integration section 95 and the ECC generator 39.

The substitution buffer 99 supplies the received scrambled user data to the integration section 95. The integration section 95 receives the scrambled user data from the substitution buffer 99 and the scrambled EDC from the scrambler 98, integrates these data and outputs them as recording data, which is different from the integration section 35 in the encoder 4 shown in FIG. 4.

The ECC generator 39 receives the scrambled user data from the substitution buffer 99 and also receives the scrambled EDC from the scrambler 98 at an appropriate timing of adding EDC, thereby generating ECC of 32 sectors. The generated ECC is output through the ECC buffer 40.

Just like the encoder 4 according to the first embodiment described above, the encoder 84 of this embodiment receives user data of a latter part of an even number sector and generates an EDC intermediate value in the pass 1 and then generates EDC in the pass 2 by using the EDC intermediate value for the even number sector while directly calculating EDC from the user data and expected value for the odd number sector. The user data read from the data buffer 3 is thereby reduced to about ¼ compared with the above reference, thus having the same advantage as the first embodiment, reduction in access to the data buffer.

Though the encoder 4 scrambles EDC-added data, the scrambler 84 scrambles data before adding EDC and then adds scrambled EDC to the scrambled user data. This allows a timing of calculating and adding EDC to be flexible.

The present invention is not restricted to the above-described embodiments but may be changed in various ways without departing from the scope of the present invention. For example, though the above embodiment describes a hardware configuration, the present invention is not limited thereto, and a given processing may be implemented by executing computer program on a central processing unit (CPU). In this case, the computer program may be provided by being recorded on a recording medium or by being transmitted through internet or other transmission media.

Further, as described in the second embodiment above, the timing of adding EDC may be before or after scrambling. In addition, an order or timing for supplying data to circuits for EDC addition, such as an integration section, scrambler, scramble value generator and substitution buffer is not restricted to those described above but may be altered in various way.

It is apparent that the present invention is not limited to the above embodiment that may be modified and changed without departing from the scope and spirit of the invention.

What is claimed is:

1. An error detecting code calculation circuit that calculates an error detecting code for detecting an error in a user data code string having a first sequence, the circuit processing data in units of data groups including two or more sectors containing the user data code string, each data group including an operation target sector having a structure that the error detecting code is appeared in an end of the user data code string when read in the first sequence and the error detecting code is appeared in a middle of the user data code string when read in a different sequence from the first sequence, the error detecting code calculation circuit comprising:

a first operation section for calculating an error detecting code intermediate value from a part of user data in the operation target sector; and a second operation section for calculating an error detecting code from a remaining part of user data in the operation target sector and the error detecting code intermediate value, wherein the second operation section calculates the error detecting code to be added to the user data code string contained in the operation target sector that is read in the different sequence from the first sequence.

2. The error detecting code calculation circuit according to claim 1, wherein the second operation section calculates the error detecting code by updating the error detecting code intermediate value based on the remaining part of user data that is input in the different sequence from the first sequence.

3. The error detecting code calculation circuit according to claim 1, wherein
the remaining part of user data in the operation target sector includes user data ranging from head data to data immediately before the error detecting code added of the user data code string contained in the operation target sector when reading the data group in the different sequence from the first sequence.

4. The error detecting code calculation circuit according to claim 3, wherein
the part of user data in the operation target sector includes user data after the error detecting code added of the user data code string contained in the operation target sector when reading the data group in the different sequence from the first sequence.

5. The error detecting code calculation circuit according to claim 1, wherein
each data group includes a block having K rows by L columns (K and L are integers),
the block contains user data included in a minimum recording unit for recording data on a disc,
the first sequence is a user data coding sequence corresponding to a column direction of the block, and
a row direction of the block corresponds to a recording sequence of the user data.

6. The error detecting code calculation circuit according to claim 5, wherein
the data group includes the operation target sector where the error detecting code is inserted at a middle of one code string in the block.

7. The error detecting code calculation circuit according to claim 6, wherein the part of user data in the operation target sector contains user data placed after a row to which a final byte of the error detecting code in the operation target sector where the error detecting code is inserted at a middle of one code string in the block is inserted.

8. The error detecting code calculation circuit according to claim 5, wherein
the second operation section receives the data group by repeating receiving of m-byte user data in the first sequence L times in the row direction as the different sequence from the first sequence for K/m times where decimals of K/m are rounded up.

9. The error detecting code calculation circuit according to claim 8, wherein
the user data code string is burst-transferred from a data buffer,
the m byte is a burst transfer size, and
the error detecting code is the m byte or smaller.

10. The error detecting code calculation circuit according to claim 5, wherein
the error detecting code is obtained from a sector of k bytes composed of the user data code string having the first sequence and 0 data of the same byte as the error detecting code,
the first operation section calculates the error detection code intermediate value from a k-byte code string having the first sequence where a bit corresponding to the first sequence of the input user data is 1 and other bits are 0 to obtain an expected value, and sequentially calculating an exclusive-OR of the expected value when the input user data is 1, and
the second operation section calculates the error detection code by calculating the expected value of the input user data and sequentially calculating an exclusive-OR of the error detecting code intermediate value and the expected value where the input user data is 1.

11. The error detecting code calculation circuit according to claim 10, wherein
the first operation section receives the data group containing the part of user data in the operation target sector in the first sequence, and
the second operation section receives the data group in the different sequence.

12. The error detecting code calculation circuit according to claim 10, wherein
the second operation section performs operation in the different sequence from the first sequence on data where 0 data of the same byte as the error detecting code is added at an end of the user data code string in the first sequence, and calculates all the error detecting codes before operation on a final byte of the 0 data.

13. The error detecting code calculation circuit according to claim 10, wherein
the first operation section and the second operation section calculate the expected value by reference to an initial expected value that is an expected value corresponding to a specific bit in the user data code string.

14. The error detecting code calculation circuit according to claim 10, wherein
the first operation section and the second operation section calculate the expected value by reference to an initial expected value that is an expected value corresponding to one row of the block.

15. The error detecting code calculation circuit according to claim 14, wherein
the block includes a plurality of areas each having a pair of sectors, and
the initial expected value is an expected value of one row in one area.

16. The error detecting code calculation circuit according to claim 15, further comprising:
an expected value table for storing the initial expected value; and
a buffer for storing the error detecting code,
wherein the first operation section and the second operation section generate the expected value by reference to the expected value table, calculate the exclusive-OR and store the error detecting code intermediate value and the error detecting code to the buffer.

17. The error detecting code calculation circuit according to claim 16, wherein
one of the sectors included in the area is the operation target sector.

18. The error detecting code calculation circuit according to claim 10, wherein
the second operation section calculates the error detection code by calculating the expected value of the input user data on a non-operation target sector having a structure that the error detecting code is added at an end even when read in the different sequence from the first sequence and sequentially calculating an exclusive-OR of the expected value when the input user data is 1.

19. The error detecting code calculation circuit according to claim 18, wherein
the second operation section performs operation in the different sequence from the first sequence on data where 0 data of the same byte as the error detecting code is added at an end of the user data code string in the first sequence, and calculates all the error detecting codes before operation on a final byte of the 0 data.

20. The error detecting code calculation circuit according to claim 1, wherein
the different sequence from the first sequence corresponds to a row direction of the block.

21. The error detecting code calculation circuit according to claim 1, wherein
while the first operation section processes t-th data group, the second operation section processes (t-1)th data group.

22. An error detecting code calculation method that calculates an error detecting code for detecting an error in a user data code string having a first sequence, the method processing data in units of data groups including two or more sectors containing the user data code string, each data group including an operation target sector having a structure that the error detecting code is appeared in an end of the user data code string when read in the first sequence and the error detecting code is appeared in a middle of the user data code string when read in a different sequence from the first sequence, the error detecting code calculation method comprising:
calculating, by a first operation section, the error detecting code intermediate value from a part of user data in the operation target sector; and
calculating, by a second operation section, the error detecting code to be added to the user data code string contained in the operation target sector that is read in the different sequence from the first sequence from a remaining part of user data in the operation target sector and the error detecting code intermediate value.

23. A recording apparatus that records a data group containing two or more user data code strings having a first sequence onto a disc in a second sequence different from the first sequence, the apparatus processing data in units of data groups including two or more sectors containing the user data code string, each data group including an operation target sector having a structure that the error detecting code is appeared in an end of the user data code string when read in the first sequence and the error detecting code is appeared in a middle of the user data code string when read in a different sequence from the first sequence, the recording apparatus comprising:
an error detecting code calculation circuit for calculating an error detecting code for detecting an error in the user data code string having a first sequence; and
a scramble processor for scrambling the data group based on the error detecting code calculated by the error detecting code calculation circuit and the user data code string and outputting the scrambled data group as recording data,
wherein the error detecting code calculation circuit includes:
a first operation section for calculating an error detecting code intermediate value from a part of user data in the operation target sector; and
a second operation section for calculating an error detecting code from a remaining part of user data in the operation target sector and the error detecting code intermediate value,
wherein the second operation section calculates the error detecting code to be added to the user data code string contained in the operation target sector that is read in the different sequence from the first sequence.

24. The recording apparatus according to claim 23, wherein
the scramble processor comprises:
an integration section for adding the error detecting code calculated by the error detecting code calculation circuit to the user data code string; and
a scrambler for scrambling the data with the error detecting code integrated by the integration section.

25. The recording apparatus according to claim 24, wherein
each data group includes a block containing K rows by L columns (K and L are integers),
the first sequence is a user data coding sequence corresponding to a column direction of the block,
the recording data has a second sequence different from the first sequence, and
the recording apparatus further comprises a substitution buffer for outputting scrambled data scrambled by the scrambler in the second sequence.

26. The recording apparatus according to claim 23, wherein
the scramble processor comprises:
a first scrambler for scrambling the user data code string;
a second scrambler for scrambling the error detecting code; and
an integration section for adding the error detecting code scrambled by the second scrambler to the user data code string scrambled by the first scrambler.

27. The recording apparatus according to claim 26, wherein
each data group includes a block containing K rows by L columns (K and L are integers),
the first sequence is a user data coding sequence corresponding to a column direction of the block, and
the recording data has a second sequence different from the first sequence,
the recording apparatus further comprises a substitution buffer for outputting scrambled data scrambled by the scrambler in the second sequence, and
the integration section receives the scrambled data in the second sequence from the substitution buffer, adds the scrambled error detecting code to the scrambled user data code string received in the second sequence, and outputs the recording data.

* * * * *

UNITED STATES PATENT AND TRADEMARK OFFICE
CERTIFICATE OF CORRECTION

PATENT NO. : 7,640,483 B2
APPLICATION NO. : 11/495715
DATED : December 29, 2009
INVENTOR(S) : Takeo Ariyama Page 1 of 1

It is certified that error appears in the above-identified patent and that said Letters Patent is hereby corrected as shown below:

Column 13, Line 44, delete "and Row-108" and insert -- and Row=108 --.

Column 14, Line 12, delete "in the pass S" and insert -- in the pass S1 --.

Column 14, Line 15, delete " of the pass S" and insert -- of the pass S1 --.

Column 15, Line 11 delete " $d(x)_{1641 \text{ to } 0}$" and insert -- $d(x)_{16415 \text{ to } 0}$ --.

Column 15, Line 13, delete "$d(x)_{1641}=(100...0)$" and insert -- $d(x)_{16415}=(100...0)$ --.

Column 27, Line 25, delete "Them - byte data" and insert -- The m-byte data --.

Signed and Sealed this

Sixteenth Day of November, 2010

David J. Kappos
*Director of the United States Patent and Trademark Office*